(12) United States Patent
Nagasawa et al.

(10) Patent No.: US 12,398,288 B2
(45) Date of Patent: Aug. 26, 2025

(54) CONDUCTIVE POLYMER COMPOSITION, SUBSTRATE, AND METHOD FOR PRODUCING SUBSTRATE

(71) Applicant: SHIN-ETSU CHEMICAL CO., LTD., Tokyo (JP)

(72) Inventors: Takayuki Nagasawa, Joetsu (JP); Jun Hatakeyama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 1165 days.

(21) Appl. No.: 17/234,008

(22) Filed: Apr. 19, 2021

(65) Prior Publication Data

US 2021/0380738 A1 Dec. 9, 2021

(30) Foreign Application Priority Data

Jun. 3, 2020 (JP) .................................. 2020-096902
Mar. 12, 2021 (JP) .................................. 2021-040771

(51) Int. Cl.
| C09D 125/18 | (2006.01) |
| C08F 212/14 | (2006.01) |
| H10K 50/17 | (2023.01) |
| H10K 71/13 | (2023.01) |

(52) U.S. Cl.
CPC .......... *C09D 125/18* (2013.01); *C08F 212/16* (2020.02); *C08F 212/24* (2020.02); *C08F 212/26* (2020.02); *C08F 212/30* (2020.02); *H10K 50/17* (2023.02); *H10K 71/135* (2023.02)

(58) Field of Classification Search
CPC ...... H10K 50/17; C08F 220/24; C08F 212/30
See application file for complete search history.

(56) References Cited

U.S. PATENT DOCUMENTS

| 9,587,137 B2 | 3/2017 | Nagasawa et al. | |
| 10,295,906 B2 | 5/2019 | Nagasawa et al. | |
| 10,559,397 B2 | 2/2020 | Hatakeyama et al. | |
| 2002/0173579 A1 | 11/2002 | Jonas et al. | |
| 2003/0211331 A1 | 11/2003 | Louwet et al. | |
| 2007/0069185 A1 | 3/2007 | Hsu et al. | |
| 2017/0090286 A1 | 3/2017 | Nagasawa et al. | |
| 2017/0233596 A1* | 8/2017 | Hatakeyama | H10K 85/141 252/500 |

(Continued)

FOREIGN PATENT DOCUMENTS

| EP | 1373356 B1 | 5/2005 |
| JP | 2005-068166 A | 3/2005 |

(Continued)

OTHER PUBLICATIONS

Dec. 5, 2023 Office Action issued in Japanese Patent Application No. 2021-040771.

(Continued)

*Primary Examiner* — Sean M DeGuire

(74) *Attorney, Agent, or Firm* — Oliff PLC

(57) ABSTRACT

An object is to obtain a conductive polymer composition having favorable filterability and film formability, and being capable of relieving acidity, forming a conductive film with high transparency, and imparting leveling property on a substrate, the composition being applicable in droplet-coating methods, such as spray coating and inkjet printing. The conductive polymer composition contains: a composite containing a π-conjugated polymer (A) and a polymer (B) shown by the following general formula (1); $H_2O$ (D) for dispersing the composite; and a water-soluble organic solvent (C).

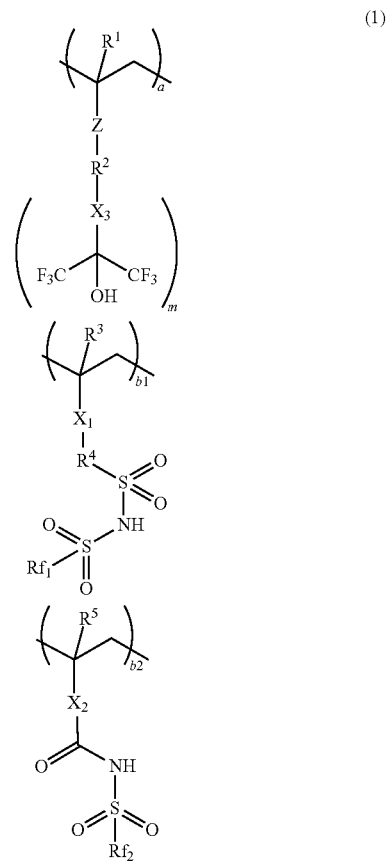

(1)

18 Claims, No Drawings

(56) References Cited

U.S. PATENT DOCUMENTS

2018/0240564 A1     8/2018    Hatakeyama et al.

FOREIGN PATENT DOCUMENTS

| | | |
|---|---|---|
| JP | 2008-146913 A | 6/2008 |
| JP | 2008-546899 A | 12/2008 |
| JP | 2017-061631 A | 3/2017 |
| JP | 2017-145323 A | 8/2017 |
| JP | 2018-135471 A | 8/2018 |
| JP | 6450666 B2 | 1/2019 |
| JP | 6483518 B2 | 3/2019 |
| JP | 6661212 B2 | 3/2020 |
| WO | 03048228 A1 | 6/2003 |

OTHER PUBLICATIONS

Jul. 29, 2024 Office Action issued in Korean Patent Application No. 10-2021-0067556.

\* cited by examiner

CONDUCTIVE POLYMER COMPOSITION, SUBSTRATE, AND METHOD FOR PRODUCING SUBSTRATE

TECHNICAL FIELD

The present invention relates to a conductive polymer composition, and a substrate having a coating-type conductive film formed from the conductive polymer composition in an organic electroluminescent device.

BACKGROUND ART

A polymer having a conjugated double bond (a π-conjugated polymer) does not show conductivity by itself, but becomes a conductive polymer material by doping with an appropriate anion molecule which causes electron or hole to move. (Hetero) aromatic polymers such as polythiophene, polyselenophene, polytellurophene, polypyrrole, polyaniline, a mixture thereof, and the like, have been used as the π-conjugated polymer. A sulfonic acid-based anion has most frequently been used as the anion molecule (dopant). This is because the sulfonic acid, which is a strong acid, interacts efficiently with the π-conjugated polymer.

As the sulfonic acid-based anion dopant, sulfonic acid polymers such as polyvinylsulfonic acid and polystyrenesulfonic acid (PSS) have widely been used (Patent Document 1). In addition, among such sulfonic acid polymers, a vinyl perfluoroalkyl ether sulfonic acid represented by Nafion® has been used for fuel cell applications.

The polystyrenesulfonic acid (PSS) which is a sulfonic acid homopolymer has high efficiency in doping to the π-conjugated polymer since sulfonic acids are continuously present as the monomer units in the polymer main chain, and it can improve dispersibility of the doped π-conjugated polymer in water. This is because hydrophilicity is retained by the presence of sulfo groups excessively present in the PSS compared with the doped portion, so that the dispersibility into water is dramatically improved.

Polythiophene using the PSS as a dopant can be handled as a highly conductive liquid material, and is thus expected as a coating-type transparent electrode film material in place of ITO (indium tin oxide) used as a transparent electrode in organic EL, solar cell, etc. While thin-film devices including organic EL, solar cell, and so forth are in such a trend that all the layers are made from coating-type material, high conductivity is not required, but it is desirable to apply polythiophene as a coating material which functions as an injection layer to reduce the carrier transfer load from an electrode to a carrier transfer layer.

When PSS having quite high hydrophilicity is added as a dopant to a π-conjugated polymer having low hydrophilicity, the composite of the π-conjugated polymer with the dopant is dispersed as particles in $H_2O$. This dispersion is applicable as a liquid material onto a substrate. After a substrate is coated with the composite, a film can be formed by heating with a hot air circulation furnace, hot plate, or the like, by IR or UV irradiation, etc. Nevertheless, since the PSS having quite high hydrophilicity retains the moisture, a large amount of moisture remains in the film after the treatment for the film formation. After device preparation and sealing, the moisture volatizes and fills the device, for example, and consequently significantly lowers the device performance in some cases. When the composite material is used for a film (thin film) constituting, for example, an organic EL, the moisture remaining in the film and moisture absorbed from the external atmosphere in the manufacturing process till sealing volatize or permeate an adjacent layer after constituent layers are laminated and sealed. When the moisture condenses in the sealed device or in the film, this causes defects and lowers the device functions such as decreased the function of the light emitting layer and increased voltage for driving the device due to the moisture in the film. Consequently, there are problems such as shortened device lifetime.

Hence, when a composite of a π-conjugated polymer with PSS as a dopant is used in the form of a $H_2O$ dispersion as a transparent electrode material or hole injection layer material in an organic thin-film device such as organic EL or solar cell, the remaining moisture degrades the device performance. Efforts have been made to disperse the composite in an organic solvent as an alternative solvent to $H_2O$; however, the affinity to organic solvent is so low that it is difficult to obtain a uniform dispersion.

Meanwhile, PEDOT-PSS, which has been studied for wide applications, absorbs light in the visible light range and the transmittance is low. Hence, this material has a difficulty in application to light-permeable, light emitting devices, and has natures such that dispersed particles of the composite in a liquid state are likely to aggregate. The filtration purification is difficult.

When a composite of a π-conjugated polymer with PSS as a dopant is used for a transparent electrode material or hole injection layer material in an organic thin-film device such as organic EL or solar cell, the thin film can be formed in a variety of ways. Examples of the method for forming the film include: coating with a spin coater, etc.; bar coating, dipping, comma coating, spray coating, roll coating, screen printing, flexographic printing, gravure printing, ink-jet printing, etc. After a substrate is coated, a conductive film can be formed by a heat treatment with a hot air circulation furnace, hot plate, or the like, by IR or UV irradiation, etc. However, the filtration for removing the component aggregates in the composition is problematic as described above. Coating without filtration brings about problems: the coating is improperly carried out due to the influence of these aggregates; even if a uniform film is obtained, the surface roughness is poor; and when the uniform film is employed for organic EL, solar cell, or the like having a laminate structure, problems such as impaired carrier transfer and short circuit are likely to occur due to such large surface unevenness or pinhole.

Moreover, when $H_2O$ is used as the solvent for a composite of a π-conjugated polymer with PSS as a dopant, since the surface tension is high, the contact angle is large regardless of whether a glass substrate or plastic substrate is coated. The aggregation occurs in the solution after the coating, or the solution is left adhering on the substrate as droplets by the repelling on the substrate. Hence, it is necessary to lower the contact angle with respect to a substrate by lowering the surface tension of the material, and to impart leveling property so that a uniform film can be formed. Particularly, in spray coating and inkjet printing by spraying or blowing a liquid material, lowering the surface tension and imparting leveling property are essential. Moreover, a solid content may be firmly attached around a nozzle, or the solid content may precipitate due to drying after the liquid material is ejected from the nozzle tip and before landing on the substrate. Hence, it is necessary to use a less volatile solvent as a main solvent instead of $H_2O$, or to further add an agent for slowing the drying if the main solvent is $H_2O$.

When a glass substrate or plastic substrate is coated with a composite of a π-conjugated polymer with PSS as a dopant, the main solvent is most desirably an organic solvent from the viewpoints of coatability and film quality. Patent Documents 2 and 3 describe production of a polythiophene-polyanion complex in a water-free solvent or low-water-content solvent. In these systems, $H_2O$ as an initial solvent is exchanged with another water-miscible organic solvent. For this purpose, after an organic solvent is added, $H_2O$ is removed by distillation, for example. However, this procedure has the following shortcomings: the distillation requires a two-stage process; the organic solvent to be added has to be miscible with water; if the organic solvent has a boiling point of roughly 150° C. or more, or if the polythiophene-polyanion particle dispersion has high versatility, polymer modification occurs such that the conductivity is increased; and in the application as hole injection layer, there are such problems that the conductivity departs from the appropriate range.

Meanwhile, in Patent Document 4, Otani et al. describe a method in which a conductive polymer such as PEDOT is first dried and then re-dispersed in an organic solvent. Although isopropyl alcohol and γ-butyrolactone are disclosed in Examples, this method requires a polar solvent for re-dissolution. This document does not disclose a polythiophene-polyanion composite. Concerning a polythiophene-polyanion composite, particularly PEDOT-PSS with PSS as a dopant, after removal of $H_2O$, which is a solvent for chemical polymerization, a mechanical treatment, such as high-pressure dispersing, is required for the re-dispersing into an organic solvent. Even after such treatment is performed, when the composite is used for a transparent electrode material or hole injection layer material in an organic thin-film device such as organic EL or solar cell, there is such a disadvantage that defects such as dark spots derived from the polymer aggregates are likely to occur on the resulting film that transmits light. The viscosity also tends to be high in comparison with the system with $H_2O$ main solvent. These disadvantages are considerably related to the film formability as well as the luminance lifetime, durability, and yield in production of the organic thin-film device. This re-dispersion scheme is not desirable because an appropriate dispersion in the PEDOT-PSS usage does not cause film thickness reduction due to the solid content reduction by passing the dispersion through a filtration membrane of at least 0.45 μm or less when the PEDOT-PSS is used.

Meanwhile, the synthesis method of a polythiophene-based conductive polymer with PSS as a dopant, such as widely-applicable PEDOT-PSS, is known, and numerous commercial products of the raw materials and manufactured articles are available in the market. Accordingly, the polythiophene-based conductive polymer is a suitable material applied to organic thin-film devices such as organic EL and solar cell. Nevertheless, there are problems that: the transparency is poor due to visible light absorption; the aggregation is highly likely in the $H_2O$ dispersion state; the aggregation is further accelerated by mixing an organic solvent, so that the viscosity is high and the filtration purification is difficult; after the film formation, plenty of moisture remains in the film; the film itself has poor surface roughness; and defects are likely to occur by particles derived from the aggregates. Furthermore, in a state where no organic solvent is added to avoid the aggregation, the surface tension is so high that after the composition is blown onto a substrate by employing a spray-type printer, the contact angle of landed droplets is high, and the leveling property is low. Consequently, a flat continuous film cannot be obtained, and a partial film or a sea-island structure is formed from the composition droplets on the substrate.

Patent Documents 5, 6, and 7 propose conductive polymer compositions formed by using: a π-conjugated polymer formed of a repeating unit selected from thiophene, pyrrole, aniline, and polycyclic aromatic compounds; and a dopant polymer incorporating a fluorinated acid unit. It is disclosed that a $H_2O$ dispersion of the conductive polymer is obtained by combining $H_2O$, a precursor monomer of the π-conjugated polymer, a fluorinated acid polymer, and an oxidizing agent in any order. By introducing a fluorinated acid unit, the affinity of the fluorine atoms to organic solvents is imparted to the dopant polymer. As a result, the composite including the π-conjugated polymer as a whole has higher affinity to organic solvents and hydrophobic substrate surface, improving the dispersibility of the composite in organic solvents and coatability on hydrophobic substrates. Moreover, introducing a fluorinated acid unit into the dopant relieves the strong hydrophilicity observed from PSS, and thus the moisture remaining in the film is reduced after the film formation.

In Patent Document 6, the dopant polymer is constituted of a fluorinated acid unit and such an acid unit as styrenesulfonic acid, which is a constituent monomer of PSS. Nevertheless, the amount of $H^+$ generated from extra sulfonated terminals other than the sulfonated terminal for doping the π-conjugated polymer is not controlled. In other words, in a case where every repeating unit of a dopant polymer (B) is a unit having a sulfonated terminal, the repeating units constituting a π-conjugated polymer (A) are not doped therewith at a ratio of 1:1. Hence, the sulfonated terminals of the repeating units of the dopant polymer (B) in a non-doping state are present as free acids, so that the acidity of the material in a liquid state before film formation is very high. Due to the influence of such high acidity, a problem occurs that surrounding members corrode progressively in the coating step. Furthermore, even after a film formed as a constituent of a thin-film device is dried, $H^+$ diffuses into the device structure through the adjacent layer or from a side surface of the laminate structure, bringing about problems such as chemical changes in constituent layers, and decreases in function, device performance as a whole, and durability. Against these problems, in Patent Document 7, an amphoteric ion compound is added to control the diffusion of into such adjacent layer. Thereby, the composite containing a π-conjugated polymer formed of a repeating unit selected from thiophene, pyrrole, aniline, and polycyclic aromatic compounds, and a dopant polymer incorporating a fluorinated acid unit is improved in terms of dispersibility into an organic solvent and coatability onto a substrate.

The compositions described in Patent Documents 7, 8 have improved dispersibility into an organic solvent and improved coatability onto a substrate as described above. In addition, spin coating method enables formation of a flatter continuous film. Thus, the films formed by this method are applicable as, for example, an antistatic film for electron beam resist, a transparent electrode layer and a hole injection layer in an organic EL device. Meanwhile, when a printing method with a spray coater or a printing method to blow droplets onto a substrate like inkjet printing is employed for an organic EL, solar cell, or the like having a laminate structure, the film formability is improved in comparison with a composite of a π-conjugated polymer with PSS as a dopant, but problems such as coating spots, pinhole generation, and insufficient film flatness are not completely solved. The resulting device has problems such as increased voltage, uneven light emission, and lowered durability. Moreover, when a solvent of these compositions is 100% $H_2O$, this $H_2O$ volatizes in a spray coater and inkjet printing, the solid content is firmly attached around the nozzle, or the solid content precipitates by drying after the liquid material is ejected from the nozzle tip and before landed on a substrate. Consequently, the precipitate adheres to the film, causing defect problem in the organic EL device.

CITATION LIST

Patent Literature

Patent Document 1: JP 2008-146913 A
Patent Document 2: EP 1,373,356 A
Patent Document 3: WO 2003/048228 A1
Patent Document 4: JP 2005-068166 A
Patent Document 5: JP 2008-546899 A
Patent Document 6: JP 6483518 B
Patent Document 7: JP 6450666 B
Patent Document 8: JP 6661212 B

SUMMARY OF INVENTION

Technical Problem

The present invention has been made in view of the above circumstances. An object of the present invention is to obtain a conductive polymer composition having favorable filterability and film formability, and being capable of relieving acidity, forming a conductive film with high transparency, and imparting leveling property on a substrate, the composition being applicable in droplet-coating methods, such as spray coating and inkjet printing.

Solution to Problem

To achieve the object, the present invention provides a conductive polymer composition which comprises:

- a composite comprising
- a π-conjugated polymer (A), and
- a polymer (B) shown by the following general formula (1);
- $H_2O$ (D) for dispersing the composite; and
- a water-soluble organic solvent (C), (1)

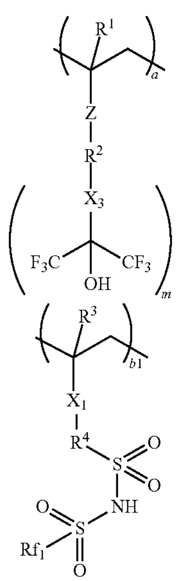

-continued 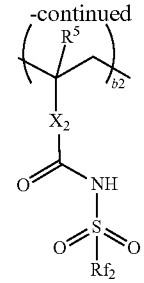 wherein $R^1$ represents a hydrogen atom or a methyl group; Z represents any of a phenylene group, a naphthylene group, an ester group, an ether group, an amino group, and an amide group; when Z is a phenylene group or a naphthylene group, $R^2$ represents any of a single bond and a linear, branched, or cyclic hydrocarbon group having 1 to 12 carbon atoms optionally having one or both of an ester group and an ether group; when Z is an ester group, an ether group, an amino group, or an amide group, $R^2$ represents any of a single bond and a linear, branched, or cyclic hydrocarbon group having 1 to 14 carbon atoms optionally having an ether group; "m" represents any one of 1 to 3; $R^3$ and $R^5$ each independently represent a hydrogen atom or a methyl group; $R^4$ independently represents any of a single bond and a linear, branched, or cyclic hydrocarbon group having 1 to 12 carbon atoms optionally having one or both of an ether group and an ester group; $X_3$ represents any of a single bond, a methylene group, an ethylidene group, an isopropylidene group, an ether group, an ester group, an amino group, an amide group, and a linear, branched, or cyclic hydrocarbon group having 1 to 12 carbon atoms optionally containing an ether group, an ester group, an amino group, an amide group, or a heteroatom, and the amino groups and the amide groups optionally contain any of a hydrogen atom and a linear, branched, or cyclic hydrocarbon group having 1 to 12 carbon atoms optionally containing a heteroatom; $X_1$ and $X_2$ each independently represent any of a single bond, a phenylene group, a naphthylene group, an ether group, an ester group, an amide group, and a linear, branched, or cyclic hydrocarbon group having 1 to 13 carbon atoms optionally having one or both of an ether group and an ester group; $Rf_1$ and $Rf_2$ each represent a linear or branched alkyl group having 1 to 4 carbon atoms with at least one or more fluorine atoms, or a phenyl group substituted with a fluorine atom and/or a trifluoromethyl group; and "a", b1, and b2 satisfy $0<a<1.0$, $0\leq b1<1.0$, $0\leq b2<1.0$, and $0<b1+b2<1.0$.

Incorporating (A), (B), (C), and (D) as described above enables the conductive polymer composition to have favorable filterability and film formability, and to relieve acidity and form a conductive film with high transparency. Moreover, as the $H_2O$ dispersion of the conductive polymer composition is mixed with a water-soluble organic solvent, the surface tension and the contact angle are so low that leveling property on a substrate is imparted. Further, the composition is applicable in droplet-coating methods, such as spray coating and inkjet printing.

Moreover, the conductive polymer composition preferably has a surface tension in a range of 20 to 50 mN/m.

With such a low surface tension, when the composition is blown onto a substrate by employing a spray-type printer, the landed droplets will not have high contact angle, preventing the composition droplets from forming a sea-island structure or a partial (incomplete) film on the substrate.

Further, the component (C) Preferably comprises an organic solvent (C1) having a boiling point of 120° C. or more and/or an organic solvent (C2) having a boiling point of less than 120° C. such that 1.0 wt %≤(C1)+(C2)≤50.0 wt % is satisfied relative to a total of the components (A), (B), and (D).

In this case, the components (C1) and (C2) are preferably selected from alcohols, ethers, esters, ketones, and nitriles each of which has 1 to 7 carbon atoms.

In the present invention, such organic solvents are utilizable.

Further, the repeating unit "a" in the component (B) preferably comprises one or more selected from repeating units a1 to a4 shown by the following general formulae (2-1) to (2-4),

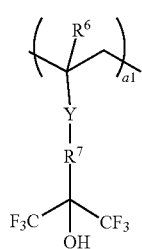

(2-1)

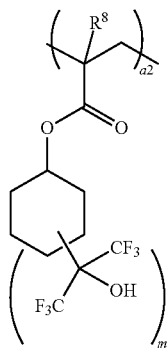

(2-2)

(2-3)

(2-4)

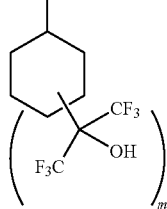

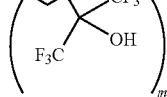

wherein $R^6$, $R^8$, $R^9$, and $R^{10}$ each independently represent a hydrogen atom or a methyl group; $R^7$ represents any of a single bond and a linear, branched, or cyclic hydrocarbon group having 1 to 14 carbon atoms optionally having an ether group; $R^{11}$ represents any of a single bond, a methylene group, an ethylidene group, an isopropylidene group, an ether group, an ester group, an amino group, an amide group, and a linear, branched, or cyclic hydrocarbon group having 1 to 12 carbon atoms optionally containing an ether group, an ester group, an amino group, an amide group, or a heteroatom, and the amino groups and the amide groups optionally contain any of a hydrogen atom and a linear, branched, or cyclic hydrocarbon group having 1 to 12 carbon atoms optionally containing a heteroatom; Y represents any of an ether group, an ester group, an amino group, and an amide group, and the amino group and the amide group optionally contain any of a hydrogen atom and a linear, branched, or cyclic hydrocarbon group having 1 to 12 carbon atoms optionally containing a heteroatom; "m" represents any one of 1 to 3; and a1, a2, a3, and a4 satisfy 0≤a1<1.0, 0≤a2<1.0, 0≤a3<1.0, 0≤a4<1.0, and 0<a1+a2+a3+a4<1.0.

Furthermore, the component (B) preferably comprises one or more selected from repeating units b'1 to b'4 shown by the following general formulae (3-1) to (3-4),

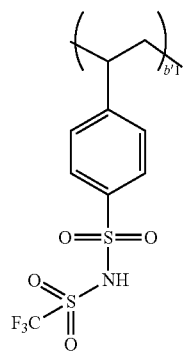

(3-1)

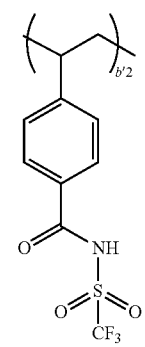

(3-2)

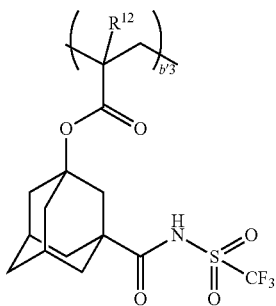

(3-3)

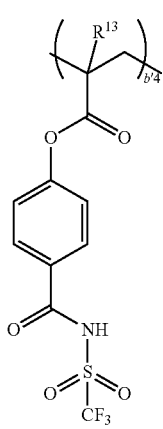

(3-4)

wherein $R^{12}$ and $R^{13}$ each independently represent a hydrogen atom or a methyl group; and b'1, b'2, b'3, and b'4 satisfy $0 \leq b'1 < 1.0$, $0 \leq b'2 < 1.0$, $0 \leq b'3 < 1.0$, $0 \leq b'4 < 1.0$, and $0 < b'1+b'2+b'3+b'4 < 1.0$.

The repeating units in the component (B) are preferably ones as described above. Thereby, the conductive polymer composition is improved in terms of filterability, film formability, coatability on organic and inorganic substrates, and transmittance after film formation. Additionally, the effect of reducing residual moisture in the film will be exhibited.

Moreover, the component (B) may further comprise a repeating unit "c" shown by the following general formula (4),

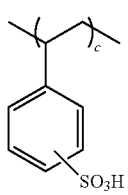

(4)

wherein "c" satisfies $0 < c < 1.0$.

By incorporating such repeating unit "c", it is possible to adjust the conductivity of the film appropriately for intended applications and for efficient function demonstration when a device constituent layer is formed.

Further, the component (B) preferably has a weight-average molecular weight in a range of 1,000 to 500,000.

When the weight-average molecular weight is 1,000 or more, the heat resistance is excellent, and the uniformity of the solution containing the composite with the component (A) is favorable. Meanwhile, when the weight-average molecular weight is 500,000 or less, the viscosity is not increased too much, the workability is favorable, and the dispersibility into water and an organic solvent is not lowered.

Further, the component (A) is preferably a material in which at least one precursor monomer selected from the group consisting of pyrrole, thiophene, selenophene, tellurophene, aniline, polycyclic aromatic compounds, and derivatives thereof is polymerized.

Such monomers are easily polymerized, and the stability in air is favorable. Hence, the component (A) can be easily synthesized.

Furthermore, the inventive conductive polymer composition preferably comprises a compound (E) shown by the following general formula (5),

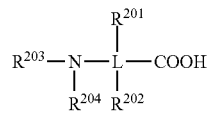

(5)

wherein $R^{201}$ and $R^{202}$ each independently represent any of a hydrogen atom, a heteroatom, and a linear, branched, or cyclic monovalent hydrocarbon group having 1 to 20 carbon atoms optionally having a heteroatom; $R^{203}$ and $R^{204}$ each independently represent any of a hydrogen atom and a linear, branched, or cyclic monovalent hydrocarbon group having 1 to 20 carbon atoms optionally having a heteroatom; $R^{201}$ and $R^{203}$, or $R^{201}$ and $R^{204}$, are optionally bonded to each other to form a ring; L represents a linear, branched, or cyclic tetravalent organic group having 1 to 20 carbon atoms optionally having a heteroatom; and when L has a heteroatom, the heteroatom is optionally an ion.

When the conductive polymer composition containing the component (E) is used to form a film as an electrode or hole injection layer of a thin film-stacked device such as organic EL and solar cell, the acid diffusion to an adjacent layer and another constituent layer of the laminate structure is suppressed. This makes it possible to relieve the influence of the acid. Moreover, when the inventive conductive polymer composition contains the component (E) and this conductive polymer composition is used to form a film as a constituent of a thin-film device having a laminate structure on a material to be processed, the acid diffusion to an adjacent layer and another constituent layer of the laminate structure device is further suppressed. Thus, the acid influence can be further relieved.

In this case, the component (E) is preferably contained in an amount of 1 part by mass to 50 parts by mass based on 100 parts by mass of the composite of the component (A) with the component (B).

Such a composition can more efficiently control the H+ diffusion into an adjacent layer from the film formed of the inventive conductive polymer composition.

Further, the inventive conductive polymer composition preferably comprises a nonionic surfactant.

Such a composition can further enhance the coatability onto a material to be processed, such as a substrate.

In this case, the nonionic surfactant is preferably contained in an amount of 1 part by mass to 15 parts by mass based on 100 parts by mass of the composite of the component (A) with the component (B).

Such a composition has more favorable coatability onto a material to be processed, such as a substrate.

The film to be formed also has more favorable surface flatness.

Furthermore, the inventive conductive polymer composition is preferably used to form a hole injection layer of an organic EL device.

The conductive film formed from the inventive conductive polymer composition is excellent in conductivity, hole injectability, and transparency, and thus can function as a transparent electrode layer or hole injection layer of a thin film-stacked device, such as organic EL and solar cell.

Further, the present invention provides a substrate comprising an organic EL device, wherein the organic EL device comprises a hole injection layer formed from the above-described conductive polymer composition.

In this manner, a conductive film can be formed by coating a substrate or the like with the inventive conductive polymer composition. This makes it possible to provide a substrate on which a hole injection layer is formed as the conductive film in an organic EL device.

Furthermore, the present invention provides a method for producing the substrate, comprising applying the above-described conductive polymer composition by using a spray coater or inkjet printing.

The substrate of the present invention can be produced by such a method.

Advantageous Effects of Invention

As described above, the inventive conductive polymer composition has low viscosity, favorable filterability, and good coating-film formability on inorganic and organic substrates, and is also capable of providing a continuous film with few defects even when a spray coater or an inkjet printer is used. Moreover, residual moisture in the film is efficiently removed during the film formation by the influence of fluorine atoms present in the repeating units "a" and b1 and/or b2 in the dopant polymer as the component (B). The film to be formed can be a conductive film having favorable transparency, flatness, and conductivity or hole injection efficiency. Further, in the component (B), the repeating unit b1 or b2 containing a fluorosulfonimide group or a n-carbonyl-fluoro-sulfonamide group is copolymerized with the fluoroalcohol unit "a" having no acid terminal. The use of this polymer as a dopant to form a composite with (A) decreases extra non-doping sulfonated terminals, consequently generating fewer $H^+$. When the inventive conductive polymer composition is employed as a constituent film of a thin film-stacked device, it is possible to suppress the influence of $H^+$ on other constituent layers. Furthermore, the conductive film formed from the inventive conductive polymer composition is excellent in conductivity, hole injection efficiency, transparency, etc., and can reduce moisture volatilization from the film, aggregation, and so forth when employed as a constituent film of a thin film-stacked device. Accordingly, such a conductive film can effectively function as a transparent electrode layer or a hole injection layer of such a thin film-stacked device.

DESCRIPTION OF EMBODIMENTS

As noted above, it has been desired to develop a material for forming a conductive film, the material having: low viscosity, favorable filterability, and good coating-film formability on inorganic and organic substrates; ability to form a continuous film with few defects even when a spray coater or an inkjet printer is used; ability to form a conductive film with high transparency and favorable flatness; and ability to efficiently remove residual moisture in such films.

The present inventors have intensively studied the problems, and consequently found the following facts. Specifically, in place of polystyrenesulfonic acid homopolymer (PSS) widely used as a dopant for a conductive polymer material, a dopant polymer is prepared by copolymerizing a fluoroalcohol unit "a" with a repeating unit(s) b1, b2 having a fluorosulfonimide group and/or a n-carbonyl-fluoro-sulfonamide group. Further, a $H_2O$ dispersion of a conductive polymer material using this dopant polymer is mixed with a water-soluble organic solvent. A conductive polymer composition thus obtained has favorable filterability and favorable ability to form a continuous film with few defects on an inorganic substrate even when a spray coater or an inkjet printer is used. Moreover, the conductive polymer composition can form a conductive film having high transparency, high flatness, and little residual moisture in the formed film. Further, favorable results have been obtained in the performance evaluations of the conductive polymer composition mounted as a constituent layer of an organic EL device.

Thereby, the present invention has been completed.

Specifically, the present invention is a conductive polymer composition which comprises:
a composite comprising
a π-conjugated polymer (A), and
a polymer (B) shown by the following general formula (1);
$H_2O$ (D) for dispersing the composite; and
a water-soluble organic solvent (C),

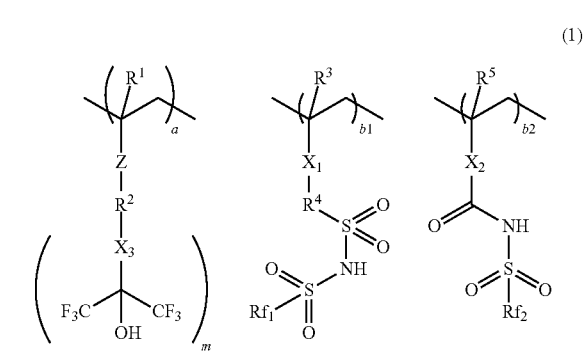

(1)

wherein $R^1$ represents a hydrogen atom or a methyl group; Z represents any of a phenylene group, a naphthylene group, an ester group, an ether group, an amino group, and an amide group; when Z is a phenylene group or a naphthylene group, $R^2$ represents any of a single bond and a linear, branched, or cyclic hydrocarbon group having 1 to 12 carbon atoms optionally having one or both of an ester group and an ether group; when Z is an ester group, an ether group, an amino group, or an amide group, $R^2$ represents any of a single bond and a linear, branched, or cyclic hydrocarbon group having 1 to 14 carbon atoms optionally having an ether group; "m" represents any one of 1 to 3; $R^3$ and $R^5$ each independently represent a hydrogen atom or a methyl group; $R^4$ independently represents any of a single bond and a linear, branched, or cyclic hydrocarbon group having 1 to 12 carbon atoms optionally having one or both of an ether group and an ester group; $X_3$ represents any of a single bond, a methylene group, an ethylidene group, an isopropylidene group, an ether group, an ester group, an amino group, an amide group, and a linear, branched, or cyclic hydrocarbon group having 1 to 12 carbon atoms optionally containing an ether group, an ester group, an amino group, an amide group, or a heteroatom, and the amino groups and the amide groups optionally contain any of a hydrogen atom and a linear, branched, or cyclic hydrocarbon group having 1 to 12 carbon atoms optionally containing a heteroatom; $X_1$ and $X_2$ each independently represent any of a single bond, a phenylene group, a naphthylene group, an ether group, an ester group, an amide group, and a linear, branched, or cyclic hydrocarbon group having 1 to 13 carbon atoms optionally having one or both of an ether group and an ester group; $Rf_1$ and $Rf_2$ each represent a linear or branched alkyl group having 1 to 4 carbon atoms with at least one or more fluorine atoms, or a phenyl group substituted with a fluorine atom and/or a trifluoromethyl group; and "a", b1, and b2 satisfy 0<a<1.0, 0≤b1<1.0, 0<b2<1.0, and 0<b1+b2<1.0.

Hereinafter, the present invention will be described in detail, but the present invention is not limited thereto.

[(A) π-Conjugated Polymer]

The inventive conductive polymer composition contains a π-conjugated polymer as a component (A).

This component (A) may be a material in which a precursor monomer (organic monomer molecule) forming a π-conjugated chain (a structure in which a single bond and a double bond are alternately continued) is polymerized.

Examples of such a precursor monomer include monocyclic aromatics, such as pyrroles, thiophenes, thiophene vinylenes, selenophenes, tellurophenes, phenylenes, phenylene vinylenes, and anilines; polycyclic aromatics, such as acenes; acetylenes; etc. A homopolymer or a copolymer of these monomers can be used as the component (A).

Among the monomers, from the viewpoints of easiness in polymerization and stability in air, pyrrole, thiophene, selenophene, tellurophene, aniline, polycyclic aromatic compounds, and derivatives thereof are preferable, and pyrrole, thiophene, aniline, and derivatives thereof are particularly preferable.

In addition, the component (A) can give sufficient conductivity even when the monomer constituting the π-conjugated polymer is not substituted. Nevertheless, for higher conductivity, a monomer substituted by an alkyl group, a carboxyl group, a sulfo group, an alkoxy group, a hydroxyl group, a cyano group, a halogen atom, or the like may be used.

Specific examples of the monomers of pyrroles, thiophenes, and anilines include pyrrole, N-methylpyrrole, 3-methylpyrrole, 3-ethylpyrrole, 3-n-propylpyrrole, 3-butylpyrrole, 3-octylpyrrole, 3-decylpyrrole, 3-dodecylpyrrole, 3,4-dimethylpyrrole, 3,4-dibutylpyrrole, 3-carboxypyrrole, 3-methyl-4-carboxypyrrole, 3-methyl-4-carboxyethylpyrrole, 3-methyl-4-carboxybutylpyrrole, 3-hydroxypyrrole, 3-methoxypyrrole, 3-ethoxypyrrole, 3-butoxypyrrole, 3-hexyloxypyrrole, 3-methyl-4-hexyloxypyrrole; thiophene, 3-methylthiophene, 3-ethylthiophene, 3-propylthiophene, 3-butylthiophene, 3-hexylthiophene, 3-heptylthiophene, 3-octylthiophene, 3-decylthiophene, 3-dodecylthiophene, 3-octadecylthiophene, 3-bromothiophene, 3-chlorothiophene, 3-iodothiophene, 3-cyanothiophene, 3-phenylthiophene, 3,4-dimethylthiophene, 3,4-dibutylthiophene, 3-hydroxythiophene, 3-methoxythiophene, 3-ethoxythiophene, 3-butoxythiophene, 3-hexyloxythiophene, 3-heptyloxythiophene, 3-octyloxythiophene, 3-decyloxythiophene, 3-dodecyloxythiophene, 3-octadecyloxythiophene, 3,4-dihydroxythiophene, 3,4-dimethoxythiophene, 3,4-diethoxythiophene, 3,4-dipropoxythiophene, 3,4-dibutoxythiophene, 3,4-dihexyloxythiophene, 3,4-diheptyloxythiophene, 3,4-dioctyloxythiophene, 3,4-didecyloxythiophene, 3,4-didodecyloxythiophene, 3,4-ethylenedioxythiophene, 3,4-propylenedioxythiophene, 3,4-butenedioxythiophene, 3-methyl-4-methoxythiophene, 3-methyl-4-ethoxythiophene, 3-carboxythiophene, 3-methyl-4-carboxythiophene, 3-methyl-4-carboxyethylthiophene, 3-methyl-4-carboxybutylthiophene; aniline, 2-methylaniline, 3-isobutylaniline, 2-methoxyaniline, 2-ethoxyaniline, 2-anilinesulfonic acid, 3-anilinesulfonic acid; etc.

Particularly, a (co)polymer containing one or more selected from pyrrole, thiophene, N-methylpyrrole, 3-methylthiophene, 3-methoxythiophene, and 3,4-ethylenedioxythiophene is suitably used from the viewpoints of a resistance value and reactivity.

Moreover, a homopolymer of pyrrole or 3,4-ethylenedioxythiophene is more preferable because the conductivity is high.

For a practical reason, the number of these units repeated is preferably in a range of 2 to 20, more preferably in a range of 6 to 15. The molecular weight is preferably about 130 to 5000.

[(B) Dopant Polymer]

The inventive conductive polymer composition contains a dopant polymer as a component (B). This dopant polymer as the component (B) is a strongly acidic polymer containing repeating units "a" and "b" (b1 and/or b2) shown by the following general formula (1).

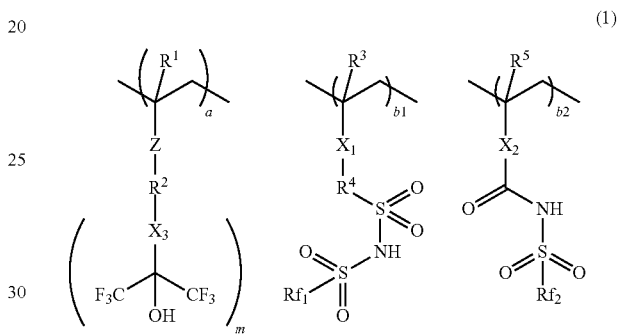

(1)

In the formula, $R^1$ represents a hydrogen atom or a methyl group. Z represents any of a phenylene group, a naphthylene group, an ester group, an ether group, an amino group, and an amide group. When Z is a phenylene group or a naphthylene group, $R^2$ represents any of a single bond and a linear, branched, or cyclic hydrocarbon group having 1 to 12 carbon atoms optionally having one or both of an ester group and an ether group. When Z is an ester group, an ether group, an amino group, or an amide group, $R^2$ represents any of a single bond and a linear, branched, or cyclic hydrocarbon group having 1 to 14 carbon atoms optionally having an ether group. "m" represents any one of 1 to 3. $R^3$ and $R^5$ each independently represent a hydrogen atom or a methyl group. Each $R^4$ independently represents any of a single bond and a linear, branched, or cyclic hydrocarbon group having 1 to 12 carbon atoms optionally having one or both of an ether group and an ester group. $X_3$ represents any of a single bond, a methylene group, an ethylidene group, an isopropylidene group, an ether group, an ester group, an amino group, an amide group, and a linear, branched, or cyclic hydrocarbon group having 1 to 12 carbon atoms optionally containing an ether group, an ester group, an amino group, an amide group, or a heteroatom; the amino groups and the amide groups optionally contain any of a hydrogen atom and a linear, branched, or cyclic hydrocarbon group having 1 to 12 carbon atoms optionally containing a heteroatom. $X_1$ and $X_2$ each independently represent any of a single bond, a phenylene group, a naphthylene group, an ether group, an ester group, an amide group, and a linear, branched, or cyclic hydrocarbon group having 1 to 13 carbon atoms optionally having one or both of an ether group and an ester group. $Rf_1$ and $Rf_2$ each represent a linear or branched alkyl group having 1 to 4 carbon atoms with at least one or more fluorine atoms, or a phenyl group substituted with a fluorine atom and/or a trifluoromethyl group. "a", b1, and b2 satisfy $0<a<1.0$, $0<b1<1.0$, $0<b2<1.0$, and $0<b1+b2<1.0$.

In the component (B), the repeating unit "a" preferably includes one or more selected from repeating units a1 to a4 shown by the following general formulae (2-1) to (2-4).

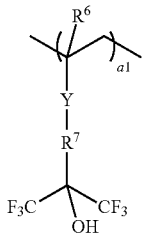

(2-1)

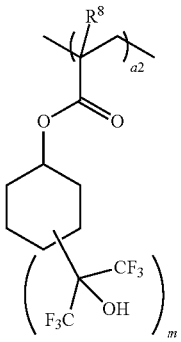

(2-2)

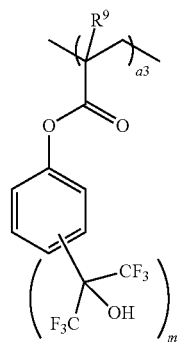

(2-3)

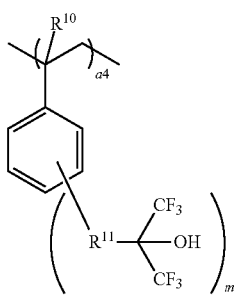

(2-4)

In the formulae, $R^6$, $R^8$, $R^9$, and $R^{10}$ each independently represent a hydrogen atom or a methyl group. $R^7$ represents any of a single bond and a linear, branched, or cyclic hydrocarbon group having 1 to 14 carbon atoms optionally having an ether group. $R^{11}$ represents any of a single bond, a methylene group, an ethylidene group, an isopropylidene group, an ether group, an ester group, an amino group, an amide group, and a linear, branched, or cyclic hydrocarbon group having 1 to 12 carbon atoms optionally containing an ether group, an ester group, an amino group, an amide group, or a heteroatom; the amino groups and the amide groups optionally contain any of a hydrogen atom, and a linear, branched, or cyclic hydrocarbon group having 1 to 12 carbon atoms optionally containing a heteroatom. Y represents any of an ether group, an ester group, an amino group, and an amide group, and the amino group and the amide group optionally contain any of a hydrogen atom and a linear, branched, or cyclic hydrocarbon group having 1 to 12 carbon atoms optionally containing a heteroatom. "m" represents any one of 1 to 3. a1, a2, a3, and a4 satisfy $0\ a1<1.0$, $0\ a2<1.0$, $0<a3<1.0$, $0<a4<1.0$, and $0<a1+a2+a3+a4<1.0$.

In the component (B), the higher the content of the repeating unit "a" relative to the repeating units b1 and b2, the more clearly the effects of the present invention are exhibited. The content percentage is preferably $20<a<60$, so that the effects of the present invention are sufficiently obtained. From the viewpoints of the conductivity and the stability of the composite of (A) and (B), the content percentage of the repeating unit "a" is further preferably $20<a<40$.

Specifically, in order to achieve conductivity for exhibiting sufficient functions as an electrode, or achieve hole injection efficiency for exhibiting sufficient functions as a hole injection layer, reasonable ranges are $20\le a\le 40$ and $60\le b1+b2\le 80$, preferably $20\le a\le 40$ and $60\le b1+b2+c\le 80$; in this case, $c\le 40$ is preferable. "c" will be described later.

A monomer for providing the repeating unit "a" can be specifically exemplified by the following.

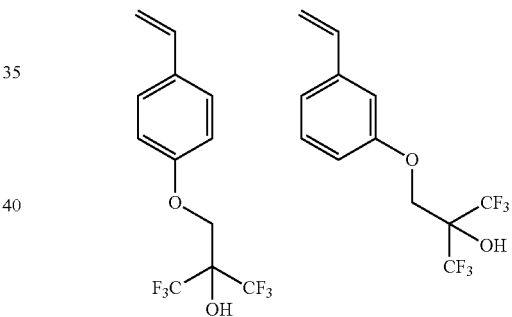

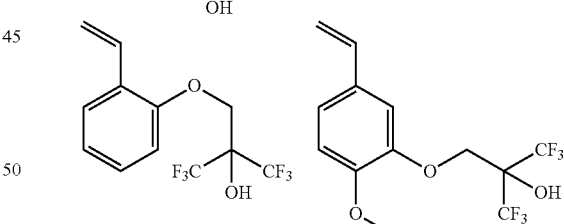

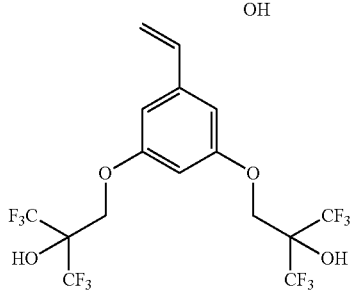

-continued
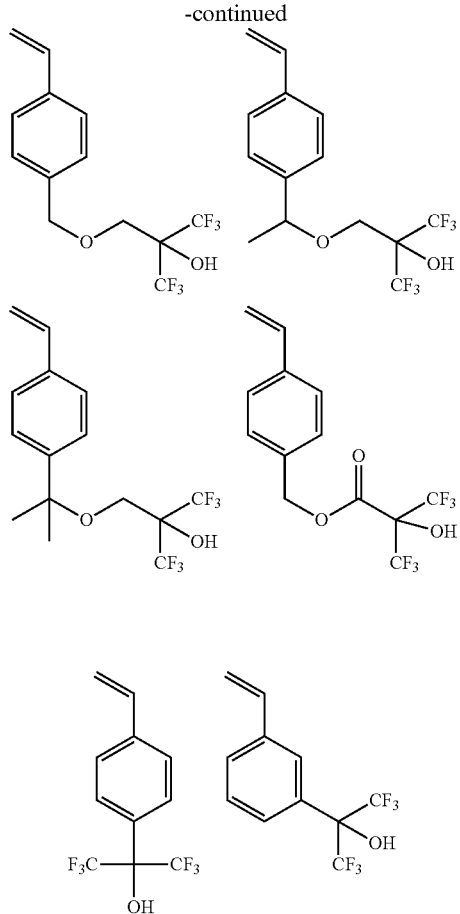
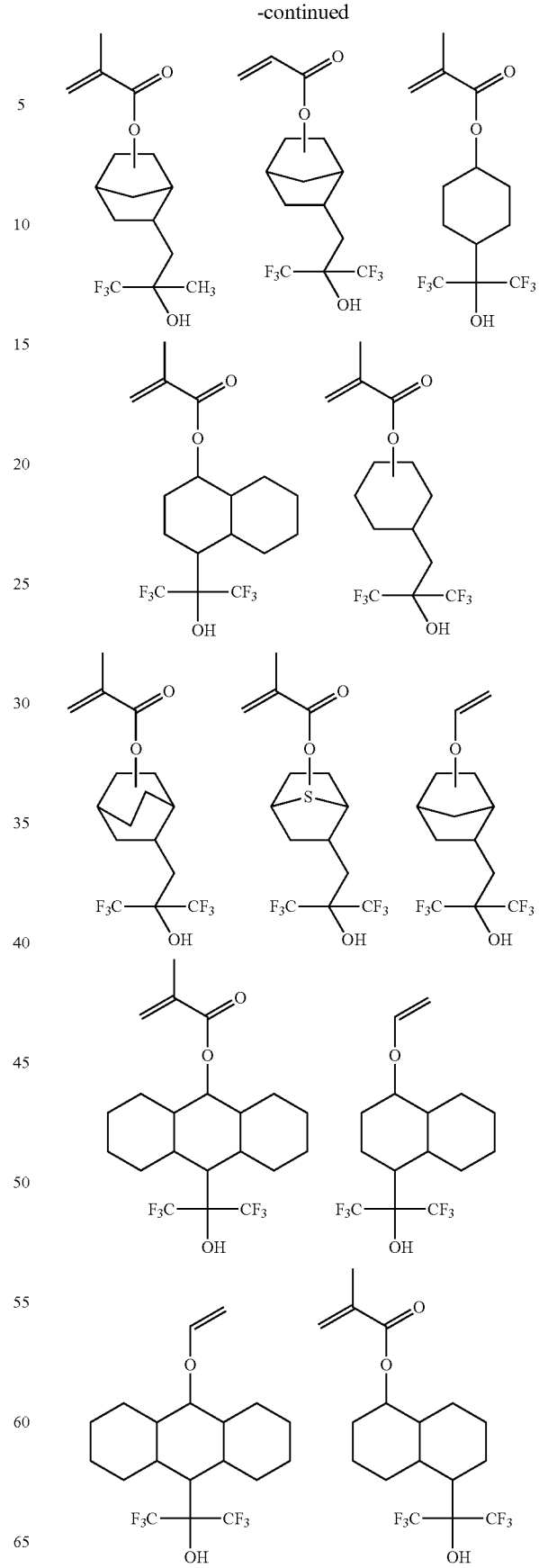

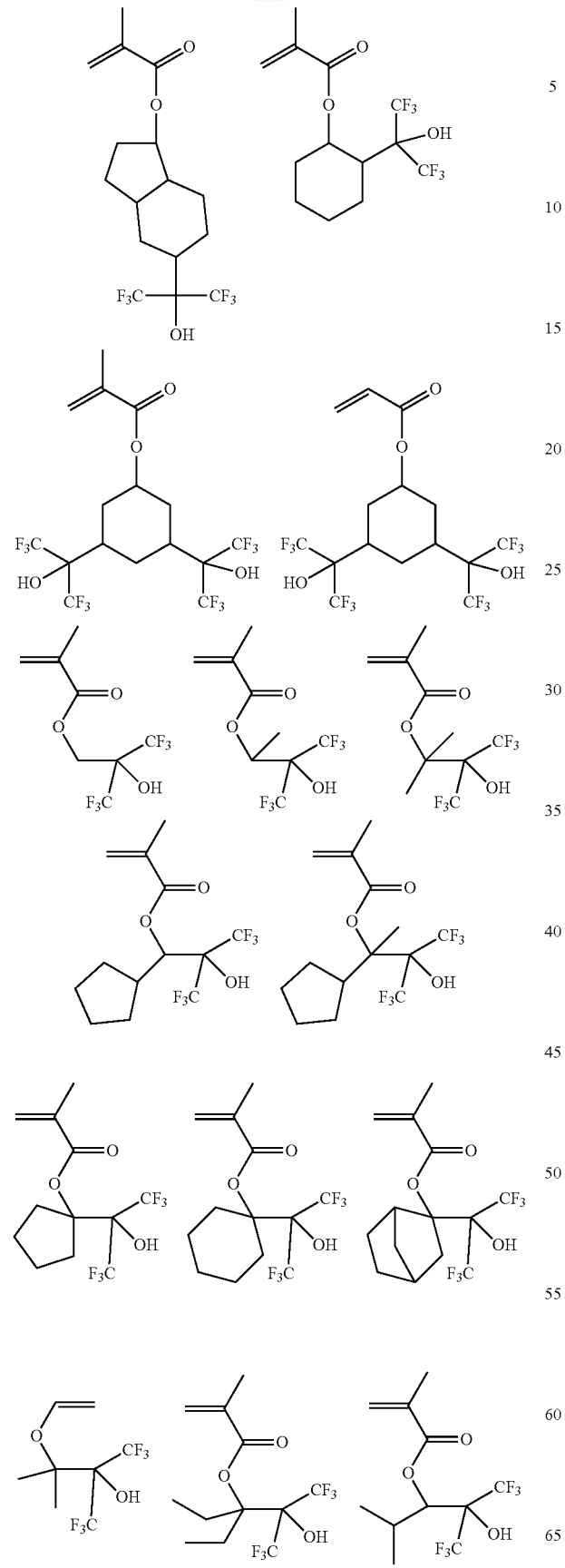
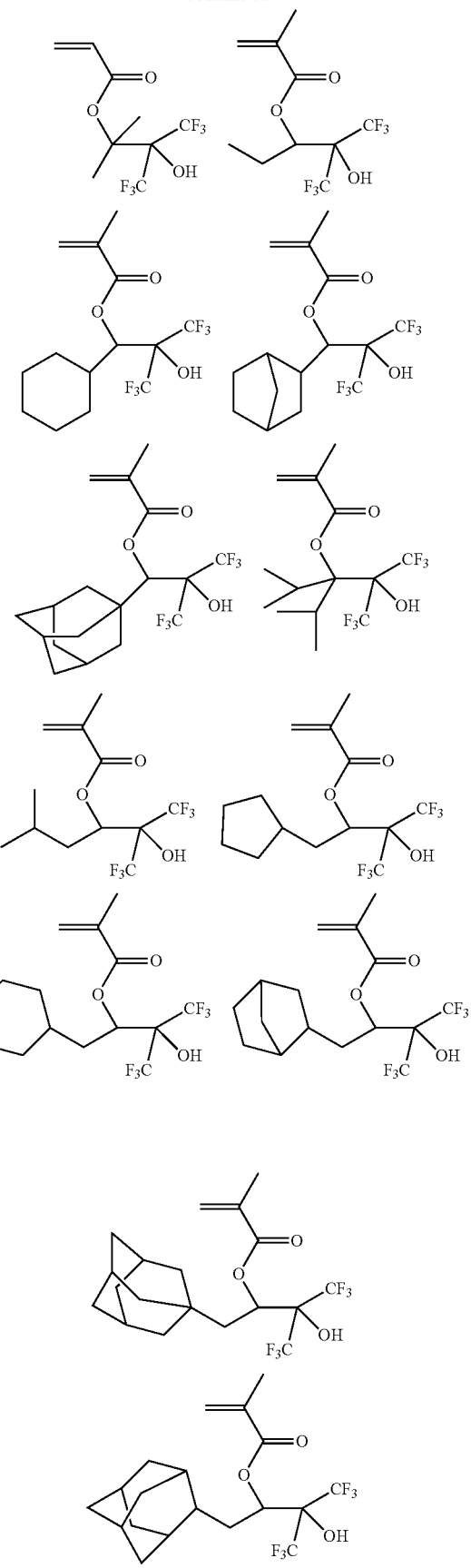

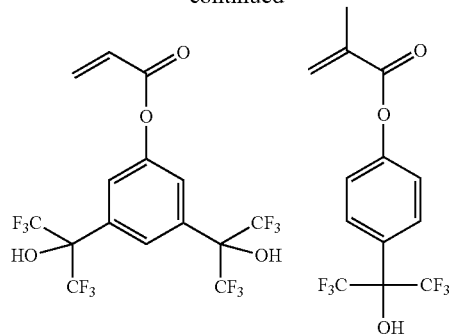

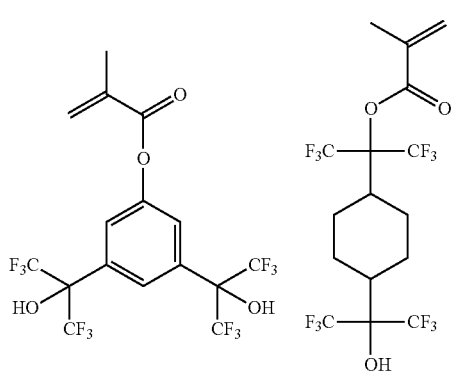

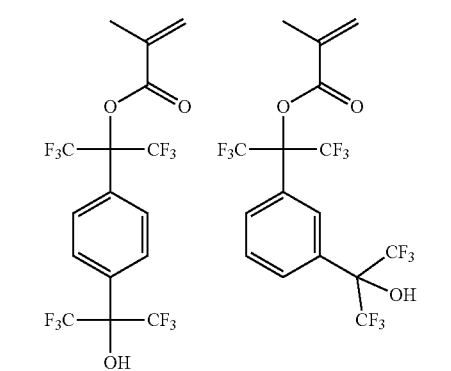

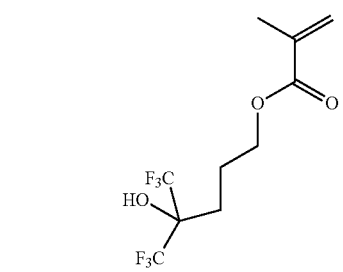

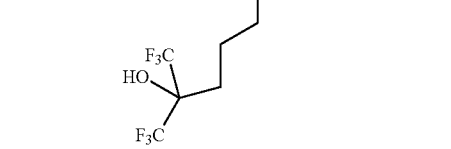

Moreover, the component (B) preferably contains one or more selected from a repeating unit b'1 shown by the following general formula (3-1) as b1, and repeating units b'2 to b'4 shown by the following general formula (3-2) to (3-4) as b2.

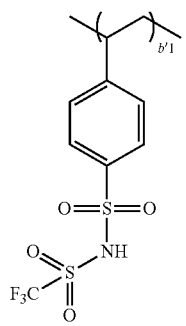
(3-1)

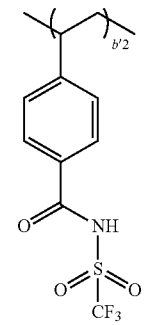
(3-2)

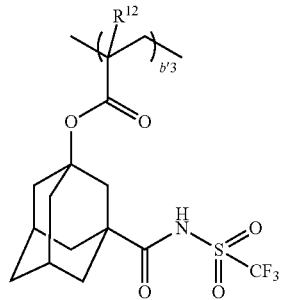
(3-3)

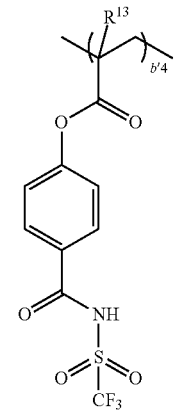
(3-4)

In the formulae, $R^{12}$ and $R^{13}$ each independently represent a hydrogen atom or a methyl group. b'1, b'2, b'3, and b'4 satisfy $0 \leq b'1 < 1.0$, $0 \leq b'2 < 1.0$, $0 \leq b'3 < 1.0$, $0 \leq b'4 < 1.0$, and $0 < b'1 + b'2 + b'3 + b'4 < 1.0$.

A monomer for providing the repeating unit b1 can be specifically exemplified by the following.

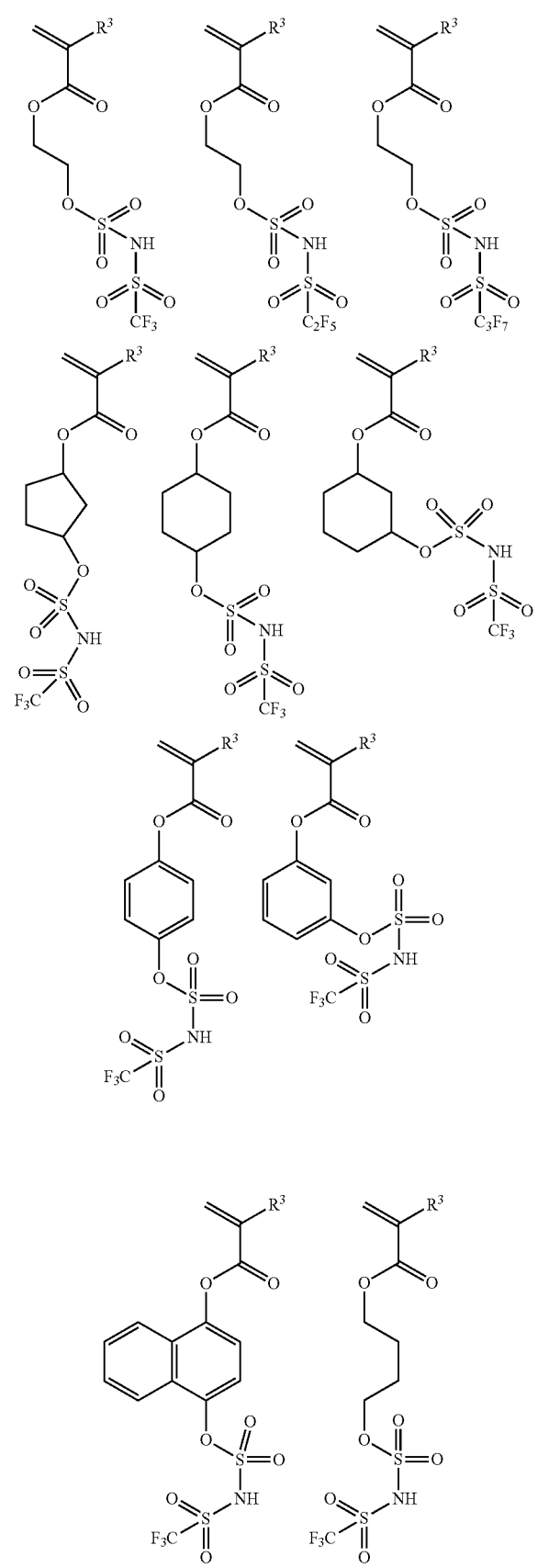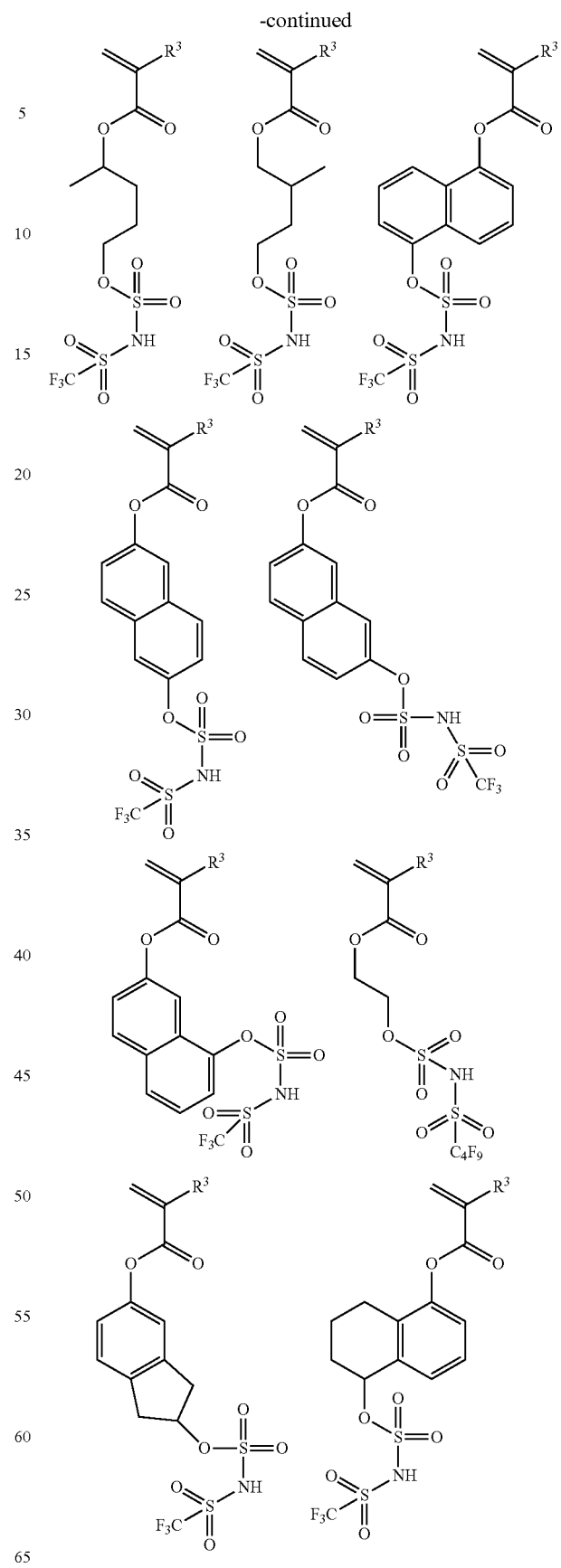

-continued
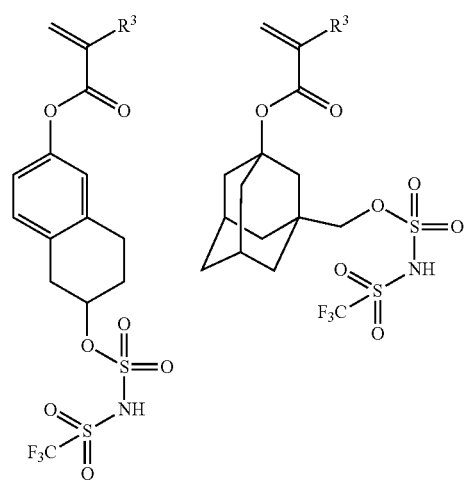
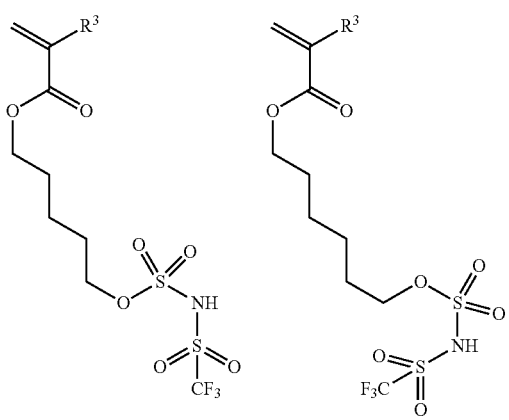
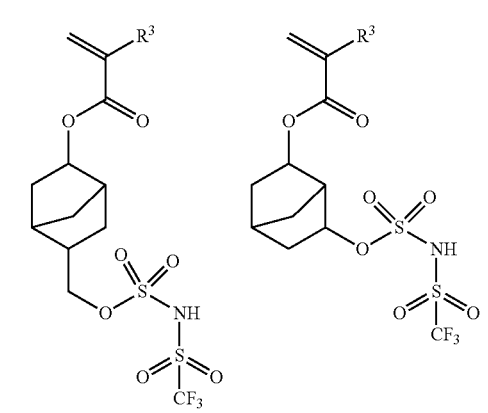
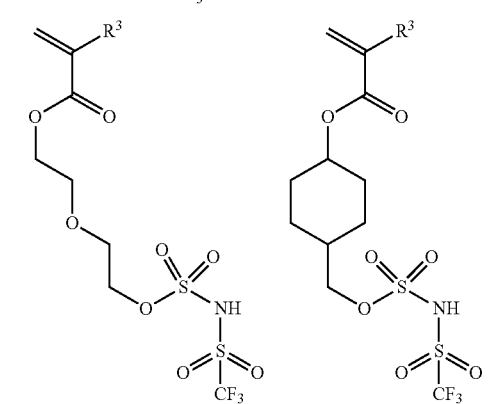
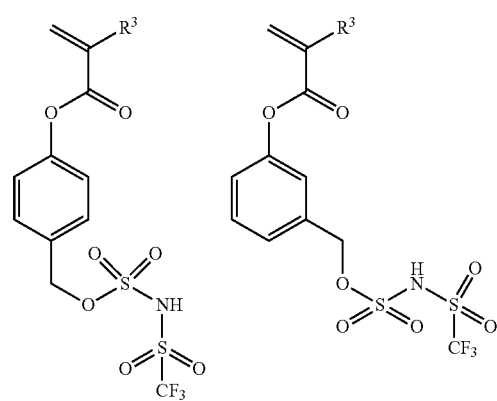

-continued
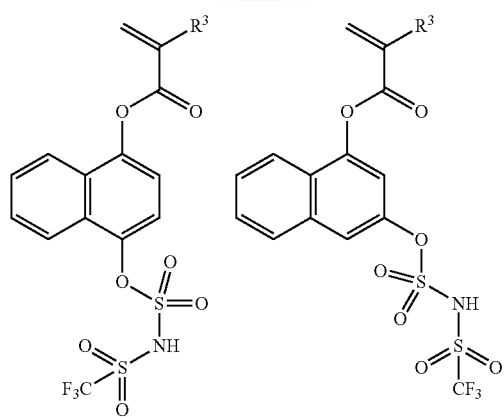
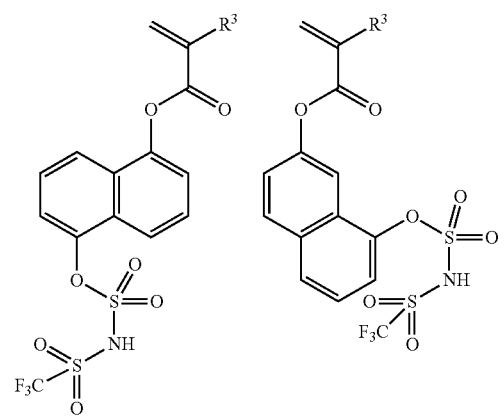
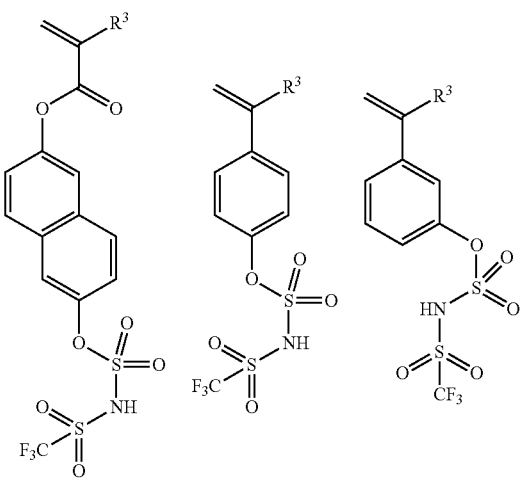
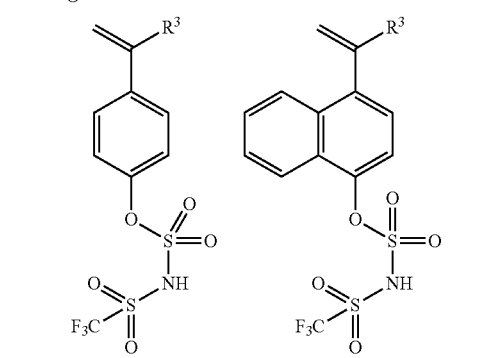
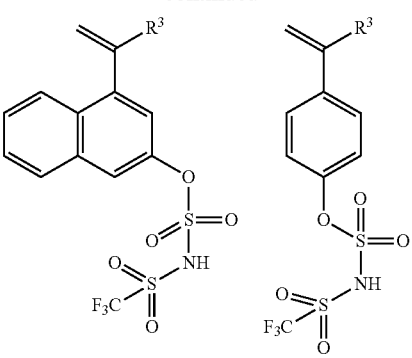
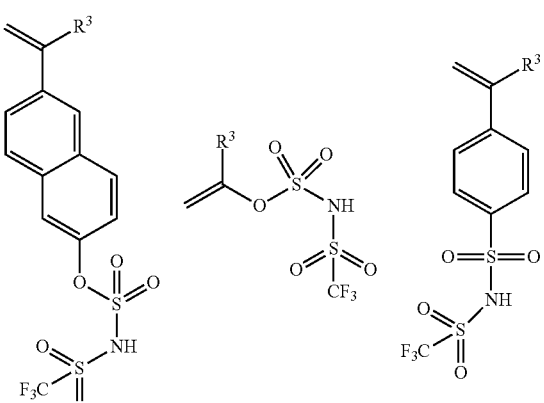
In each formula, $R^3$ is as defined above.
A monomer for providing the repeating unit b2 can be specifically exemplified by the following.
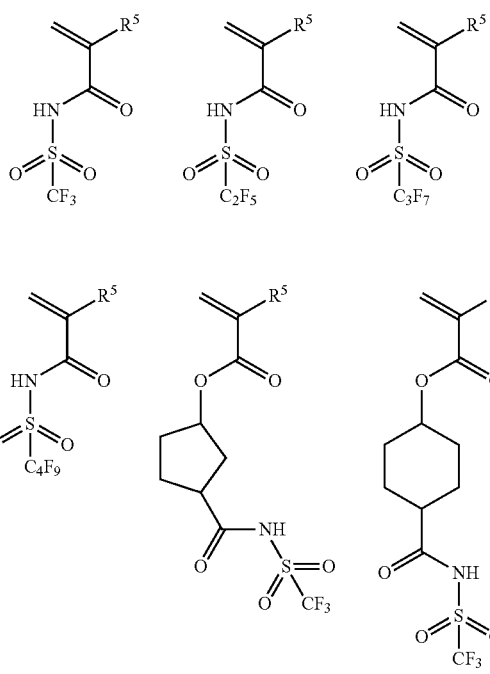

-continued
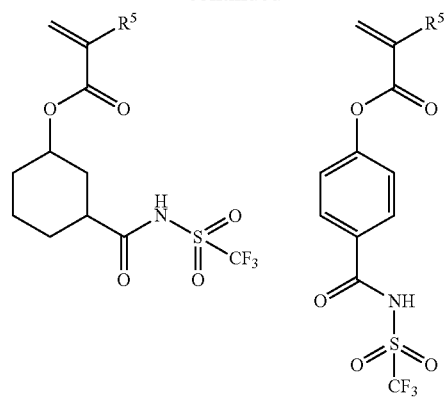 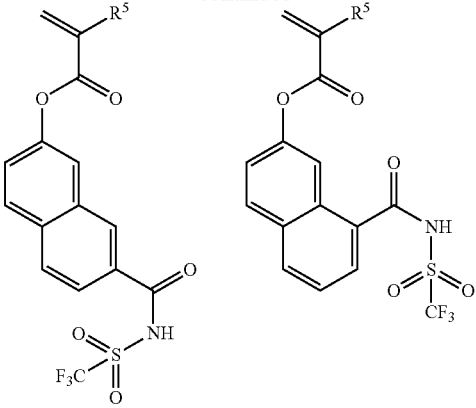
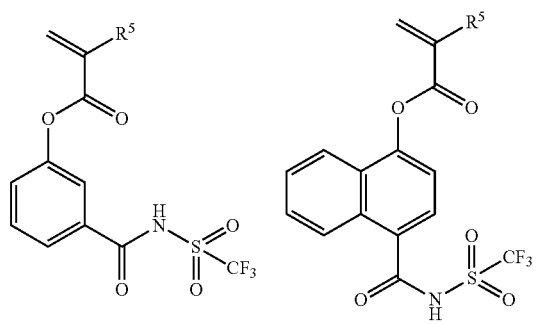 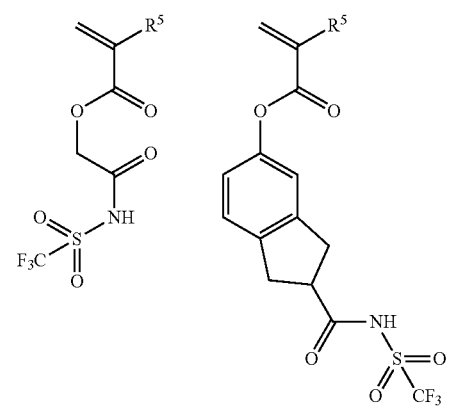
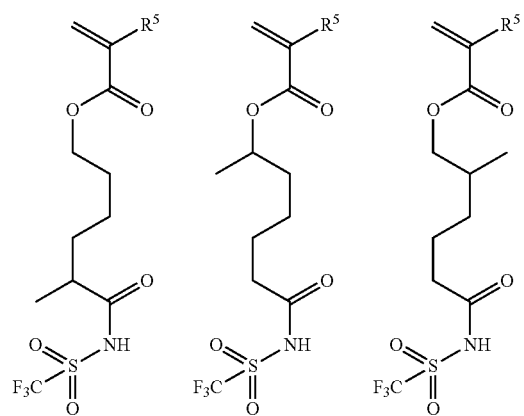 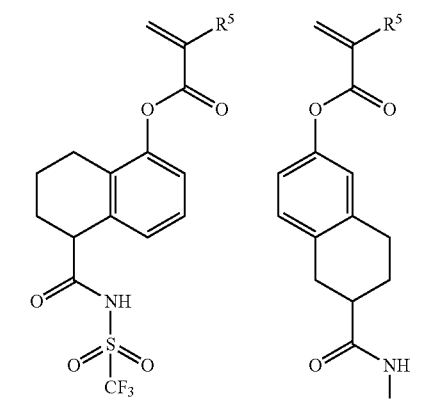
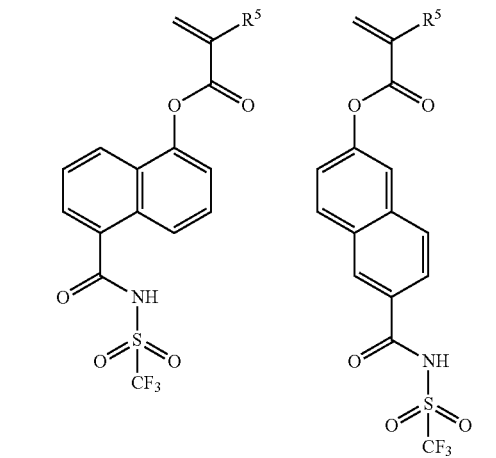 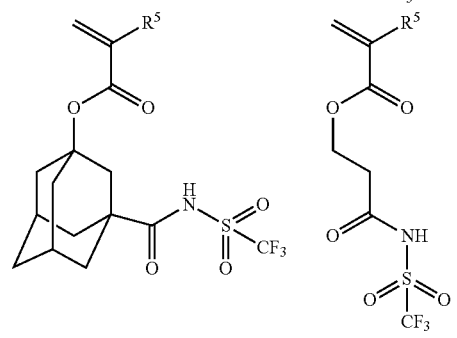

31
-continued
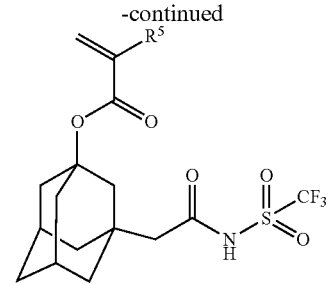
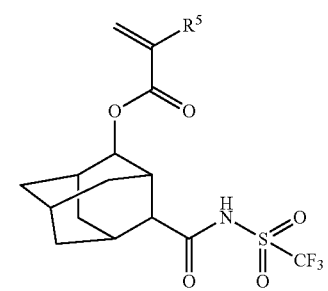
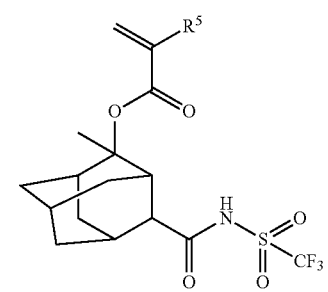
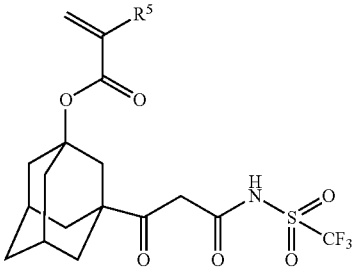
In each formula, R⁵ is as defined above.
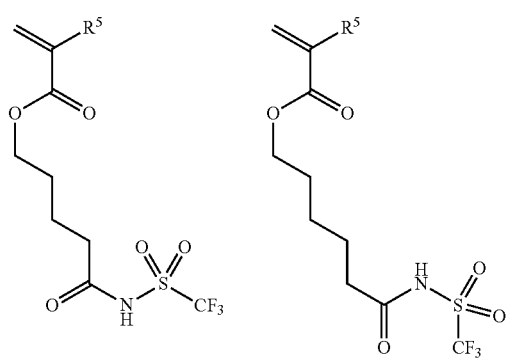
32
-continued
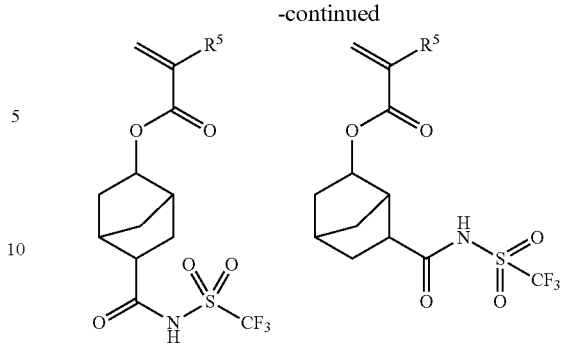
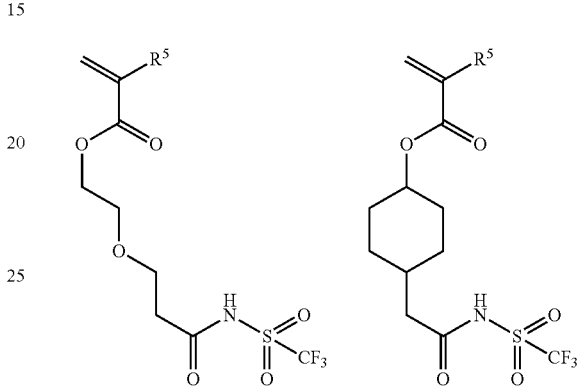
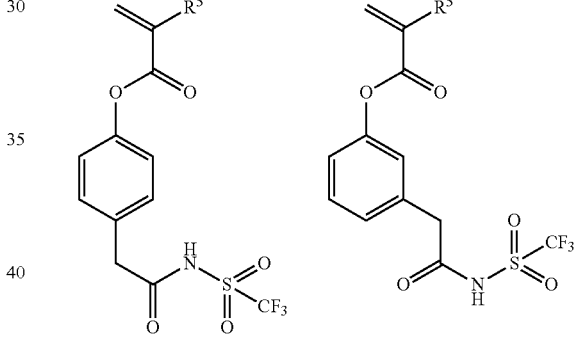
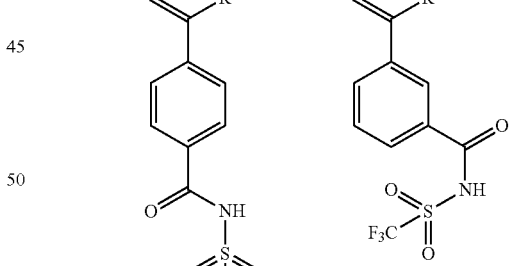

-continued

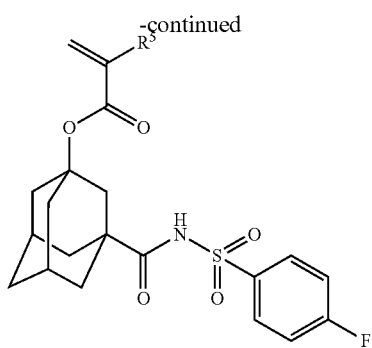

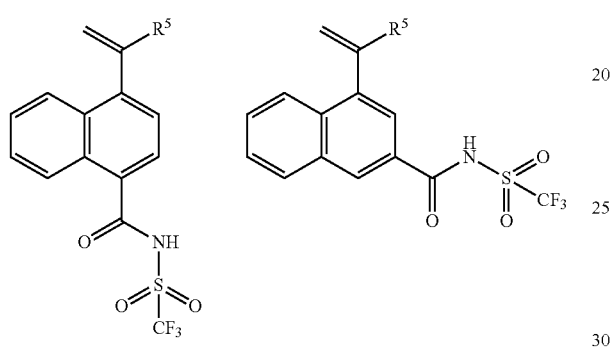

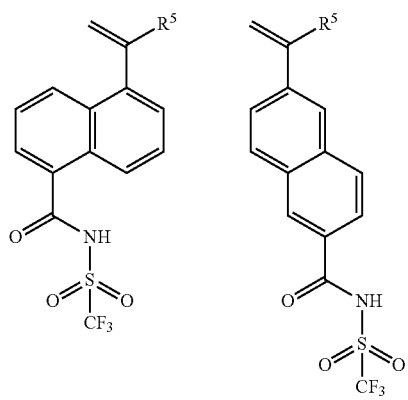

-continued

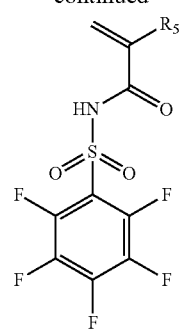

In each formula, R⁵ is as defined above.

The component (B) can further contain a repeating unit "c" shown by the following general formula (4).

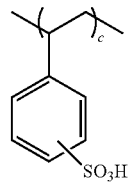

(4)

"c" satisfies 0<c<1.0.

A monomer for providing the repeating unit "c" can be specifically exemplified by the following.

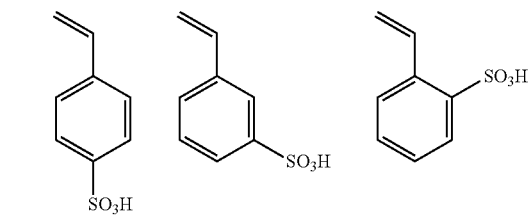

Furthermore, the dopant polymer of the component (B) may contain a repeating unit "d" other than the repeating units "a" to "c". Examples of the repeating unit "d" can include repeating units based on styrene, vinylnaphthalene, vinylsilane, acenaphthylene, indene, vinylcarbazole, etc.

A monomer for providing the repeating unit "d" can be specifically exemplified by the following.

In each formula, R⁵ is as defined above.

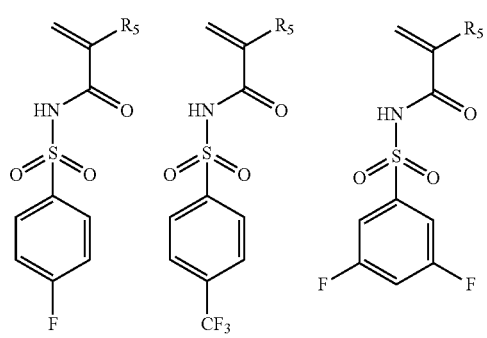

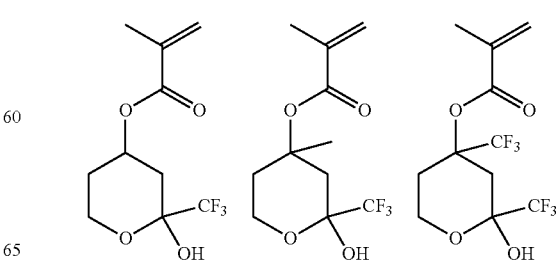

35
-continued
36
-continued
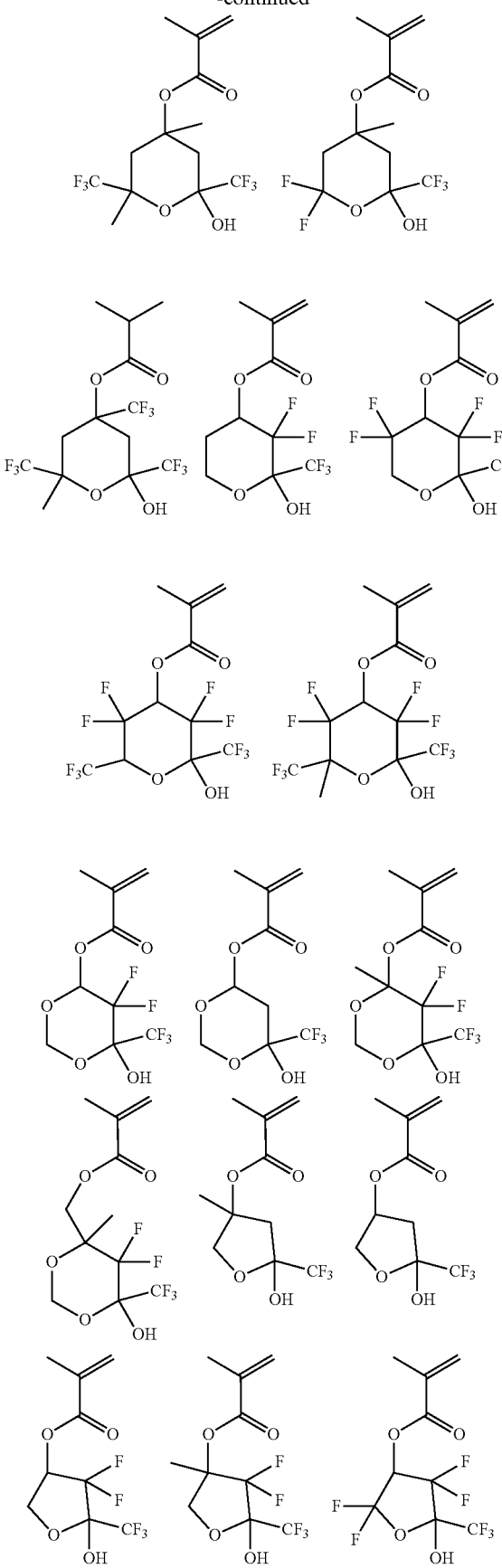
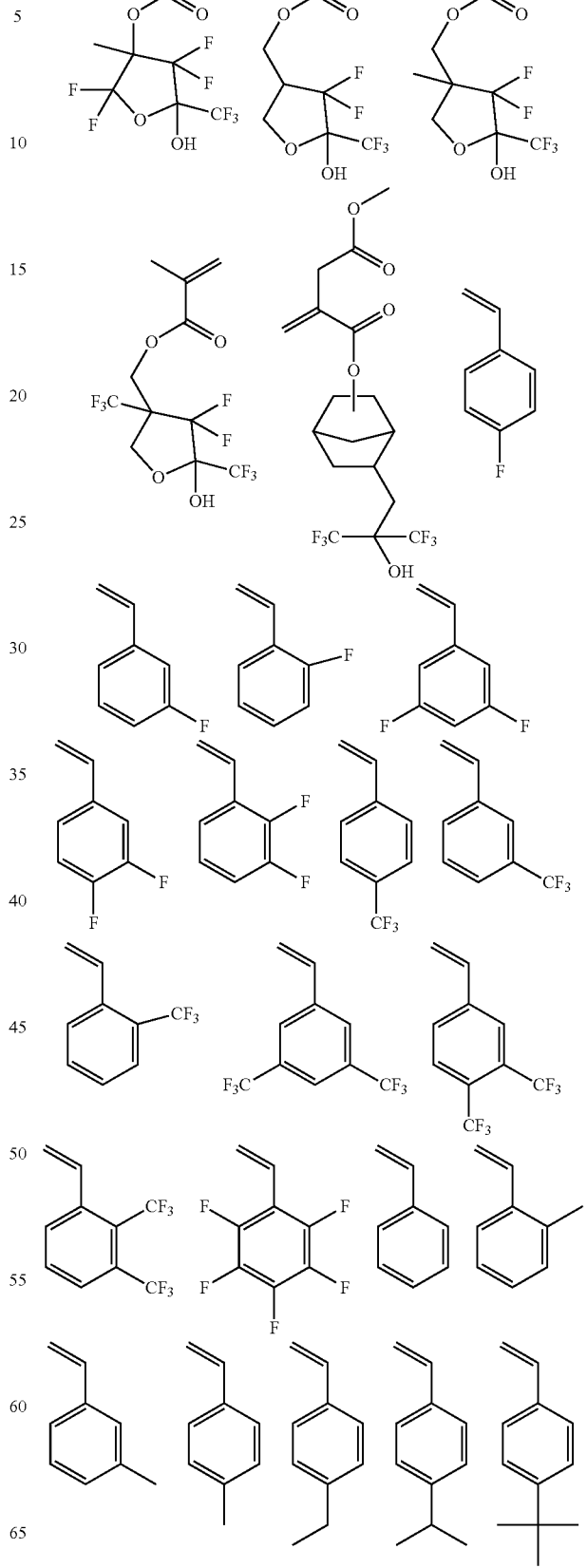

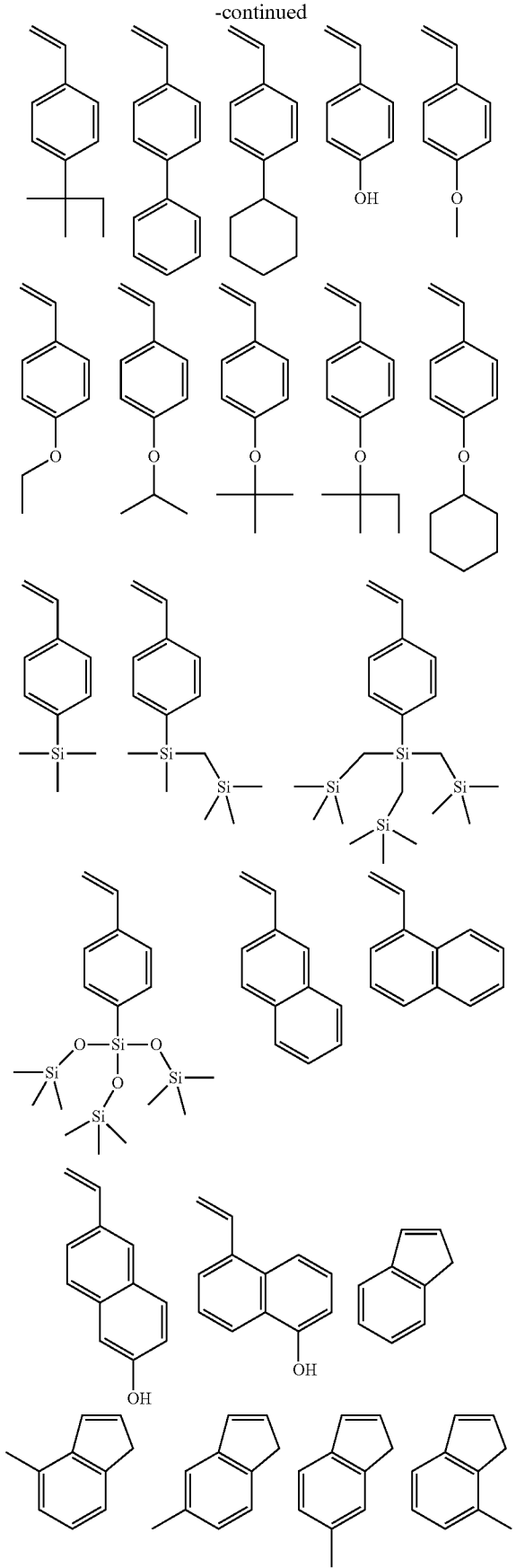
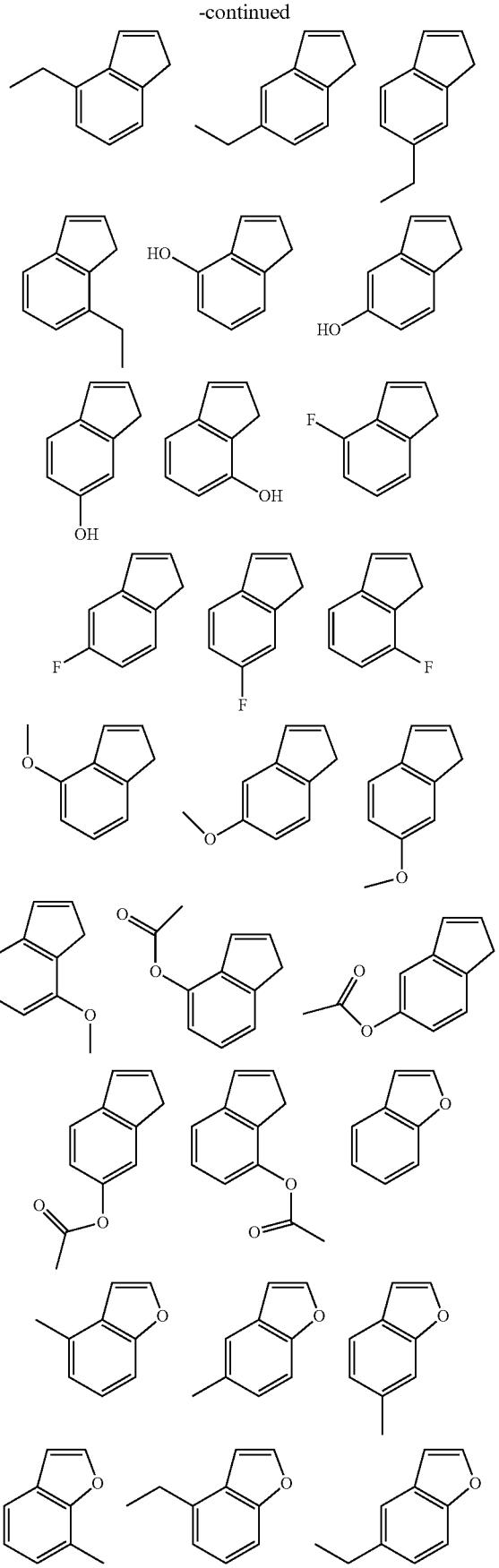

-continued

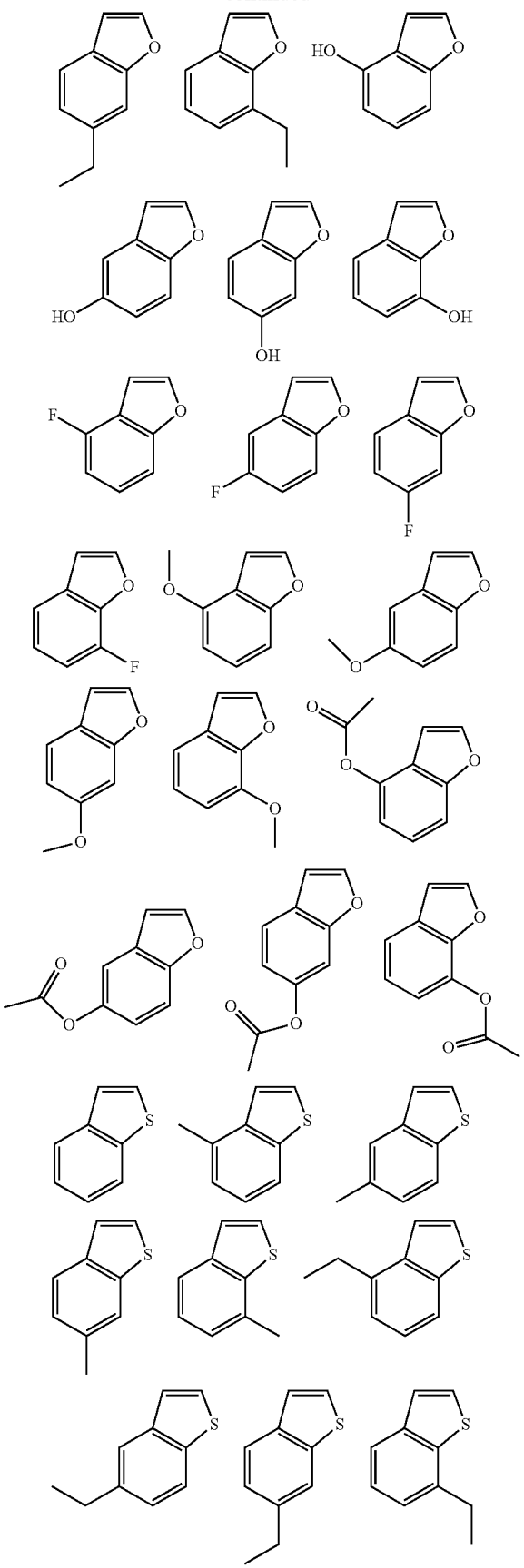

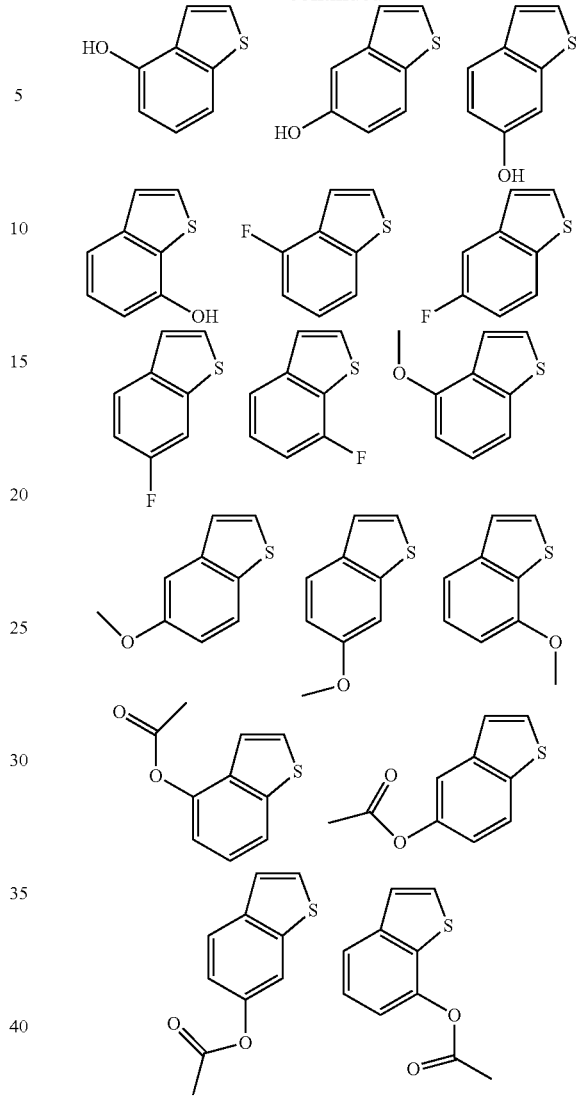

As a method for synthesizing the dopant polymer as the component (B), for example, desired monomers among the monomers providing the repeating units "a" to "d" may be subjected to polymerization under heating in an organic solvent by adding a radical polymerization initiator to obtain a dopant polymer which is a (co)polymer.

The organic solvent to be used at the time of the polymerization may be exemplified by toluene, benzene, tetrahydrofuran, diethyl ether, dioxane, cyclohexane, cyclopentane, methyl ethyl ketone, γ-butyrolactone, etc.

The radical polymerization initiator may be exemplified by 2,2'-azobisisobutyronitrile (AIBN), 2,2'-azobis(2,4-dimethylvaleronitrile), dimethyl 2,2'-azobis(2-methylpropionate), benzoyl peroxide, lauroyl peroxide, etc.

The reaction temperature is preferably 50 to 80° C., and the reaction time is preferably 2 to 100 hours, more preferably 5 to 20 hours.

In the dopant polymer as the component (B), the monomer for providing the repeating unit "a" may be either one kind or two or more kinds. It is preferable to use a methacrylic type monomer and a styrene type monomer in combination to heighten polymerizability.

When two or more kinds of the monomers for providing the repeating unit "a" are used, each monomer may be randomly copolymerized, or may be copolymerized in block. When the block copolymerized polymer (block copolymer) is made, the repeating unit portions of two or more kinds of the repeating unit "a" aggregate, whereby a specific structure is generated around the dopant polymer, and as a result, a merit of improving electric conductivity can also be expected.

In addition, the monomers providing the repeating units "a" to "c" may be randomly copolymerized, or may be copolymerized in block. In this case also, as in the case of the repeating unit "a", a merit of improving conductivity can be expected by forming a block copolymer.

When the random copolymerization is carried out by the radical polymerization, it is a general method that monomers to be copolymerized and a radical polymerization initiator are mixed and polymerized under heating. Polymerization is started in the presence of a first monomer and a radical polymerization initiator, and a second monomer is added later. Thereby, one side of the polymer molecule has a structure in which the first monomer is polymerized, and the other side has a structure in which the second monomer is polymerized.

In this case, however, the repeating units of the first and second monomers are mixedly present in the intermediate portion, and the form is different from that of the block copolymer. For forming the block copolymer by the radical polymerization, living radical polymerization is preferably used.

In the living radical polymerization method called as the RAFT polymerization (Reversible Addition Fragmentation chain Transfer polymerization), the radical at the end of the polymer is always living, so that it is possible to form a di-block copolymer with a block of the repeating unit of the first monomer and a block of the repeating unit of the second monomer by: starting the polymerization with the first monomer, and adding the second monomer when the first monomer is consumed. Further, a tri-block copolymer can also be formed by: starting the polymerization with the first monomer, adding the second monomer when the first monomer is consumed, and then adding a third monomer.

When the RAFT polymerization is carried out, there is a characteristic that a narrow dispersion polymer whose molecular weight distribution (dispersity) is narrow is formed. In particular, when the RAFT polymerization is carried out by adding the monomers at a time, a polymer having a narrower molecular weight distribution can be formed.

Meanwhile, the dopant polymer as the component (B) preferably has a molecular weight distribution (Mw/Mn) of preferably 1.0 to 2.0, particularly preferably a narrow dispersity of 1.0 to 1.5. With a narrow dispersity, it is possible to prevent a decrease in the transmittance of a conductive film formed of the conductive polymer composition using such dopant polymer.

For carrying out the RAFT polymerization, a chain transfer agent is necessary. Specific examples thereof include 2-cyano-2-propylbenzothioate, 4-cyano-4-phenylcarbonothioylthiopentanoic acid, 2-cyano-2-propyl dodecyl trithiocarbonate, 4-cyano-4-[(dodecylsulfanylthiocarbonyl)sulfanyl] pentanoic acid, 2-(dodecylthiocarbonothioylthio)-2-methylpropanoic acid, cyanomethyl dodecyl thiocarbonate, cyanomethyl methyl(phenyl)carbamothioate, bis(thiobenzoyl)disulfide, and bis(dodecylsulfanylthiocarbonyl)disulfide. Among these, 2-cyano-2-propylbenzothioate is particularly preferable.

The dopant polymer as the component (B) has a weight-average molecular weight in a range of preferably 1,000 to 500,000, more preferably 2,000 to 200,000.

When the weight-average molecular weight is 1,000 or more, the heat resistance is excellent, and the uniformity of the composite solution with the component (A) does not deteriorate. Meanwhile, when the weight-average molecular weight is 500,000 or less, the viscosity is not increased too much, the workability is favorable, and the dispersibility into water and an organic solvent is favorable.

Incidentally, the weight-average molecular weight (Mw) is a measured value in terms of polyethylene oxide, polyethylene glycol, or polystyrene, by gel permeation chromatography (GPC) using water, dimethylformamide (DMF), or tetrahydrofuran (THF) as a solvent.

Note that, as the monomer constituting the dopant polymer as the component (B), a monomer having a sulfo group may be used. Alternatively, the polymerization reaction may be carried out using a monomer which is a lithium salt, a sodium salt, a potassium salt, an ammonium salt, or a sulfonium salt of a sulfo group, and then the resultant after the polymerization is changed to a sulfo group by using an ion exchange resin.

[Composite of Components (A) and (B)]

The inventive conductive polymer composition contains the composite containing the π-conjugated polymer as the component (A) and the dopant polymer as the component (B). The dopant polymer of the component (B) is coordinated to the π-conjugated polymer of the component (A) to form the composite.

Preferably, the composite used in the present invention is capable of dispersing in $H_2O$ and has affinity to an organic solvent. The composite can improve the continuous-film formability and the film flatness on a highly hydrophobic inorganic or organic substrate when a spray coater and an inkjet printer are used.

(Composite Production Method)

The composite of the components (A) and (B) can be obtained, for example, by adding a raw-material monomer of the component (A) (preferably, pyrrole, thiophene, aniline, or a derivative monomer thereof) into an aqueous solution of the component (B) or a mixture solution of water and an organic solvent with the component (B), and adding an oxidizing agent and, if necessary, an oxidizing catalyst thereto, to carry out oxidative polymerization.

The oxidizing agent and the oxidizing catalyst which can be used may be: a peroxodisulfate (persulfate), such as ammonium peroxodisulfate (ammonium persulfate), sodium peroxodisulfate (sodium persulfate), and potassium peroxodisulfate (potassium persulfate); a transition metal compound, such as ferric chloride, ferric sulfate, and cupric chloride; a metal oxide, such as silver oxide and cesium oxide; a peroxide, such as hydrogen peroxide and ozone; an organic peroxide, such as benzoyl peroxide; oxygen, etc.

As the reaction solvent to be used for carrying out the oxidative polymerization, water or a mixed solvent of water and a solvent may be used. The organic solvent herein used is preferably an organic solvent which is miscible with water, and can dissolve or disperse the components (A) and (B). Examples of the solvent include polar solvents, such as N-methyl-2-pyrrolidone, N,N'-dimethylformamide, N,N'-dimethylacetamide, dimethylsulfoxide, and hexamethylene phosphotriamide; alcohols, such as methanol, ethanol, propanol, and butanol; polyhydric aliphatic alcohols, such as ethylene glycol, propylene glycol, dipropylene glycol, 1,3-butylene glycol, 1,4-butylene glycol, D-glucose, D-glucitol, isoprene glycol, butanediol, 1,5-pentanediol, 1,6-hexanediol, 1,9-nonanediol, and neopentyl glycol; carbonate compounds, such as ethylene carbonate and propylene carbonate; cyclic ether compounds, such as dioxane and tetrahydrofuran; linear ethers, such as dialkyl ether, ethylene glycol monoalkyl ether, ethylene glycol dialkyl ether, propylene glycol monoalkyl ether, propylene glycol dialkyl ether, polyethylene glycol dialkyl ether, and polypropylene glycol dialkyl ether; heterocyclic compounds, such as 3-methyl-2-oxazolidinone; nitrile compounds, such as acetonitrile, glutaronitrile, methoxyacetonitrile, propionitrile, and benzonitrile; etc. One of these organic solvents may be used singly, or two or more kinds thereof may be used in mixture. A formulation ratio of these organic solvents miscible with water is preferably 50 mass % or less based on the whole reaction solvent.

In addition, an anion which is capable of doping the component (A) of the π-conjugated polymer may be used in combination other than the component (B) of the dopant polymer. Such an anion is preferably an organic acid from the viewpoints of, for example, adjusting de-doping characteristics from the π-conjugated polymer, dispersibility of the conductive polymer composite, heat resistance, and environmental resistance characteristics. Examples of the organic acid include an organic carboxylic acid, phenols, an organic sulfonic acid, etc.

As the organic carboxylic acid, a material in which one or two or more carboxyl groups are contained in an aliphatic, an aromatic, a cycloaliphatic, or the like may be used. Examples thereof include formic acid, acetic acid, oxalic acid, benzoic acid, phthalic acid, maleic acid, fumaric acid, malonic acid, tartaric acid, citric acid, lactic acid, succinic acid, monochloroacetic acid, dichloroacetic acid, trichloroacetic acid, trifluoroacetic acid, nitroacetic acid, triphenylacetic acid, etc.

Examples of the phenols include phenols, such as cresol, phenol, and xylenol.

As the organic sulfonic acid, a material in which one or two or more sulfonic acid groups are contained in an aliphatic, an aromatic, a cycloaliphatic, or the like may be used. Examples of the organic sulfonic acid containing one sulfonic acid group can include sulfonic acid compounds containing a sulfonic acid group, such as methanesulfonic acid, ethanesulfonic acid, 1-propanesulfonic acid, 1-butanesulfonic acid, 1-hexanesulfonic acid, 1-heptanesulfonic acid, 1-octanesulfonic acid, 1-nonanesulfonic acid, 1-decanesulfonic acid, 1-dodecanesulfonic acid, 1-tetradecanesulfonic acid, 1-pentadecanesulfonic acid, 2-bromoethanesulfonic acid, 3-chloro-2-hydroxypropanesulfonic acid, trifluoromethanesulfonic acid, colistinmethanesulfonic acid, 2-acrylamido-2-methylpropanesulfonic acid, aminomethanesulfonic acid, 1-amino-2-naphthol-4-sulfonic acid, 2-amino-5-naphthol-7-sulfonic acid, 3-aminopropanesulfonic acid, N-cyclohexyl-3-aminopropanesulfonic acid, benzenesulfonic acid, p-toluenesulfonic acid, xylenesulfonic acid, ethylbenzenesulfonic acid, propylbenzenesulfonic acid, butylbenzenesulfonic acid, pentylbenzenesulfonic acid, hexylbenzenesulfonic acid, heptylbenzenesulfonic acid, octylbenzenesulfonic acid, nonylbenzenesulfonic acid, decylbenzenesulfonic acid, undecylbenzenesulfonic acid, dodecylbenzenesulfonic acid, pentadecylbenzenesulfonic acid, hexadecylbenzenesulfonic acid, 2,4-dimethylbenzenesulfonic acid, dipropylbenzenesulfonic acid, butylbenzenesulfonic acid, 4-aminobenzenesulfonic acid, o-aminobenzenesulfonic acid, m-aminobenzenesulfonic acid, 4-amino-2-chlorotoluene-5-sulfonic acid, 4-amino-3-methylbenzene-1-sulfonic acid, 4-amino-5-methoxy-2-methylbenzenesulfonic acid, 2-amino-5-methylbenzene-1-sulfonic acid, 4-amino-2-methylbenzene-1-sulfonic acid, 5-amino-2-methylbenzene-1-sulfonic acid, 4-amino-3-methylbenzene-1-sulfonic acid, 4-acetamido-3-chlorobenzenesulfonic acid, 4-chloro-3-nitrobenzenesulfonic acid, p-chlorobenzenesulfonic acid, naphthalenesulfonic acid, methylnaphthalenesulfonic acid, propylnaphthalenesulfonic acid, butylnaphthalenesulfonic acid, pentylnaphthalenesulfonic acid, dimethylnaphthalenesulfonic acid, 4-amino-1-naphthalenesulfonic acid, 8-chloronaphthalene-1-sulfonic acid, naphthalenesulfonic acid formalin polycondensate, and melaminesulfonic acid formalin polycondensate.

Examples of the organic sulfonic acid containing two or more sulfonic acid groups can include ethanedisulfonic acid, butanedisulfonic acid, pentanedisulfonic acid, decanedisulfonic acid, m-benzenedisulfonic acid, o-benzenedisulfonic acid, p-benzenedisulfonic acid, toluenedisulfonic acid, xylenedisulfonic acid, chlorobenzenedisulfonic acid, fluorobenzenedisulfonic acid, aniline-2,4-disulfonic acid, aniline-2,5-disulfonic acid, dimethylbenzenedisulfonic acid, diethylbenzenedisulfonic acid, dibutylbenzenedisulfonic acid, naphthalenedisulfonic acid, methylnaphthalenedisulfonic acid, ethylnaphthalenedisulfonic acid, dodecylnaphthalenedisulfonic acid, pentadecylnaphthalenedisulfonic acid, butylnaphthalenedisulfonic acid, 2-amino-1,4-benzenedisulfonic acid, 1-amino-3,8-naphthalenedisulfonic acid, 3-amino-1,5-naphthalenedisulfonic acid, 8-amino-1-naphthol-3,6-disulfonic acid, 4-amino-5-naphthol-2,7-disulfonic acid, anthracenedisulfonic acid, butylanthracenedisulfonic acid, 4-acetamido-4'-isothio-cyanatostilbene-2,2'-disulfonic acid, 4-acetamido-4'-isothiocyanatostilbene-2,2'-disulfonic acid, 4-acetamido-4'-maleimidylstilbene-2,2'-disulfonic acid, 1-acetoxypyrene-3,6,8-trisulfonic acid, 7-amino-1,3,6-naphthalenetrisulfonic acid, 8-aminonaphthalene-1,3,6-trisulfonic acid, 3-amino-1,5,7-naphthalenetrisulfonic acid, etc.

These anions other than the component (B) may be added to the solution containing the raw-material monomer of the component (A), the component (B), an oxidizing agent and/or an oxidative polymerization catalyst before polymerization of the component (A), or may be added to the composite containing the components (A) and (B) after the polymerization.

The thus obtained composite of the components (A) and (B) can be used, if necessary, after subjected to fine pulverization with a homogenizer, a ball mill, or the like.

For fine pulverization, a mixing-dispersing machine which can provide high shearing force is preferably used. Examples of the mixing-dispersing machine include a homogenizer, a high-pressure homogenizer, a bead mill, etc. Among these, a high-pressure homogenizer is preferable.

Specific examples of the high-pressure homogenizer include Nanovater manufactured by Yoshida Kikai Co., Ltd., Microfluidizer manufactured by Powrex Corp., Artimizer manufactured by Sugino Machine Limited., etc.

Examples of a dispersing treatment using the high-pressure homogenizer include a treatment in which the composite solution before subjecting to the dispersing treatment is subjected to counter-collision with high pressure; a treatment in which it is passed through an orifice or slit with high pressure; and other similar methods.

Before or after fine pulverization, impurities may be removed by a method, such as filtration, ultrafiltration, and dialysis, followed by purification with a cation-exchange resin, an anion-exchange resin, a chelate resin, or the like.

Note that a total content of the components (A) and (B) is preferably 0.05 to 5.0 mass % in the conductive polymer composition. When the total content of the components (A)

and (B) is 0.05 mass % or more, sufficient conductivity or hole injection function is obtained. When the total content is 5.0 mass % or less, uniform conductive coating film is easily obtained.

Examples of the organic solvent, which can be added to the aqueous solution for the polymerization reaction or can dilute the monomer, include methanol, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, t-butyl propionate, propylene glycol mono-t-butyl ether acetate, γ-butyrolactone, mixtures thereof, etc.

Note that the amount of the organic solvent to be used is preferably 0 to 1,000 mL based on 1 mol of the monomer, particularly preferably 0 to 500 mL. When the amount of the organic solvent used is 1,000 mL or less, the reaction vessel does not become too large so that it is economical.

[(C) Component: Water-Soluble Organic Solvent]

In the present invention, a water-soluble organic solvent is added for improving the printability to a material to be processed, such as a substrate. Examples of such an organic solvent include organic solvents that are soluble in $H_2O$ and have a boiling point of 250° C. or less at normal pressure.

Examples thereof include alcohols, such as methanol, ethanol, propanol, and butanol; polyhydric aliphatic alcohols, such as ethylene glycol, propylene glycol, 1,3-propanediol, diethylene glycol, dipropylene glycol, 1,3-butylene glycol, 1,4-butylene glycol, isoprene glycol, 1,2-butanediol, 1,3-butanediol, 1,4-butanediol, 2,3-butanediol, 1,2-pentanediol, 1,5-pentanediol, 1,2-hexanediol, 1,6-hexanediol, and neopentyl glycol; linear ethers, such as dialkyl ether, dimethoxyethane, ethylene glycol monoalkyl ether, ethylene glycol dialkyl ether, propylene glycol monoalkyl ether, propylene glycol dialkyl ether, butanediol monoalkyl ether, polyethylene glycol dialkyl ether, and polypropylene glycol dialkyl ether; cyclic ether compounds, such as dioxane and tetrahydrofuran; polar solvents, such as cyclohexanone, methyl amyl ketone, ethyl acetate, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, t-butyl propionate, propylene glycol mono-t-butyl ether acetate, γ-butyrolactone, N-methyl-2-pyrrolidone, N,N'-dimethylformamide, N,N'-dimethylacetamide, dimethylsulfoxide, and hexamethylene phosphotriamide; carbonate compounds, such as ethylene carbonate and propylene carbonate; heterocyclic compounds, such as 3-methyl-2-oxazolidinone; nitrile compounds, such as acetonitrile, glutaronitrile, methoxyacetonitrile, propionitrile, and benzonitrile; mixtures thereof; etc.

The organic solvent (C) to be mixed with a $H_2O$ dispersion of the composite of (A) and (B) is essentially a water-soluble organic solvent. The organic solvent (C) may include an organic solvent (C1) having a boiling point of 120° C. or more, and an organic solvent (C2) having a boiling point of less than 120° C.

It is possible to use, for example, either (C1) or (C2) singly, or a mixture of (C1) and (C2). The content(s) preferably satisfy 1.0 wt %≤(C1)+(C2)<50.0 wt %, more preferably 5.0 wt %≤(C1)+(C2)<30.0 wt %, relative to a total of the components (A), (B), and (D).

Further, the components (C1) and (C2) are preferably selected from alcohols, ethers, esters, ketones, and nitriles each of which has 1 to 7 carbon atoms.

Additionally, the use of an organic solvent having a boiling point higher than that of $H_2O$ in the water-soluble organic solvent makes it possible to avoid solid content precipitation around a nozzle and solid content precipitation due to drying between ejection of the liquid material from a nozzle tip and landing on a substrate.

[(D) Component: $H_2O$]

In the inventive composition, the composite of the components (A) and (B) is dispersed in $H_2O$ as a component (D), and the inventive composition contains the water-soluble organic solvent (C). As the component (D), for example, ultrapure water can be used.

[(E) Component]

To the composition in which the $H_2O$ dispersion of the composite of the components (A) and (B) is mixed with the water-soluble organic solvent (C), a compound (E) shown by the following general formula (5) can be further added.

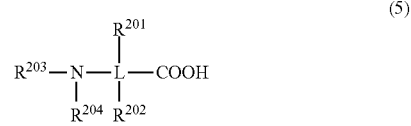

(5)

In the formula, $R^{201}$ and $R^{202}$ each independently represent any of a hydrogen atom, a heteroatom, and a linear, branched, or cyclic monovalent hydrocarbon group having 1 to 20 carbon atoms optionally having a heteroatom. $R^{203}$ and $R^{204}$ each independently represent any of a hydrogen atom and a linear, branched, or cyclic monovalent hydrocarbon group having 1 to 20 carbon atoms optionally having a heteroatom. $R^{201}$ and $R^{203}$, or $R^{201}$ and $R^{204}$, are optionally bonded to each other to form a ring. L represents a linear, branched, or cyclic tetravalent organic group having 1 to 20 carbon atoms optionally having a heteroatom. When L has a heteroatom, the heteroatom is optionally an ion.

As a result of incorporating the component (E), when the conductive polymer composition is used to form a film as an electrode or hole injection layer of a thin film-stacked device, such as organic EL and solar cell, the influence of acid can be relieved by suppressing the acid diffusion into an adjacent layer and other constituent layers of the laminate structure. Moreover, when the inventive conductive polymer composition contains the component (E) and this conductive polymer composition is used to form a film as a constituent of a thin-film device having a laminate structure on a material to be processed, the acid diffusion into an adjacent layer and other constituent layers of the laminate structure device is further suppressed. Thus, the acid influence can be further relieved.

In the present invention, only one kind of the compound (E) shown by the general formula (5) may be used, or two or more kinds thereof may be used in mixture. Moreover, any known compound can also be used.

The structure of the compound shown by the general formula (5) can be specifically exemplified by the following.

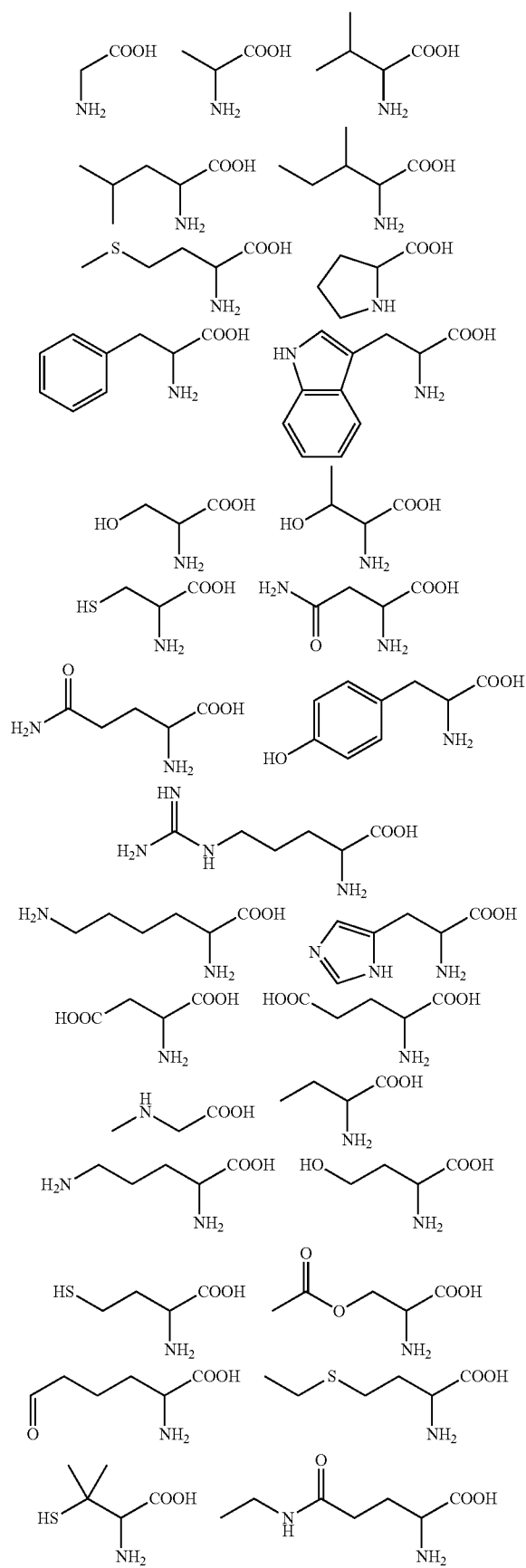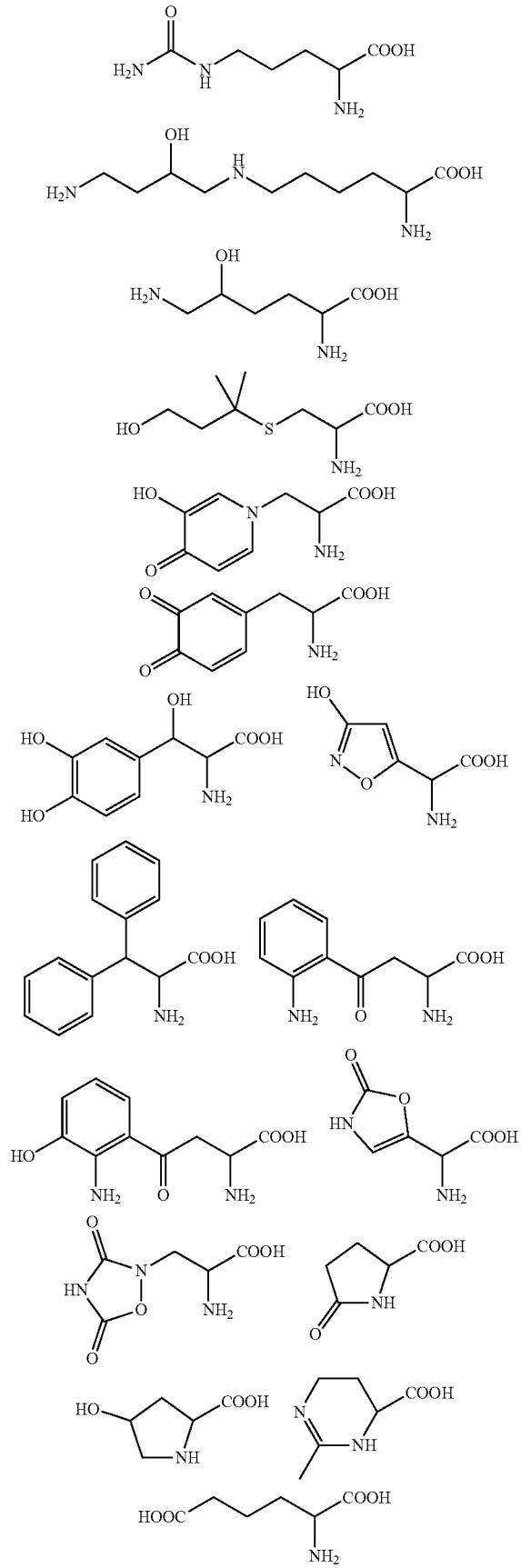

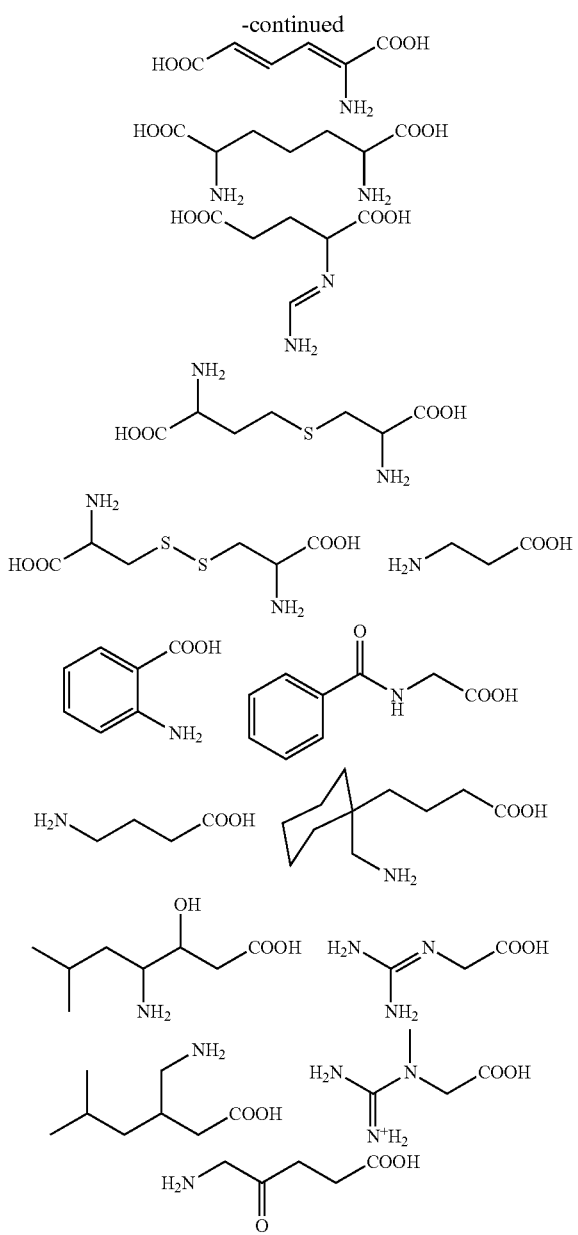

Preferably, the inventive conductive polymer composition contains the compound shown by the general formula (5) in which L represents a linear, branched, or cyclic tetravalent organic group having 2 to 10 carbon atoms optionally having a heteroatom.

Other than the structures shown by the general formula (5), compounds shown in the following formula (7) can be suitably used in the present invention.

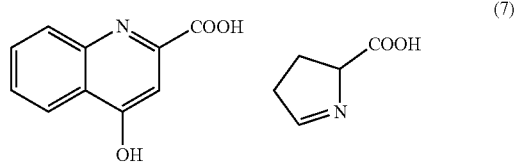

(7)

In the inventive conductive polymer composition, the content of the compound shown by the general formula (5) and the compound(s) shown by the formula (7) is preferably 1 part by mass to 50 parts by mass, further more preferably 5 parts by mass to 30 parts by mass, based on 100 parts by mass of the composite of the components (A) and (B). When the compound shown by the general formula (5) and the compound(s) shown by the formula (7) is contained in such amounts, the $H^+$ diffusion from a film formed of the inventive conductive polymer composition to an adjacent layer can be controlled.

[Other Components](Surfactant) In the present invention, a surfactant may be added to further increase wettability to a material to be processed, such as a substrate. Examples of such a surfactant include various surfactants such as nonionic, cationic, and anionic surfactants. Specific examples thereof include nonionic surfactants, such as polyoxyethylene alkyl ether, polyoxyethylene alkylphenyl ether, polyoxyethylene carboxylic acid ester, sorbitan ester, and polyoxyethylene sorbitan ester; cationic surfactants, such as alkyltrimethyl ammonium chloride and alkylbenzyl ammonium chloride; anionic surfactants, such as alkyl or alkylallyl sulfates, alkyl or alkylallyl sulfonate, and dialkyl sulfosuccinate; amphoteric ionic surfactants, such as amino acid type and betaine type; etc.

Preferably, a nonionic surfactant is contained in an amount of 1 part by mass to 15 parts by mass based on 100 parts by mass of the composite of the component (A) with the component (B).

As has been described above, the inventive conductive polymer composition is capable of efficiently removing residual moisture in the film during the film formation, has favorable filterability and high continuous-film formability on inorganic and organic substrates even when a spray coater or inkjet printer is used, and is also capable of forming a conductive film having favorable film flatness and high transparency.

[Substrate]

The present invention provides a substrate having an organic EL device, the organic EL device including a hole injection layer formed from the above-described conductive polymer composition.

In addition, the substrate of the present invention can be produced according to a process including a step of applying the above-described conductive polymer composition by using a spray coater or inkjet printing.

Examples of the substrate include inorganic substrates, such as glass substrate, quartz substrate, photomask blank substrate, silicon wafer, gallium arsenide wafer, and indium phosphide wafer; organic resin substrates, such as polyimide, polyethylene terephthalate, polycarbonate, cycloolefin polymer, and triacetyl cellulose; etc.

As described above, according to the present invention, the water-soluble organic solvent (C) is mixed with the $H_2O$ dispersion of the composite containing the π-conjugated polymer (A) and the dopant polymer (B) that is prepared by copolymerizing the fluoroalcohol unit "a" and the repeating unit(s) b1, b2 having a fluorosulfonimide group and/or a n-carbonyl-fluoro-sulfonamide group. This enables low viscosity, favorable filterability, and high continuous film formability on inorganic and organic substrates even when a spray coater or an inkjet printer is employed.

Moreover, it is possible to form a conductive film having suitable transparency, flatness, durability, and conductivity. Further, by adding the component (E) to relieve the diffusion of $H^+$ derived from the acid unit in a non-doping state, the $H^+$ diffusion to an adjacent layer after the film formation can also suppressed while keeping appropriate acidity as a composition. Such a conductive polymer composition can function as a hole injection layer.

Example

Hereinafter, the present invention will be specifically described with reference to Examples and Comparative Examples, but the present invention is not limited thereto.

SYNTHESIS EXAMPLES OF DOPANT POLYMERS

Raw-material monomers used in polymerizations for copolymerized dopant polymers presented by (B) in composites used in Examples and Comparative Examples are shown below.

Monomer a″1

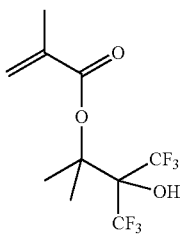

Monomer a″2

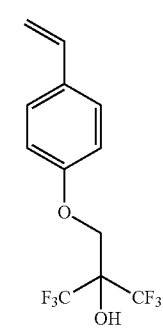

Monomer a″3

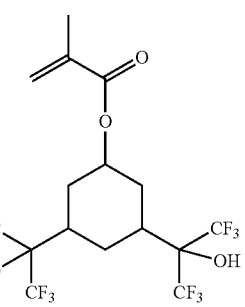

Monomer a″4

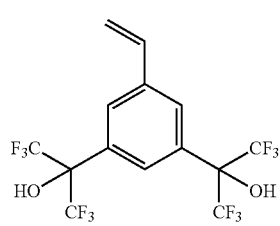

Monomer b″1

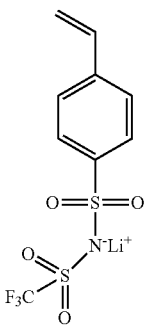

Monomer b″2

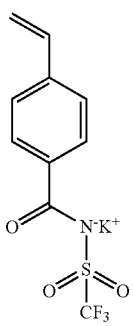

Monomer b″3

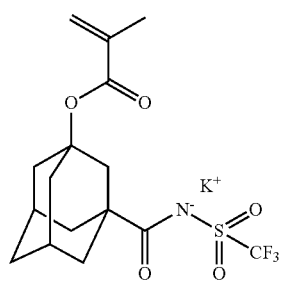

Synthesis Example 1

Under nitrogen atmosphere, to 10 g of methanol stirred at 64° C. was added dropwise over 4 hours a solution containing 1.18 g of Monomer a″1, 1.93 g of Monomer b″1, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours.

Thus, a white polymer was obtained.

The obtained white polymer was dissolved in 100 g of pure water, and the lithium salt was changed to a sulfonimide group by using an ion exchange resin. When the obtained polymer was measured by $^{19}F$, $^{1}H$-NMR and GPC, the following analytical results were obtained.

Weight-average molecular weight (Mw)=19,800
Molecular weight distribution (Mw/Mn)=1.98
This polymer compound is made (Polymer 1).

Polymer 1

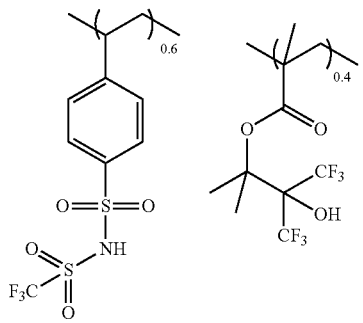

Synthesis Example 2

Under nitrogen atmosphere, to 10 g of methanol stirred at 64° C. was added dropwise over 4 hours a solution containing 1.20 g of Monomer a"2, 1.93 g of Monomer b"1, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the lithium salt was changed to a sulfonimide group by using an ion exchange resin. When the obtained polymer was measured by $^{19}F$, $^{1}H$-NMR and GPC, the following analytical results were obtained.

Weight-average molecular weight (Mw)=23,000
Molecular weight distribution (Mw/Mn)=1.88
This polymer compound is made (Polymer 2).

Polymer 2

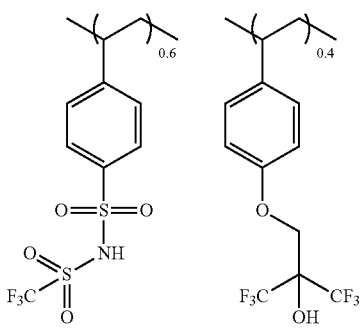

Synthesis Example 3

Under nitrogen atmosphere, to 10 g of methanol stirred at 64° C. was added dropwise over 4 hours a solution containing 2.00 g of Monomer a"3, 1.93 g of Monomer b"1, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the lithium salt was changed to a sulfonimide group by using an ion exchange resin. When the obtained polymer was measured by $^{19}F$, $^{1}H$-NMR and GPC, the following analytical results were obtained.

Weight-average molecular weight (Mw)=20,500
Molecular weight distribution (Mw/Mn)=1.95
This polymer compound is made (Polymer 3).

Polymer 3

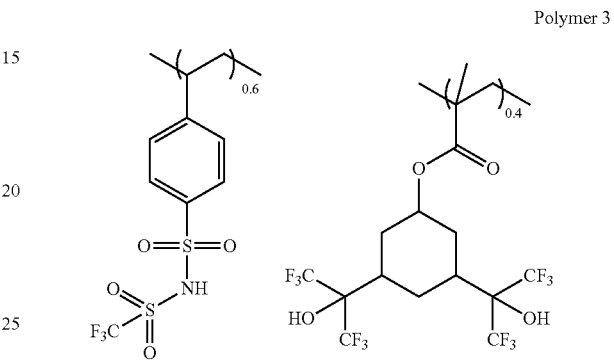

Synthesis Example 41

Under nitrogen atmosphere, to 10 g of methanol stirred at 64° C. was added dropwise over 4 hours a solution containing 1.74 g of Monomer a"4, 1.93 g of Monomer b"1, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the lithium salt was changed to a sulfonimide group by using an ion exchange resin. When the obtained polymer was measured by $^{19}F$, $^{1}H$-NMR and GPC, the following analytical results were obtained.

Weight-average molecular weight (Mw)=20,000
Molecular weight distribution (Mw/Mn)=2.05
This polymer compound is made (Polymer 4).

Polymer 4

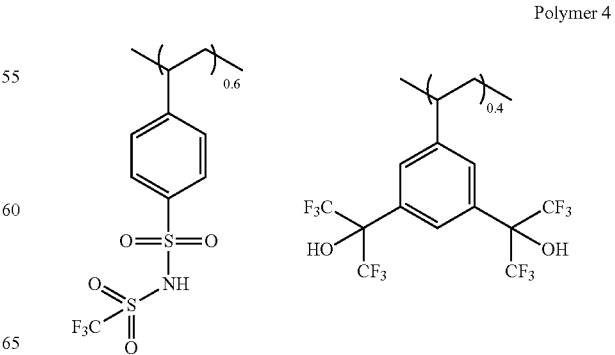

Synthesis Example 5

Under nitrogen atmosphere, to 10 g of methanol stirred at 64° C. was added dropwise over 4 hours a solution containing 1.18 g of Monomer a"1, 1.90 g of Monomer b"2, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the potassium salt was changed to a n-carbonyl-sulfonamide group by using an ion exchange resin. When the obtained polymer was measured by $^{19}F$, $^{1}H$-NMR and GPC, the following analytical results were obtained.

Weight-average molecular weight (Mw)=26,500
Molecular weight distribution (Mw/Mn)=1.53
This polymer compound is made (Polymer 5).

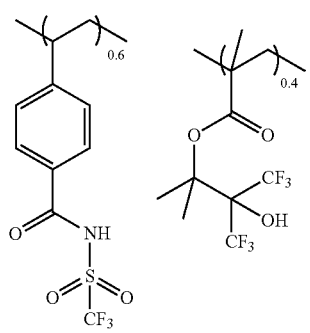

Polymer 5

Synthesis Example 63

Under nitrogen atmosphere, to 10 g of methanol stirred at 64° C. was added dropwise over 4 hours a solution containing 1.20 g of Monomer a"2, 1.90 g of Monomer b"2, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the potassium salt was changed to a n-carbonyl-sulfonamide group by using an ion exchange resin. When the obtained polymer was measured by $^{19}F$, $^{1}H$-NMR and GPC, the following analytical results were obtained.

Weight-average molecular weight (Mw)=27,000
Molecular weight distribution (Mw/Mn)=1.61
This polymer compound is made (Polymer 6).

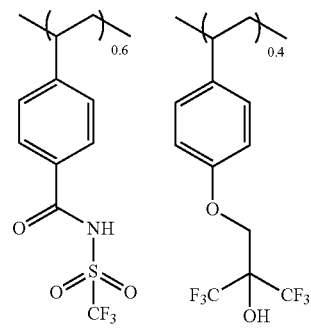

Polymer 6

Synthesis Example 7

Under nitrogen atmosphere, to 10 g of methanol stirred at 64° C. was added dropwise over 4 hours a solution containing 2.00 g of Monomer a"3, 1.90 g of Monomer b"2, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the potassium salt was changed to a n-carbonyl-sulfonamide group by using an ion exchange resin. When the obtained polymer was measured by $^{19}F$, $^{1}H$-NMR and GPC, the following analytical results were obtained.

Weight-average molecular weight (Mw)=27,000
Molecular weight distribution (Mw/Mn)=1.61
This polymer compound is made (Polymer 7).

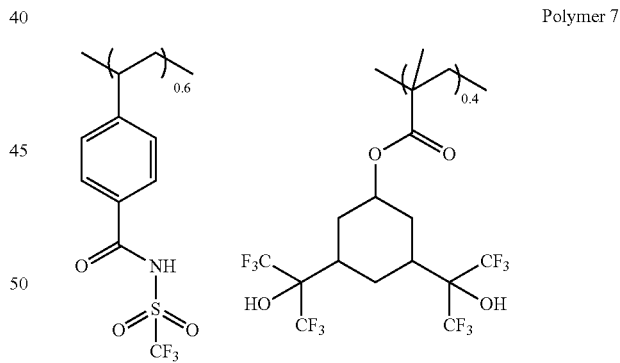

Polymer 7

Synthesis Example 81

Under nitrogen atmosphere, to 10 g of methanol stirred at 64° C. was added dropwise over 4 hours a solution containing 1.74 g of Monomer a"4, 1.90 g of Monomer b"2, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the potassium salt was changed to a n-carbonyl-sulfonamide group by using an ion exchange resin. When the obtained polymer was measured by $^{19}$F, $^{1}$H-NMR and GPC, the following analytical results were obtained.

Weight-average molecular weight (Mw)=29,000
Molecular weight distribution (Mw/Mn)=1.55
This polymer compound is made (Polymer 8).

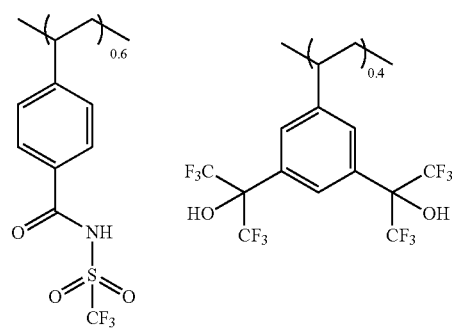

Polymer 8

Synthesis Example 9

Under nitrogen atmosphere, to 10 g of methanol stirred at 64° C. was added dropwise over 4 hours a solution containing 1.18 g of Monomer a"1, 2.60 g of Monomer b"3, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the potassium salt was changed to a n-carbonyl-sulfonamide group by using an ion exchange resin. When the obtained polymer was measured by $^{19}$F, $^{1}$H-NMR and GPC, the following analytical results were obtained.

Weight-average molecular weight (Mw)=27,000
Molecular weight distribution (Mw/Mn)=1.70
This polymer compound is made (Polymer 9).

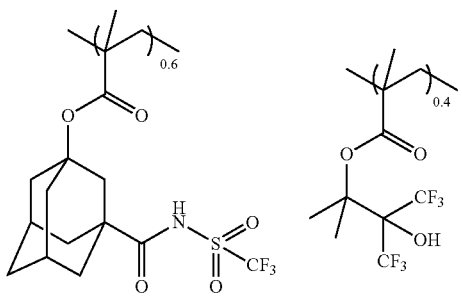

Polymer 9

Synthesis Example 101

Under nitrogen atmosphere, to 10 g of methanol stirred at 64° C. was added dropwise over 4 hours a solution containing 1.20 g of Monomer a"2, 2.60 g of Monomer b"3, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the potassium salt was changed to a n-carbonyl-sulfonamide group by using an ion exchange resin. When the obtained polymer was measured by $^{19}$F, $^{1}$H-NMR and GPC, the following analytical results were obtained.

Weight-average molecular weight (Mw)=29,000
Molecular weight distribution (Mw/Mn)=1.66
This polymer compound is made (Polymer 10).

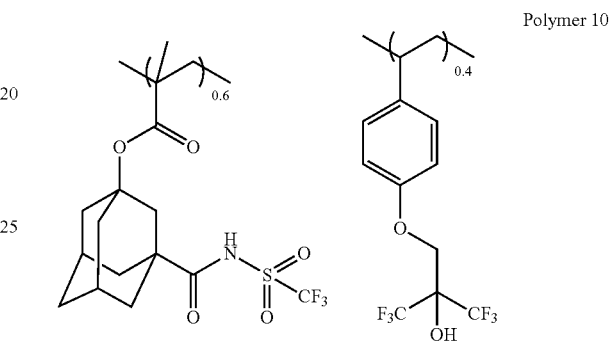

Polymer 10

Synthesis Example 111

Under nitrogen atmosphere, to 10 g of methanol stirred at 64° C. was added dropwise over 4 hours a solution containing 2.00 g of Monomer a"3, 2.60 g of Monomer b"3, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the potassium salt was changed to a n-carbonyl-sulfonamide group by using an ion exchange resin. When the obtained polymer was measured by $^{19}$F, $^{1}$H-NMR and GPC, the following analytical results were obtained.

Weight-average molecular weight (Mw)=29,000
Molecular weight distribution (Mw/Mn)=1.66
This polymer compound is made (Polymer 11).

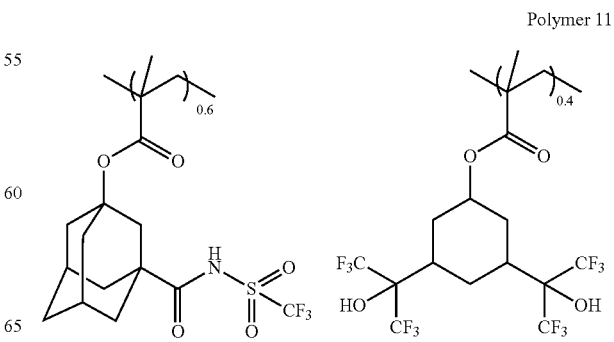

Polymer 11

Synthesis Example 12

Under nitrogen atmosphere, to 10 g of methanol stirred at 64° C. was added dropwise over 4 hours a solution containing 1.74 g of Monomer a″4, 2.60 g of Monomer b″3, and 0.12 g of dimethyl 2,2′-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the potassium salt was changed to a n-carbonyl-sulfonamide group by using an ion exchange resin. When the obtained polymer was measured by $^{19}$F, $^{1}$H-NMR and GPC, the following analytical results were obtained.

Weight-average molecular weight (Mw)=25,500
Molecular weight distribution (Mw/Mn)=1.80
This polymer compound is made (Polymer 12).

Polymer 12

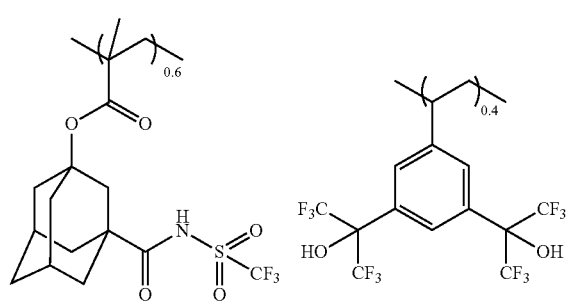

[Preparation of Conductive Polymer Composite Dispersion containing Polythiophene as π-Conjugated Polymer]

Preparation Example 1

3.00 g of 3,4-ethylenedioxythiophene and a solution in which 15.0 g of Polymer 1 had been dissolved in 1,000 mL of ultrapure water were mixed at 30° C. The obtained mixture solution was maintained at 30° C. under stirring. In this state, 6.60 g of sodium persulfate dissolved in 100 mL of ultrapure water and an oxidizing catalyst solution of 1.80 g of ferric sulfate were gradually added thereto and stirred for 4 hours to react these materials. To the obtained reaction solution, 1,000 mL of ultrapure water was added, and about 1,000 mL of the solution was removed by using the ultrafiltration method. This operation was repeated three times. Then, to the processed solution after the filtration treatment, 200 mL of sulfuric acid diluted to 10 mass % and 2,000 mL of ion exchanged water were added. About 2,000 mL of the processed solution was removed by using the ultrafiltration method, and 2,000 mL of ion exchanged water was added thereto. About 2,000 mL of the solution was removed by using the ultrafiltration method. This operation was repeated three times. Further, 2,000 mL of ion exchanged water was added to the obtained processed solution, and about 2,000 mL of the processed solution was removed by using the ultrafiltration method. This operation was repeated five times. The resultant was concentrated to obtain 2.5 mass % of blue-colored Conductive Polymer Composite Dispersion 1.

The ultrafiltration conditions were as follows.
Molecular weight cutoff of ultrafiltration membrane: 30 K
Cross flow type
Flow amount of supplied liquid: 3,000 mL/minute
Membrane partial pressure: 0.12 Pa
Note that the ultrafiltration was carried out under the same conditions in the other Preparation Examples.

Preparation Example 2

Preparation was carried out in the same manner as in Preparation Example 1 except for changing 15.0 g of Dopant Polymer 1 to Dopant Polymer 2, and changing the amount of 3,4-ethylenedioxythiophene blended to 2.98 g, the amount of sodium persulfate blended to 6.55 g, and the amount of ferric sulfate blended to 1.79 g. Thus, Conductive Polymer Composite Dispersion 2 was obtained.

Preparation Example 3

Preparation was carried out in the same manner as in Preparation Example 1 except for changing 15.0 g of Dopant Polymer 1 to Dopant Polymer 3, and changing the amount of 3,4-ethylenedioxythiophene blended to 2.37 g, the amount of sodium persulfate blended to 5.21 g, and the amount of ferric sulfate blended to 1.42 g. Thus, Conductive Polymer Composite Dispersion 3 was obtained.

Preparation Example 4

Preparation was carried out in the same manner as in Preparation Example 1 except for changing 15.0 g of Dopant Polymer 1 to Dopant Polymer 4, and changing the amount of 3,4-ethylenedioxythiophene blended to 2.53 g, the amount of sodium persulfate blended to 5.57 g, and the amount of ferric sulfate blended to 1.52 g. Thus, Conductive Polymer Composite Dispersion 4 was obtained.

Preparation Example 5

Preparation was carried out in the same manner as in Preparation Example 1 except for changing 15.0 g of Dopant Polymer 1 to Dopant Polymer 5, and changing the amount of 3,4-ethylenedioxythiophene blended to 3.23 g, the amount of sodium persulfate blended to 7.11 g, and the amount of ferric sulfate blended to 1.94 g. Thus, Conductive Polymer Composite Dispersion 5 was obtained.

Preparation Example 6

Preparation was carried out in the same manner as in Preparation Example 1 except for changing 15.0 g of Dopant Polymer 1 to Dopant Polymer 6, and changing the amount of 3,4-ethylenedioxythiophene blended to 3.20 g, the amount of sodium persulfate blended to 7.05 g, and the amount of ferric sulfate blended to 1.92 g. Thus, Conductive Polymer Composite Dispersion 6 was obtained.

Preparation Example 7

Preparation was carried out in the same manner as in Preparation Example 1 except for changing 15.0 g of Dopant Polymer 1 to Dopant Polymer 7, and changing the amount of 3,4-ethylenedioxythiophene blended to 2.51 g, the amount of sodium persulfate blended to 5.51 g, and the amount of ferric sulfate blended to 1.50 g. Thus, Conductive Polymer Composite Dispersion 7 was obtained.

Preparation Example 8

Preparation was carried out in the same manner as in Preparation Example 1 except for changing 15.0 g of Dopant Polymer 1 to Dopant Polymer 8, and changing the amount of 3,4-ethylenedioxythiophene blended to 2.69 g, the amount of sodium persulfate blended to 5.93 g, and the amount of ferric sulfate blended to 1.62 g. Thus, Conductive Polymer Composite Dispersion 8 was obtained.

Preparation Example 9

Preparation was carried out in the same manner as in Preparation Example 1 except for changing 15.0 g of Dopant Polymer 1 to Dopant Polymer 9, and changing the amount of 3,4-ethylenedioxythiophene blended to 2.60 g, the amount of sodium persulfate blended to 5.71 g, and the amount of ferric sulfate blended to 1.56 g. Thus, Conductive Polymer Composite Dispersion 9 was obtained.

Preparation Example 10

Preparation was carried out in the same manner as in Preparation Example 1 except for changing 15.0 g of Dopant Polymer 1 to Dopant Polymer 10, and changing the amount of 3,4-ethylenedioxythiophene blended to 2.58 g, the amount of sodium persulfate blended to 5.67 g, and the amount of ferric sulfate blended to 1.55 g. Thus, Conductive Polymer Composite Dispersion 10 was obtained.

Preparation Example 11

Preparation was carried out in the same manner as in Preparation Example 1 except for changing 15.0 g of Dopant Polymer 1 to Dopant Polymer 11, and changing the amount of 3,4-ethylenedioxythiophene blended to 2.11 g, the amount of sodium persulfate blended to 4.63 g, and the amount of ferric sulfate blended to 1.26 g. Thus, Conductive Polymer Composite Dispersion 11 was obtained.

Preparation Example 12

Preparation was carried out in the same manner as in Preparation Example 1 except for changing 15.0 g of Dopant Polymer 1 to Dopant Polymer 12, and changing the amount of 3,4-ethylenedioxythiophene blended to 2.24 g, the amount of sodium persulfate blended to 4.92 g, and the amount of ferric sulfate blended to 1.34 g. Thus, Conductive Polymer Composite Dispersion 12 was obtained.

[Evaluation of Conductive Polymer Composition containing Polythiophene as π-Conjugated Polymer]

Examples 2.5 mass % of one of the conductive polymer composite dispersions obtained in Preparation Examples 1 to 12 was mixed with 10 wt % of PGMEA (propylene glycol monomethyl ether acetate) as an organic solvent (C1) and 5 wt % of EtOH as an organic solvent (C2). Such mixtures were respectively designated as Examples 1 to 12.

2.5 mass % of one of the conductive polymer composite dispersions obtained in Preparation Examples 1 to 12 was mixed with 10 wt % of PGMEA (propylene glycol monomethyl ether acetate) as an organic solvent (C1) and 5 wt % of IPA (2-propanol) as an organic solvent (C2). Such mixtures were respectively designated as Examples 13 to 24.

2.5 mass % of one of the conductive polymer composite dispersions obtained in Preparation Examples 1 to 12 was mixed with 15 wt % of PGMEA (propylene glycol monomethyl ether acetate) as an organic solvent (C1) and 5 wt % of EtOH as an organic solvent (C2). Such mixtures were respectively designated as Examples 25 to 36.

2.5 mass % of one of the conductive polymer composite dispersions obtained in Preparation Examples 1 to 12 was mixed with 15 wt % of PGMEA (propylene glycol monomethyl ether acetate) as an organic solvent (C1) and 5 wt % of IPA (2-propanol) as an organic solvent (C2). Such mixtures were respectively designated as Examples 37 to 48.

2.5 mass % of one of the conductive polymer composite dispersions obtained in Preparation Examples 1 to 12 was mixed with 10 wt % of PGME (propylene glycol monomethyl ether) as an organic solvent (C1) and 5 wt % of EtOH as an organic solvent (C2). Such mixtures were respectively designated as Examples 49 to 60.

2.5 mass % of one of the conductive polymer composite dispersions obtained in Preparation Examples 1 to 12 was mixed with 10 wt % of PGME (propylene glycol monomethyl ether) as an organic solvent (C1) and 5 wt % of IPA (2-propanol) as an organic solvent (C2). Such mixtures were respectively designated as Examples 61 to 72.

2.5 mass % of one of the conductive polymer composite dispersions obtained in Preparation Examples 1 to 12 was mixed with 15 wt % of PGME (propylene glycol monomethyl ether) as an organic solvent (C1) and 5 wt % of EtOH as an organic solvent (C2). Such mixtures were respectively designated as Examples 73 to 84.

2.5 mass % of one of the conductive polymer composite dispersions obtained in Preparation Examples 1 to 12 was mixed with 15 wt % of PGME (propylene glycol monomethyl ether) as an organic solvent (C1) and 5 wt % of IPA (2-propanol) as an organic solvent (C2). Such mixtures were respectively designated as Examples 85 to 96.

One of the compositions of Examples 1 to 96 was mixed with 0.43 mass % of L-(+)-Lysine included in the compound (E) shown by the general formula (5) and a fluoroalkyl-based nonionic surfactant FS-31 (available from DuPont). Then, each mixture was filtered using cellulose filters (manufactured by ADVANTEC Corporation) having a pore size of 3.00 to 0.45 μm. In this manner, conductive polymer compositions were prepared and respectively designated as Examples 97 to 192.

Comparative Examples 2.5 mass % of the conductive polymer composite dispersions obtained in Preparation Examples 1 to 12 were respectively designated as Comparative Examples 1 to 12.

2.5 mass % of one of the conductive polymer composite dispersions obtained in Preparation Examples 1 to 12 was mixed with 0.43 mass % of L-(+)-Lysine included in the compound (E) shown by the general formula (5) and a fluoroalkyl-based nonionic surfactant FS-31 (available from DuPont). Such mixtures were respectively designated as Comparative Examples 13 to 24.

The conductive polymer compositions of Examples and Comparative Examples prepared as described above were evaluated as follows.

(Filterability)

In the preparations of the conductive polymer composite compositions of Examples and Comparative Examples, the filtration was carried out using regenerated cellulose filters having pore sizes of 3.0 to 0.20 μm. In this event, the pore size limits of the filters through which the compositions were successfully filtered and passed are shown in Table 1-1 to Table 1-7.

(Surface Tension)

The surface tension of each composition was measured using a du Nouy surface tensiometer Model D (manufactured by Ito Seisakusho Co., Ltd.). Tables 1-1 to 1-7 show the result.

(Viscosity)

The liquid temperature of each conductive polymer composition was adjusted to 25° C. Then, 35 mL of each composition was weighed into a measurement cell specifically attached to a tuning fork vibration type viscometer SV-10 (manufactured by A&D Company Limited) to measure the viscosity immediately after the preparation. Tables 1-1 to 1-7 show the result.

(pH Measurement)

The pH of each conductive polymer composition was measured using a pH meter D-52 (manufactured by HORIBA, Ltd.). Tables 1-1 to 1-7 show the result.

(Transmittance)

From the refractive index (n, k) at a wavelength of 636 nm measured using a spectroscopic ellipsometer (VASE) with variable incident angle, the transmittance for light beam with a wavelength of 550 nm at FT=200 nm was calculated. Tables 1-1 to 1-7 show the result.

(Conductivity)

Onto a $SiO_2$ wafer having a diameter of 4 inches (100 mm), 1.0 mL of a conductive polymer composition was added dropwise. After 10 seconds, the whole wafer was spin-coated therewith by using a spinner. The spin-coating conditions were so adjusted that the film thickness became 100±5 nm. Baking was carried out in a precise constant temperature oven at 120° C. for 30 minutes to remove the solvent. Thus, a conductive film was obtained.

The conductivity (S/cm) of the obtained conductive film was determined from the actually measured value of the film thickness and the surface resistivity (Q/0) measured by using Hiresta-UP MCP-HT450 and Loresta-GP MCP-T610 (both manufactured by Mitsubishi Chemical Corporation). Tables 1-1 to 1-7 show the result.

(Spray Coater Film Formability)

A 35 mm-square non-alkaline glass substrate was subjected to surface cleaning with $UV/O_3$ for 10 minutes, and coated with one of the conductive polymer compositions by using a spray coater NVD203 (manufactured by Fujimori Technical Laboratory Inc.) to form a film. The coating film surface was observed with an optical microscope and an interference microscope to evaluate whether a continuous film was formed or not. Tables 1-1 to 1-7 show the result.

TABLE 1-1

|  | Filterability (filter pore size limit for passage) | Surface tension (mN/m) | Viscosity (mPa/S) | pH | Transmittance (FT = 200 nm, λ = 550 nm) | Conductivity (S/cm) | Spray-coated film state |
|---|---|---|---|---|---|---|---|
| Example 1 | 0.20 μm | 37.6 | 2.53 | 3.2 | 95% | 2.63E+00 | continuous (flat) |
| Example 2 | 0.20 μm | 37.2 | 2.49 | 3.6 | 98% | 2.00E+00 | continuous (flat) |
| Example 3 | 0.20 μm | 36.9 | 2.53 | 3.5 | 96% | 2.80E+00 | continuous (flat) |
| Example 4 | 0.20 μm | 37.5 | 2.55 | 3.9 | 95% | 1.60E+00 | continuous (flat) |
| Example 5 | 0.20 μm | 37.5 | 2.60 | 3.5 | 98% | 5.55E+00 | continuous (flat) |
| Example 6 | 0.20 μm | 37.1 | 2.58 | 3.8 | 97% | 3.60E+00 | continuous (flat) |
| Example 7 | 0.20 μm | 37.6 | 2.59 | 3.6 | 99% | 3.45E+00 | continuous (flat) |
| Example 8 | 0.20 μm | 37.5 | 2.56 | 3.0 | 98% | 5.25E+00 | continuous (flat) |
| Example 9 | 0.20 μm | 37.9 | 2.48 | 3.5 | 98% | 6.54E+00 | continuous (flat) |
| Example 10 | 0.20 μm | 37.2 | 2.56 | 3.9 | 97% | 4.25E+00 | continuous (flat) |
| Example 11 | 0.20 μm | 36.5 | 2.50 | 3.4 | 96% | 4.44E+00 | continuous (flat) |
| Example 12 | 0.20 μm | 37.1 | 2.65 | 3.5 | 95% | 2.58E+00 | continuous (flat) |
| Example 13 | 0.20 μm | 37.5 | 2.48 | 3.6 | 98% | 6.58E+00 | continuous (flat) |
| Example 14 | 0.20 μm | 37.4 | 2.59 | 3.6 | 94% | 5.14E+00 | continuous (flat) |
| Example 15 | 0.20 μm | 37.6 | 2.50 | 3.5 | 96% | 2.25E+00 | continuous (flat) |
| Example 16 | 0.20 μm | 37.7 | 2.56 | 3.4 | 95% | 3.25E+00 | continuous (flat) |
| Example 17 | 0.20 μm | 38.1 | 2.50 | 3.8 | 98% | 3.56E+00 | continuous (flat) |
| Example 18 | 0.20 μm | 38.0 | 2.53 | 3.5 | 99% | 4.55E+00 | continuous (flat) |
| Example 19 | 0.20 μm | 36.9 | 2.45 | 3.0 | 97% | 5.00E+00 | continuous (flat) |
| Example 20 | 0.20 μm | 37.5 | 2.56 | 3.2 | 95% | 2.65E+00 | continuous (flat) |
| Example 21 | 0.20 μm | 37.6 | 2.51 | 3.5 | 94% | 4.33E+00 | continuous (flat) |
| Example 22 | 0.20 μm | 37.7 | 2.56 | 3.9 | 96% | 3.69E+00 | continuous (flat) |
| Example 23 | 0.20 μm | 38.2 | 2.53 | 3.4 | 96% | 3.85E+00 | continuous (flat) |
| Example 24 | 0.20 μm | 36.2 | 2.48 | 3.5 | 96% | 5.91E+00 | continuous (flat) |
| Example 25 | 0.20 μm | 37.2 | 2.59 | 2.9 | 95% | 2.69E+00 | continuous (flat) |
| Example 26 | 0.20 μm | 37.9 | 2.60 | 2.9 | 98% | 4.68E+00 | continuous (flat) |
| Example 27 | 0.20 μm | 38.0 | 2.56 | 3.4 | 98% | 5.88E+00 | continuous (flat) |
| Example 28 | 0.20 μm | 36.5 | 2.54 | 3.4 | 95% | 4.23E+00 | continuous (flat) |
| Example 29 | 0.20 μm | 37.9 | 2.57 | 2.8 | 92% | 3.25E+00 | continuous (flat) |
| Example 30 | 0.20 μm | 37.0 | 2.66 | 3.9 | 94% | 3.58E+00 | continuous (flat) |
| Example 31 | 0.20 μm | 36.5 | 2.59 | 3.4 | 96% | 4.12E+00 | continuous (flat) |
| Example 32 | 0.20 μm | 37.8 | 2.55 | 3.3 | 95% | 6.25E+00 | continuous (flat) |
| Example 33 | 0.20 μm | 38.0 | 2.56 | 3.5 | 96% | 5.63E+00 | continuous (flat) |
| Example 34 | 0.20 μm | 37.1 | 2.75 | 3.6 | 95% | 6.35E+00 | continuous (flat) |
| Example 35 | 0.20 μm | 36.8 | 2.53 | 3.6 | 98% | 2.58E+00 | continuous (flat) |
| Example 36 | 0.20 μm | 37.5 | 2.48 | 3.9 | 99% | 1.55E+00 | continuous (flat) |

TABLE 1-2

|  | Filterability (filter pore size limit for passage) | Surface tension (mN/m) | Viscosity (mPa/S) | pH | Transmittance (FT = 200 nm, λ = 550 nm) | Conductivity (S/cm) | Spray-coated film state |
| --- | --- | --- | --- | --- | --- | --- | --- |
| Example 37 | 0.20 μm | 37.1 | 2.47 | 3.0 | 96% | 6.55E+00 | continuous (flat) |
| Example 38 | 0.20 μm | 37.5 | 2.59 | 3.2 | 98% | 5.24E+00 | continuous (flat) |
| Example 39 | 0.20 μm | 37.4 | 2.60 | 3.8 | 95% | 4.55E+00 | continuous (flat) |
| Example 40 | 0.20 μm | 37.9 | 2.59 | 3.4 | 97% | 5.69E+00 | continuous (flat) |
| Example 41 | 0.20 μm | 36.9 | 2.60 | 3.6 | 96% | 3.69E+00 | continuous (flat) |
| Example 42 | 0.20 μm | 37.1 | 2.61 | 3.8 | 98% | 3.57E+01 | continuous (flat) |
| Example 43 | 0.20 μm | 37.4 | 2.58 | 3.2 | 95% | 5.15E+00 | continuous (flat) |
| Example 44 | 0.20 μm | 37.5 | 2.50 | 3.0 | 94% | 4.25E+00 | continuous (flat) |
| Example 45 | 0.20 μm | 37.6 | 2.55 | 3.9 | 96% | 6.58E+00 | continuous (flat) |
| Example 46 | 0.20 μm | 37.0 | 2.54 | 3.5 | 98% | 2.54E+00 | continuous (flat) |
| Example 47 | 0.20 μm | 37.1 | 2.51 | 3.1 | 95% | 6.25E+00 | continuous (flat) |
| Example 48 | 0.20 μm | 37.0 | 2.50 | 3.4 | 96% | 6.23E+00 | continuous (flat) |
| Example 49 | 0.20 μm | 37.2 | 2.45 | 3.6 | 98% | 4.85E+00 | continuous (flat) |
| Example 50 | 0.20 μm | 37.6 | 2.56 | 3.5 | 98% | 6.01E+00 | continuous (flat) |
| Example 51 | 0.20 μm | 38.2 | 2.59 | 2.9 | 97% | 3.28E+00 | continuous (flat) |
| Example 52 | 0.20 μm | 38.0 | 2.60 | 3.8 | 95% | 5.00E+00 | continuous (flat) |
| Example 53 | 0.20 μm | 37.4 | 2.63 | 3.1 | 96% | 6.25E+00 | continuous (flat) |
| Example 54 | 0.20 μm | 37.7 | 2.65 | 3.3 | 94% | 4.56E+00 | continuous (flat) |
| Example 55 | 0.20 μm | 37.5 | 2.51 | 3.8 | 93% | 6.25E+00 | continuous (flat) |
| Example 56 | 0.20 μm | 37.6 | 2.54 | 3.2 | 95% | 6.80E+00 | continuous (flat) |
| Example 57 | 0.20 μm | 38.0 | 2.58 | 2.9 | 98% | 2.58E+00 | continuous (flat) |
| Example 58 | 0.20 μm | 36.5 | 2.60 | 2.8 | 95% | 4.98E+00 | continuous (flat) |
| Example 59 | 0.20 μm | 36.8 | 2.53 | 3.5 | 93% | 5.22E+00 | continuous (flat) |
| Example 60 | 0.20 μm | 38.0 | 2.50 | 3.7 | 92% | 4.15E+00 | continuous (flat) |
| Example 61 | 0.20 μm | 37.5 | 2.48 | 3.3 | 95% | 1.89E+00 | continuous (flat) |
| Example 62 | 0.20 μm | 37.1 | 2.47 | 3.5 | 98% | 3.68E+00 | continuous (flat) |
| Example 63 | 0.20 μm | 37.9 | 2.54 | 3.5 | 98% | 5.96E+00 | continuous (flat) |
| Example 64 | 0.20 μm | 38.0 | 2.56 | 3.5 | 97% | 4.69E+00 | continuous (flat) |
| Example 65 | 0.20 μm | 37.9 | 2.45 | 3.5 | 95% | 5.37E+00 | continuous (flat) |
| Example 66 | 0.20 μm | 37.8 | 2.56 | 3.4 | 96% | 2.99E+00 | continuous (flat) |
| Example 67 | 0.20 μm | 38.0 | 2.40 | 3.4 | 95% | 7.89E+00 | continuous (flat) |
| Example 68 | 0.20 μm | 37.5 | 2.42 | 3.4 | 94% | 8.00E+00 | continuous (flat) |
| Example 69 | 0.20 μm | 37.9 | 2.56 | 3.5 | 96% | 5.99E+00 | continuous (flat) |
| Example 70 | 0.20 μm | 37.6 | 2.36 | 3.9 | 96% | 4.82E+00 | continuous (flat) |
| Example 71 | 0.20 μm | 37.4 | 2.59 | 3.5 | 99% | 4.60E+00 | continuous (flat) |
| Example 72 | 0.20 μm | 37.5 | 2.60 | 3.1 | 98% | 5.08E+00 | continuous (flat) |

TABLE 1-3

|  | Filterability (filter pore size limit for passage) | Surface tension (mN/m) | Viscosity (mPa/S) | pH | Transmittance (FT = 200 nm, λ = 550 nm) | Conductivity (S/cm) | Spray-coated film state |
| --- | --- | --- | --- | --- | --- | --- | --- |
| Example 73 | 0.20 μm | 37.0 | 2.48 | 3.8 | 95% | 6.57E+00 | continuous (flat) |
| Example 74 | 0.20 μm | 36.8 | 2.45 | 3.5 | 95% | 4.00E+00 | continuous (flat) |
| Example 75 | 0.20 μm | 36.9 | 2.60 | 3.6 | 97% | 3.56E+00 | continuous (flat) |
| Example 76 | 0.20 μm | 37.8 | 2.59 | 3.1 | 96% | 5.48E+00 | continuous (flat) |
| Example 77 | 0.20 μm | 37.5 | 2.46 | 3.0 | 94% | 1.28E+00 | continuous (flat) |
| Example 78 | 0.20 μm | 37.2 | 2.60 | 2.9 | 95% | 3.99E+00 | continuous (flat) |
| Example 79 | 0.20 μm | 37.1 | 2.51 | 3.8 | 98% | 4.58E+00 | continuous (flat) |
| Example 80 | 0.20 μm | 37.0 | 2.40 | 3.5 | 96% | 5.76E+00 | continuous (flat) |
| Example 81 | 0.20 μm | 38.2 | 2.51 | 3.9 | 92% | 5.48E+00 | continuous (flat) |
| Example 82 | 0.20 μm | 37.8 | 2.59 | 3.4 | 93% | 5.00E+00 | continuous (flat) |
| Example 83 | 0.20 μm | 37.6 | 2.56 | 3.6 | 93% | 4.69E+00 | continuous (flat) |
| Example 84 | 0.20 μm | 37.9 | 2.53 | 3.3 | 95% | 5.74E+00 | continuous (flat) |
| Example 85 | 0.20 μm | 37.5 | 2.45 | 3.3 | 96% | 3.77E+00 | continuous (flat) |
| Example 86 | 0.20 μm | 37.8 | 2.60 | 3.8 | 95% | 2.69E+00 | continuous (flat) |
| Example 87 | 0.20 μm | 37.2 | 2.54 | 3.5 | 93% | 5.89E+00 | continuous (flat) |
| Example 88 | 0.20 μm | 37.1 | 2.46 | 3.6 | 96% | 2.64E+00 | continuous (flat) |
| Example 89 | 0.20 μm | 38.0 | 2.75 | 3.4 | 98% | 3.58E+00 | continuous (flat) |
| Example 90 | 0.20 μm | 37.6 | 2.81 | 3.2 | 95% | 4.21E+00 | continuous (flat) |
| Example 91 | 0.20 μm | 37.8 | 2.67 | 3.9 | 96% | 5.29E+00 | continuous (flat) |
| Example 92 | 0.20 μm | 37.5 | 2.54 | 3.0 | 94% | 6.01E+00 | continuous (flat) |
| Example 93 | 0.20 μm | 37.5 | 2.60 | 3.8 | 95% | 5.26E+00 | continuous (flat) |
| Example 94 | 0.20 μm | 37.4 | 2.45 | 2.9 | 98% | 6.58E+00 | continuous (flat) |
| Example 95 | 0.20 μm | 38.0 | 2.55 | 3.5 | 97% | 4.25E+00 | continuous (flat) |
| Example 96 | 0.20 μm | 38.2 | 2.53 | 3.4 | 97% | 5.69E+00 | continuous (flat) |

TABLE 1-4

| | Filterability (filter pore size limit for passage) | Surface tension (mN/m) | Viscosity (mPa/S) | pH | Transmittance (FT = 200 nm, λ = 550 nm) | Conductivity (S/cm) | Spray-coated film state |
|---|---|---|---|---|---|---|---|
| Example 97 | 0.20 μm | 36.5 | 3.78 | 6.6 | 96% | 2.00E−05 | continuous (flat) |
| Example 98 | 0.20 μm | 36.0 | 3.80 | 6.5 | 98% | 5.63E−05 | continuous (flat) |
| Example 99 | 0.20 μm | 35.9 | 3.76 | 6.2 | 95% | 5.35E−05 | continuous (flat) |
| Example 100 | 0.20 μm | 36.0 | 3.58 | 6.0 | 93% | 6.35E−05 | continuous (flat) |
| Example 101 | 0.20 μm | 36.4 | 3.78 | 6.6 | 96% | 2.54E−05 | continuous (flat) |
| Example 102 | 0.20 μm | 36.5 | 3.72 | 6.5 | 95% | 3.65E−05 | continuous (flat) |
| Example 103 | 0.20 μm | 36.6 | 3.75 | 6.9 | 98% | 1.99E−04 | continuous (flat) |
| Example 104 | 0.20 μm | 36.6 | 3.78 | 6.5 | 95% | 3.65E−05 | continuous (flat) |
| Example 105 | 0.20 μm | 36.5 | 3.80 | 6.7 | 96% | 2.45E−05 | continuous (flat) |
| Example 106 | 0.20 μm | 36.0 | 3.86 | 6.4 | 94% | 1.02E−04 | continuous (flat) |
| Example 107 | 0.20 μm | 36.2 | 3.74 | 6.2 | 95% | 6.32E−05 | continuous (flat) |
| Example 108 | 0.20 μm | 36.1 | 3.80 | 6.0 | 98% | 4.25E−05 | continuous (flat) |
| Example 109 | 0.20 μm | 36.0 | 3.85 | 6.9 | 98% | 6.23E−05 | continuous (flat) |
| Example 110 | 0.20 μm | 36.5 | 3.86 | 6.5 | 95% | 2.56E−05 | continuous (flat) |
| Example 111 | 0.20 μm | 36.2 | 3.79 | 6.6 | 96% | 4.52E−05 | continuous (flat) |
| Example 112 | 0.20 μm | 36.6 | 3.80 | 6.2 | 97% | 3.69E−05 | continuous (flat) |
| Example 113 | 0.20 μm | 36.0 | 3.74 | 6.6 | 93% | 6.52E−05 | continuous (flat) |
| Example 114 | 0.20 μm | 35.8 | 3.80 | 6.4 | 95% | 5.21E−05 | continuous (flat) |
| Example 115 | 0.20 μm | 35.8 | 3.86 | 6.3 | 96% | 4.29E−05 | continuous (flat) |
| Example 116 | 0.20 μm | 36.0 | 3.79 | 6.0 | 93% | 6.32E−05 | continuous (flat) |
| Example 117 | 0.20 μm | 35.2 | 3.75 | 6.2 | 95% | 5.26E−05 | continuous (flat) |
| Example 118 | 0.20 μm | 35.6 | 3.74 | 6.5 | 96% | 2.65E−04 | continuous (flat) |
| Example 119 | 0.20 μm | 35.4 | 3.80 | 6.9 | 94% | 3.65E−05 | continuous (flat) |
| Example 120 | 0.20 μm | 35.9 | 3.89 | 6.0 | 98% | 3.35E−05 | continuous (flat) |
| Example 121 | 0.20 μm | 36.0 | 3.86 | 6.5 | 95% | 3.24E−05 | continuous (flat) |
| Example 122 | 0.20 μm | 36.2 | 3.76 | 6.6 | 96% | 2.56E−05 | continuous (flat) |
| Example 123 | 0.20 μm | 36.4 | 3.79 | 6.3 | 94% | 4.25E−05 | continuous (flat) |
| Example 124 | 0.20 μm | 36.5 | 3.80 | 6.1 | 97% | 4.00E−05 | continuous (flat) |
| Example 125 | 0.20 μm | 35.6 | 3.90 | 6.5 | 97% | 2.65E−05 | continuous (flat) |
| Example 126 | 0.20 μm | 35.8 | 3.85 | 6.8 | 95% | 5.63E−05 | continuous (flat) |
| Example 127 | 0.20 μm | 35.9 | 3.86 | 6.9 | 95% | 2.25E−05 | continuous (flat) |
| Example 128 | 0.20 μm | 36.0 | 3.79 | 6.5 | 96% | 3.69E−05 | continuous (flat) |
| Example 129 | 0.20 μm | 35.0 | 3.86 | 6.4 | 94% | 3.57E−05 | continuous (flat) |
| Example 130 | 0.20 μm | 35.0 | 3.80 | 6.5 | 95% | 3.56E−05 | continuous (flat) |
| Example 131 | 0.20 μm | 36.0 | 3.84 | 6.7 | 98% | 1.25E−05 | continuous (flat) |
| Example 132 | 0.20 μm | 36.2 | 3.95 | 6.7 | 96% | 6.23E−05 | continuous (flat) |

TABLE 1-5

| | Filterability (filter pore size limit for passage) | Surface tension (mN/m) | Viscosity (mPa/S) | pH | Transmittance (FT = 200 nm, λ = 550 nm) | Conductivity (S/cm) | Spray-coated film state |
|---|---|---|---|---|---|---|---|
| Example 133 | 0.20 μm | 35.8 | 3.86 | 6.3 | 92% | 5.24E−05 | continuous (flat) |
| Example 134 | 0.20 μm | 35.9 | 3.86 | 6.0 | 93% | 5.32E−05 | continuous (flat) |
| Example 135 | 0.20 μm | 36.0 | 3.86 | 6.2 | 95% | 6.36E−05 | continuous (flat) |
| Example 136 | 0.20 μm | 35.4 | 3.84 | 6.5 | 96% | 1.95E−04 | continuous (flat) |
| Example 137 | 0.20 μm | 35.2 | 3.90 | 6.9 | 91% | 2.51E−05 | continuous (flat) |
| Example 138 | 0.20 μm | 35.6 | 3.85 | 6.4 | 95% | 2.03E−05 | continuous (flat) |
| Example 139 | 0.20 μm | 35.4 | 3.67 | 6.5 | 94% | 3.60E−05 | continuous (flat) |
| Example 140 | 0.20 μm | 36.0 | 3.84 | 6.2 | 95% | 2.01E−04 | continuous (flat) |
| Example 141 | 0.20 μm | 36.2 | 3.75 | 6.2 | 96% | 5.24E−05 | continuous (flat) |
| Example 142 | 0.20 μm | 35.9 | 3.78 | 6.6 | 95% | 6.53E−05 | continuous (flat) |
| Example 143 | 0.20 μm | 35.6 | 3.90 | 6.9 | 92% | 6.25E−05 | continuous (flat) |
| Example 144 | 0.20 μm | 36.5 | 3.58 | 6.6 | 98% | 5.24E−05 | continuous (flat) |
| Example 145 | 0.20 μm | 36.2 | 3.68 | 6.4 | 94% | 6.25E−05 | continuous (flat) |
| Example 146 | 0.20 μm | 36.0 | 3.85 | 6.6 | 96% | 4.21E−05 | continuous (flat) |
| Example 147 | 0.20 μm | 36.4 | 3.86 | 6.2 | 92% | 1.11E−04 | continuous (flat) |
| Example 148 | 0.20 μm | 35.5 | 3.85 | 6.0 | 91% | 3.36E−05 | continuous (flat) |
| Example 149 | 0.20 μm | 35.6 | 3.95 | 6.2 | 95% | 5.24E−05 | continuous (flat) |
| Example 150 | 0.20 μm | 36.0 | 3.60 | 6.3 | 98% | 5.96E−05 | continuous (flat) |
| Example 151 | 0.20 μm | 34.0 | 3.58 | 6.9 | 95% | 4.53E−05 | continuous (flat) |
| Example 152 | 0.20 μm | 34.0 | 3.86 | 6.0 | 96% | 6.35E−05 | continuous (flat) |
| Example 153 | 0.20 μm | 34.8 | 3.89 | 6.8 | 98% | 3.33E−05 | continuous (flat) |
| Example 154 | 0.20 μm | 34.6 | 3.80 | 6.6 | 96% | 3.52E−05 | continuous (flat) |
| Example 155 | 0.20 μm | 34.5 | 3.86 | 6.6 | 94% | 2.40E−05 | continuous (flat) |
| Example 156 | 0.20 μm | 34.6 | 3.75 | 6.4 | 95% | 3.56E−05 | continuous (flat) |
| Example 157 | 0.20 μm | 35.0 | 3.86 | 6.5 | 96% | 4.25E−05 | continuous (flat) |
| Example 158 | 0.20 μm | 35.3 | 3.90 | 6.8 | 95% | 5.25E−05 | continuous (flat) |
| Example 159 | 0.20 μm | 35.6 | 3.85 | 6.5 | 95% | 4.44E−05 | continuous (flat) |
| Example 160 | 0.20 μm | 35.4 | 3.84 | 6.2 | 97% | 2.60E−05 | continuous (flat) |
| Example 161 | 0.20 μm | 36.2 | 3.80 | 6.5 | 98% | 5.26E−05 | continuous (flat) |

TABLE 1-5-continued

|  | Filterability (filter pore size limit for passage) | Surface tension (mN/m) | Viscosity (mPa/S) | pH | Transmittance (FT = 200 nm, λ = 550 nm) | Conductivity (S/cm) | Spray-coated film state |
|---|---|---|---|---|---|---|---|
| Example 162 | 0.20 μm | 35.0 | 3.69 | 6.5 | 99% | 7.52E−05 | continuous (flat) |
| Example 163 | 0.20 μm | 34.6 | 3.89 | 6.3 | 96% | 5.15E−05 | continuous (flat) |
| Example 164 | 0.20 μm | 34.5 | 3.96 | 6.5 | 94% | 2.22E−05 | continuous (flat) |
| Example 165 | 0.20 μm | 35.0 | 3.85 | 6.9 | 92% | 3.56E−05 | continuous (flat) |
| Example 166 | 0.20 μm | 36.0 | 3.90 | 6.5 | 96% | 3.21E−05 | continuous (flat) |
| Example 167 | 0.20 μm | 35.0 | 3.84 | 6.6 | 95% | 2.00E−05 | continuous (flat) |
| Example 168 | 0.20 μm | 34.5 | 3.78 | 6.0 | 93% | 5.36E−05 | continuous (flat) |

TABLE 1-6

|  | Filterability (filter pore size limit for passage) | Surface tension (mN/m) | Viscosity (mPa/S) | pH | Transmittance (FT = 200 nm, λ = 550 nm) | Conductivity (S/cm) | Spray-coated film state |
|---|---|---|---|---|---|---|---|
| Example 169 | 0.20 μm | 35.6 | 3.75 | 6.2 | 95% | 5.98E−05 | continuous (flat) |
| Example 170 | 0.20 μm | 35.0 | 3.86 | 6.6 | 95% | 5.00E−05 | continuous (flat) |
| Example 171 | 0.20 μm | 34.2 | 3.86 | 6.2 | 96% | 6.15E−05 | continuous (flat) |
| Example 172 | 0.20 μm | 35.0 | 3.81 | 6.5 | 94% | 4.26E−05 | continuous (flat) |
| Example 173 | 0.20 μm | 35.5 | 3.95 | 6.3 | 96% | 5.21E−05 | continuous (flat) |
| Example 174 | 0.20 μm | 36.1 | 3.85 | 6.5 | 91% | 1.33E−04 | continuous (flat) |
| Example 175 | 0.20 μm | 36.5 | 3.91 | 6.4 | 95% | 2.96E−05 | continuous (flat) |
| Example 176 | 0.20 μm | 34.4 | 3.84 | 6.9 | 93% | 4.85E−05 | continuous (flat) |
| Example 177 | 0.20 μm | 35.9 | 3.96 | 6.2 | 98% | 5.88E−05 | continuous (flat) |
| Example 178 | 0.20 μm | 34.2 | 3.58 | 6.6 | 95% | 3.66E−05 | continuous (flat) |
| Example 179 | 0.20 μm | 34.4 | 3.86 | 6.5 | 96% | 2.60E−05 | continuous (flat) |
| Example 180 | 0.20 μm | 35.0 | 3.75 | 6.2 | 97% | 4.25E−05 | continuous (flat) |
| Example 181 | 0.20 μm | 34.5 | 3.84 | 6.5 | 99% | 3.66E−05 | continuous (flat) |
| Example 182 | 0.20 μm | 34.2 | 3.80 | 6.9 | 96% | 3.57E−05 | continuous (flat) |
| Example 183 | 0.20 μm | 34.6 | 3.75 | 6.4 | 96% | 5.15E−05 | continuous (flat) |
| Example 184 | 0.20 μm | 34.0 | 3.90 | 6.5 | 95% | 6.26E−05 | continuous (flat) |
| Example 185 | 0.20 μm | 35.2 | 3.96 | 6.2 | 94% | 1.26E−04 | continuous (flat) |
| Example 186 | 0.20 μm | 35.0 | 3.95 | 6.3 | 97% | 2.36E−04 | continuous (flat) |
| Example 187 | 0.20 μm | 34.6 | 3.85 | 6.5 | 97% | 3.33E−05 | continuous (flat) |
| Example 188 | 0.20 μm | 35.2 | 3.81 | 6.9 | 98% | 3.58E−05 | continuous (flat) |
| Example 189 | 0.20 μm | 34.1 | 3.95 | 6.9 | 95% | 5.96E−05 | continuous (flat) |
| Example 190 | 0.20 μm | 34.0 | 3.91 | 6.2 | 96% | 2.45E−05 | continuous (flat) |
| Example 191 | 0.20 μm | 34.9 | 3.79 | 6.0 | 91% | 5.55E−05 | continuous (flat) |
| Example 192 | 0.20 μm | 34.5 | 3.82 | 6.3 | 94% | 6.25E−05 | continuous (flat) |

TABLE 1-7

|  | Filterability (filter pore size limit for passage) | Surface tension (mN/m) | Viscosity (mPa/S) | pH | Transmittance (FT = 200 nm, λ = 550 nm) | Conductivity (S/cm) | Spray-coated film state |
|---|---|---|---|---|---|---|---|
| Comparative Example 1 | 0.45 μm | 58.2 | 2.80 | 2.8 | 93% | 3.65E+00 | droplet marks, sea-island structure |
| Comparative Example 2 | 0.45 μm | 56.1 | 2.85 | 2.6 | 93% | 4.55E+00 | droplet marks, sea-island structure |
| Comparative Example 3 | 0.45 μm | 57.2 | 2.95 | 2.5 | 93% | 6.25E+00 | droplet marks, sea-island structure |
| Comparative Example 4 | 0.45 μm | 57.0 | 2.96 | 2.9 | 95% | 4.58E+00 | droplet marks, sea-island structure |
| Comparative Example 5 | 0.45 μm | 56.2 | 2.96 | 2.4 | 94% | 9.00E+00 | droplet marks, sea-island structure |
| Comparative Example 6 | 0.45 μm | 58.0 | 2.85 | 2.8 | 96% | 2.22E+00 | droplet marks, sea-island structure |
| Comparative Example 7 | 0.45 μm | 54.6 | 2.80 | 2.6 | 98% | 2.48E+00 | droplet marks, sea-island structure |
| Comparative Example 8 | 0.45 μm | 55.0 | 2.75 | 2.3 | 95% | 8.56E+00 | droplet marks, sea-island structure |
| Comparative Example 9 | 0.45 μm | 59.0 | 2.95 | 2.3 | 92% | 7.56E+00 | droplet marks, sea-island structure |
| Comparative Example 10 | 0.45 μm | 56.8 | 2.84 | 2.5 | 95% | 5.66E+00 | droplet marks, sea-island structure |
| Comparative Example 11 | 0.45 μm | 57.0 | 2.72 | 2.6 | 96% | 5.41E+00 | droplet marks, sea-island structure |
| Comparative Example 12 | 0.45 μm | 54.3 | 2.86 | 2.8 | 97% | 7.62E+00 | droplet marks, sea-island structure |

TABLE 1-7-continued

| | Filterability (filter pore size limit for passage) | Surface tension (mN/m) | Viscosity (mPa/S) | pH | Transmittance (FT = 200 nm, λ = 550 nm) | Conductivity (S/cm) | Spray-coated film state |
|---|---|---|---|---|---|---|---|
| Comparative Example 13 | 0.45 μm | 54.5 | 3.23 | 6.5 | 95% | 5.68E−05 | partial film, spotted |
| Comparative Example 14 | 0.45 μm | 55.0 | 3.33 | 6.3 | 96% | 1.95E−04 | partial film, spotted |
| Comparative Example 15 | 0.45 μm | 56.5 | 3.55 | 6.4 | 94% | 8.88E−05 | partial film, spotted |
| Comparative Example 16 | 0.45 μm | 58.1 | 3.26 | 6.5 | 98% | 8.96E−05 | partial film, spotted |
| Comparative Example 17 | 0.45 μm | 57.9 | 3.45 | 6.1 | 92% | 7.58E−05 | partial film, spotted |
| Comparative Example 18 | 0.45 μm | 57.2 | 3.26 | 6.4 | 95% | 1.69E−04 | partial film, spotted |
| Comparative Example 19 | 0.45 μm | 55.6 | 3.44 | 6.9 | 96% | 9.59E−05 | partial film, spotted |
| Comparative Example 20 | 0.45 μm | 54.9 | 3.53 | 6.9 | 95% | 5.69E−05 | partial film, spotted |
| Comparative Example 21 | 0.45 μm | 55.5 | 3.50 | 6.6 | 94% | 1.59E−04 | partial film, spotted |
| Comparative Example 22 | 0.45 μm | 56.0 | 3.85 | 6.7 | 96% | 8.66E−05 | partial film, spotted |
| Comparative Example 23 | 0.45 μm | 57.2 | 3.67 | 6.2 | 95% | 9.56E−05 | partial film, spotted |
| Comparative Example 24 | 0.45 μm | 55.6 | 3.43 | 6.0 | 98% | 8.45E−05 | partial film, spotted |

As shown in Tables 1-1 to 1-7, by the conductive compositions of Examples 1 to 96 in each of which the composite of the π-conjugated polymer (A) and the polymer (B) shown by the general formula (1) prepared by copolymerizing a monomer having a fluoroalcohol group with a monomer having a fluorosulfonimide group or a n-carbonyl-fluoro-sulfonamide group was dispersed in $H_2O$ (D) and mixed with the water-soluble organic solvent (C) lower surface tensions and viscosities were achieved than those of Comparative Examples 1 to 12, and the filtration pore size limits were as small as 0.20 μm.

Moreover, regarding pH, transmittance, and conductivity, the performances were not degraded by adding the water-soluble organic solvents (C). Meanwhile, in the coating test with a spray coater, continuous films (flat films) were formed on the substrates in Examples 1 to 96; in contrast, in Comparative Examples 1 to 12, only sea-island structures attributable to the droplets, or partial films, which did not completely cover the substrates, were formed.

Similarly, in Examples 97 to 192, which are the compositions obtained by adding the nonionic surfactant and the compound shown by the general formula (5) as the component (E) to Examples 1 to 96, the surface tensions were lower than those of Comparative Examples 13 to 24, and the filtration pore size limits were as small as 0.20 μm. Further, the pH, transmittance, and conductivity were not influenced by adding the water-soluble organic solvents (C). Furthermore, in the coating test with a spray coater, continuous films (flat films) were formed on the substrates in Examples 97 to 192; in contrast, in Comparative Examples 13 to 24, only sea-island structures attributable to the droplets, or partial films, which did not completely cover the substrates, were formed.

The conductive compositions of Examples 1 to 192 and Comparative Examples 1 to 24 were each mounted as a hole injection layer in an organic EL device. The percentage of luminance decrease in each device was measured.

The conductive composition of Example 1 was applied to a washed glass substrate with ITO by spray coating to have a film thickness of 100 nm. α-NPD (diphenylnaphthyl-diamine) was stacked thereon as a hole transport layer by vapor deposition to have a film thickness of 80 nm. Then, as a light emitting layer, $Alq_3$ (tris(8-hydroxyquinoline)aluminum) complex was vapor-deposited to have a film thickness of 35 nm, and 8-Liq (8-hydroxyquinolinolato-lithium) was vapor-deposited thereon to have a film thickness of 30 nm. An electrode made of an alloy in which magnesium and silver had been mixed was formed thereon to have a film thickness of 100 nm. Thus, an organic EL device was obtained. This device was caused to continuously emit light under high load conditions with a fixed current density of 20 $mA/cm^2$ to measure an elapsed time until the luminance became 70% of the initial luminance. Table 2-1 to Table 2-7 show this result and others.

TABLE 2-1

| | Elapsed time (h) until 70% of initial luminance |
|---|---|
| Example 1 | 3652 |
| Example 2 | 3222 |
| Example 3 | 3620 |
| Example 4 | 3752 |
| Example 5 | 3522 |
| Example 6 | 3002 |
| Example 7 | 3541 |
| Example 8 | 3956 |
| Example 9 | 3201 |
| Example 10 | 3300 |
| Example 11 | 3526 |
| Example 12 | 3652 |
| Example 13 | 3002 |
| Example 14 | 3452 |
| Example 15 | 3125 |
| Example 16 | 3256 |
| Example 17 | 3953 |
| Example 18 | 3485 |
| Example 19 | 3258 |
| Example 20 | 3326 |
| Example 21 | 3652 |
| Example 22 | 3156 |
| Example 23 | 3856 |
| Example 24 | 3495 |
| Example 25 | 3691 |

TABLE 2-1-continued

| | Elapsed time (h) until 70% of initial luminance |
|---|---|
| Example 26 | 3548 |
| Example 27 | 3625 |
| Example 28 | 3452 |
| Example 29 | 3158 |
| Example 30 | 3459 |
| Example 31 | 3326 |
| Example 32 | 3956 |
| Example 33 | 3452 |
| Example 34 | 3156 |
| Example 35 | 3258 |
| Example 36 | 3245 |

TABLE 2-2

| | Elapsed time (h) until 70% of initial luminance |
|---|---|
| Example 37 | 3752 |
| Example 38 | 3157 |
| Example 39 | 3615 |
| Example 40 | 3687 |
| Example 41 | 3196 |
| Example 42 | 3462 |
| Example 43 | 3222 |
| Example 44 | 3152 |
| Example 45 | 3020 |
| Example 46 | 3265 |
| Example 47 | 3125 |
| Example 48 | 3291 |
| Example 49 | 3029 |
| Example 50 | 3521 |
| Example 51 | 3425 |
| Example 52 | 3933 |
| Example 53 | 3156 |
| Example 54 | 3625 |
| Example 55 | 3144 |
| Example 56 | 3203 |
| Example 57 | 3008 |
| Example 58 | 3562 |
| Example 59 | 3412 |
| Example 60 | 3025 |
| Example 61 | 3692 |
| Example 62 | 3334 |
| Example 63 | 3526 |
| Example 64 | 3456 |
| Example 65 | 3152 |
| Example 66 | 3625 |
| Example 67 | 3200 |
| Example 68 | 3254 |
| Example 69 | 3695 |
| Example 70 | 3156 |
| Example 71 | 3753 |
| Example 72 | 3426 |

TABLE 2-3

| | Elapsed time (h) until 70% of initial luminance |
|---|---|
| Example 73 | 3521 |
| Example 74 | 3265 |
| Example 75 | 3758 |
| Example 76 | 3884 |
| Example 77 | 3695 |
| Example 78 | 3215 |
| Example 79 | 3029 |
| Example 80 | 3652 |
| Example 81 | 3485 |
| Example 82 | 3659 |
| Example 83 | 3475 |
| Example 84 | 2956 |
| Example 85 | 3416 |

TABLE 2-3-continued

| | Elapsed time (h) until 70% of initial luminance |
|---|---|
| Example 86 | 3865 |
| Example 87 | 3602 |
| Example 88 | 3330 |
| Example 89 | 3752 |
| Example 90 | 3451 |
| Example 91 | 3620 |
| Example 92 | 3221 |
| Example 93 | 3852 |
| Example 94 | 3456 |
| Example 95 | 3128 |
| Example 96 | 3681 |

TABLE 2-4

| | Elapsed time (h) until 70% of initial luminance |
|---|---|
| Example 97 | 5532 |
| Example 98 | 5648 |
| Example 99 | 5596 |
| Example 100 | 5965 |
| Example 101 | 5488 |
| Example 102 | 5185 |
| Example 103 | 5699 |
| Example 104 | 5648 |
| Example 105 | 5548 |
| Example 106 | 5725 |
| Example 107 | 5523 |
| Example 108 | 5426 |
| Example 109 | 4958 |
| Example 110 | 5326 |
| Example 111 | 5965 |
| Example 112 | 5482 |
| Example 113 | 5328 |
| Example 114 | 5563 |
| Example 115 | 5585 |
| Example 116 | 5496 |
| Example 117 | 5185 |
| Example 118 | 5369 |
| Example 119 | 5548 |
| Example 120 | 5693 |
| Example 121 | 5994 |
| Example 122 | 6000 |
| Example 123 | 5156 |
| Example 124 | 5758 |
| Example 125 | 5863 |
| Example 126 | 5648 |
| Example 127 | 5773 |
| Example 128 | 5265 |
| Example 129 | 5913 |
| Example 130 | 5025 |
| Example 131 | 5986 |
| Example 132 | 5700 |

TABLE 2-5

| | Elapsed time (h) until 70% of initial luminance |
|---|---|
| Example 133 | 5985 |
| Example 134 | 5468 |
| Example 135 | 5695 |
| Example 136 | 5486 |
| Example 137 | 5862 |
| Example 138 | 5252 |
| Example 139 | 5699 |
| Example 140 | 5846 |
| Example 141 | 5832 |
| Example 142 | 5622 |
| Example 143 | 5776 |
| Example 144 | 5158 |
| Example 145 | 5777 |

TABLE 2-5-continued

| | Elapsed time (h) until 70% of initial luminance |
|---|---|
| Example 146 | 5631 |
| Example 147 | 5896 |
| Example 148 | 5882 |
| Example 149 | 5469 |
| Example 150 | 5639 |
| Example 151 | 5863 |
| Example 152 | 5489 |
| Example 153 | 5963 |
| Example 154 | 5984 |
| Example 155 | 5936 |
| Example 156 | 5388 |
| Example 157 | 5999 |
| Example 158 | 5699 |
| Example 159 | 5747 |
| Example 160 | 5638 |
| Example 161 | 5948 |
| Example 162 | 5658 |
| Example 163 | 5965 |
| Example 164 | 5545 |
| Example 165 | 5632 |
| Example 166 | 5620 |
| Example 167 | 6021 |
| Example 168 | 5698 |

TABLE 2-6

| | Elapsed time (h) until 70% of initial luminance |
|---|---|
| Example 169 | 5969 |
| Example 170 | 5325 |
| Example 171 | 5765 |
| Example 172 | 5693 |
| Example 173 | 5956 |
| Example 174 | 5693 |
| Example 175 | 5485 |
| Example 176 | 5446 |
| Example 177 | 5632 |
| Example 178 | 5693 |
| Example 179 | 5956 |
| Example 180 | 5485 |
| Example 181 | 5858 |
| Example 182 | 5756 |
| Example 183 | 5265 |
| Example 184 | 5158 |
| Example 185 | 5969 |
| Example 186 | 5485 |
| Example 187 | 5626 |
| Example 188 | 5856 |
| Example 189 | 5485 |
| Example 190 | 5556 |
| Example 191 | 5639 |
| Example 192 | 5784 |

TABLE 2-7

| | Elapsed time (h) until 70% of initial luminance |
|---|---|
| Comparative Example 1 | unmeasurable (partial light emission, non-uniform light emission) |
| Comparative Example 2 | unmeasurable (partial light emission, non-uniform light emission) |
| Comparative Example 3 | unmeasurable (partial light emission, non-uniform light emission) |
| Comparative Example 4 | unmeasurable (partial light emission, non-uniform light emission) |
| Comparative Example 5 | unmeasurable (partial light emission, non-uniform light emission) |
| Comparative Example 6 | unmeasurable (partial light emission, non-uniform light emission) |
| Comparative Example 7 | unmeasurable (partial light emission, non-uniform light emission) |

TABLE 2-7-continued

| | Elapsed time (h) until 70% of initial luminance |
|---|---|
| Comparative Example 8 | unmeasurable (partial light emission, non-uniform light emission) |
| Comparative Example 9 | unmeasurable (partial light emission, non-uniform light emission) |
| Comparative Example 10 | unmeasurable (partial light emission, non-uniform light emission) |
| Comparative Example 11 | unmeasurable (partial light emission, non-uniform light emission) |
| Comparative Example 12 | unmeasurable (partial light emission, non-uniform light emission) |
| Comparative Example 13 | unmeasurable (partial light emission, non-uniform light emission) |
| Comparative Example 14 | unmeasurable (partial light emission, non-uniform light emission) |
| Comparative Example 15 | unmeasurable (partial light emission, non-uniform light emission) |
| Comparative Example 16 | unmeasurable (partial light emission, non-uniform light emission) |
| Comparative Example 17 | unmeasurable (partial light emission, non-uniform light emission) |
| Comparative Example 18 | unmeasurable (partial light emission, non-uniform light emission) |
| Comparative Example 19 | unmeasurable (partial light emission, non-uniform light emission) |
| Comparative Example 20 | unmeasurable (partial light emission, non-uniform light emission) |
| Comparative Example 21 | unmeasurable (partial light emission, non-uniform light emission) |
| Comparative Example 22 | unmeasurable (partial light emission, non-uniform light emission) |
| Comparative Example 23 | unmeasurable (partial light emission, non-uniform light emission) |
| Comparative Example 24 | unmeasurable (partial light emission, non-uniform light emission) |

As in the cases of the continuous films (flat films) formed on the glass substrates by using a spray coater as shown in Tables 1-1 to 1-7, continuous films (flat) were formed on the glass substrates with ITO by the conductive compositions of Examples 1 to 192 in each of which the composite of the π-conjugated polymer (A) and the polymer (B) shown by the general formula (1) prepared by copolymerizing a monomer having a fluoroalcohol group with a monomer having a fluorosulfonimide group or a n-carbonyl-fluoro-sulfonamide group was dispersed in $H_2O$ (D) and mixed with the water-soluble organic solvent (C). Further, the organic EL devices in which these films were mounted as the hole injection layers emitted uniform light, and the evaluation results of the percentage of luminance decrease (device lifetime) were obtained as shown in Tables 2-1 to 2-7. In Examples 1 to 96, since the compound (E) was not added, the $H^+$ diffusion from the films to adjacent layers was less suppressed, and the percentages of luminance decrease (device lifetime) were less favorable than Examples 97 to 192, but the organic EL devices emitted uniform light. In contrast, by Comparative Examples 1 to 24, continuous films (flat) were not formed on the glass substrates with ITO, either, as in the cases of the incomplete coating on the glass substrates by using a spray coater as shown in Tables 1-1 to 1-7. The resulting organic EL devices only exhibited partial light emission or non-uniform light emission, and did not emit uniform light. Since uniform light was not emitted from the entire film surfaces, it was impossible to measure the percentage of luminance decrease.

As described above, it was clarified that: the inventive conductive polymer compositions have favorable filterability and high continuous film formability on inorganic and organic substrates even when a spray-type printer, such as a spray coater or inkjet, is used; the inventive conductive polymer compositions are capable of forming transparent conductive films having favorable injection efficiency and appropriate conductivity as a hole injection layer. Moreover, in the component (B), the repeating unit b1 or b2 containing an acidic group is copolymerized with the monomer "a" having a fluoroalcohol group with no acidic group. Thus, the use of this polymer as a dopant to form a composite with (A) improves the efficiency of eliminating residual moisture in the formed film, and decreases extra non-doping sulfonated terminals, consequently decreasing the $H^+$ generation. When the inventive conductive polymer compositions are employed as constituent films of thin film-stacked devices, it is possible to suppress the influence of $H^+$ on other constituent layers. Further, adding the compound (E) can reduce the influence of $H^+$ on other constituent layers. Such conductive polymer compositions are revealed to have favorable affinity to highly hydrophobic organic and inorganic substrates and have favorable film formability on both types of the substrates with spray-type printers, such as a spray coater and inkjet.

Furthermore, the conductive films formed from such conductive polymer compositions are excellent in conductivity, hole injection efficiency, transparency, etc., and can reduce moisture volatilization from the films, aggregation, and so forth even when employed as constituent films of thin film-stacked devices. Thus, the conductive films are capable of effectively functioning as hole injection layers of the thin film-stacked devices.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:
1. A conductive polymer composition which comprises:
    a composite comprising
        a π-conjugated polymer (A), and
        a polymer (B) shown by the following general formula (1);
    $H_2O$ (D) for dispersing the composite; and
    a water-soluble organic solvent (C), wherein the component (C) comprises an organic solvent (C1) having a boiling point of 120° C. or more and an organic solvent (C2) having a boiling point of less than 120° C. such that $1.0$ wt % $\leq (C1)+(C2) \leq 50.0$ wt % is satisfied relative to a total of the components (A), (B), and (D),

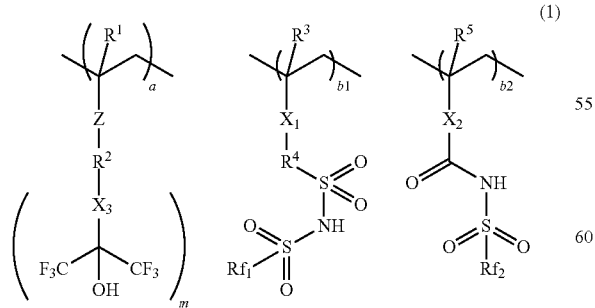

(1)

wherein $R^1$ represents a hydrogen atom or a methyl group;
Z represents any of a phenylene group, a naphthylene group, an ester group, an ether group, an amino group, and an amide group; when Z is a phenylene group or a naphthylene group, $R^2$ represents any of a single bond and a linear, branched, or cyclic hydrocarbon group having 1 to 12 carbon atoms optionally having one or both of an ester group and an ether group; when Z is an ester group, an ether group, an amino group, or an amide group, $R^2$ represents any of a single bond and a linear, branched, or cyclic hydrocarbon group having 1 to 14 carbon atoms optionally having an ether group; "m" represents any one of 1 to 3; $R^3$ and $R^5$ each independently represent a hydrogen atom or a methyl group; $R^4$ independently represents any of a single bond and a linear, branched, or cyclic hydrocarbon group having 1 to 12 carbon atoms optionally having one or both of an ether group and an ester group; $X_3$ represents any of a single bond, a methylene group, an ethylidene group, an isopropylidene group, an ether group, an ester group, an amino group, an amide group, and a linear, branched, or cyclic hydrocarbon group having 1 to 12 carbon atoms optionally containing an ether group, an ester group, an amino group, an amide group, or a heteroatom, and the amino groups and the amide groups optionally contain any of a hydrogen atom and a linear, branched, or cyclic hydrocarbon group having 1 to 12 carbon atoms optionally containing a heteroatom; $X_1$ and $X_2$ each independently represent any of a single bond, a phenylene group, a naphthylene group, an ether group, an ester group, an amide group, and a linear, branched, or cyclic hydrocarbon group having 1 to 13 carbon atoms optionally having one or both of an ether group and an ester group; $Rf_1$ and $Rf_2$ each represent a linear or branched alkyl group having 1 to 4 carbon atoms with at least one or more fluorine atoms, or a phenyl group substituted with a fluorine atom and/or a trifluoromethyl group; and "a", b1, and b2 satisfy $0<a<1.0$, $0 \leq b1<1.0$, $0 \leq b2<1.0$, and $0<b1+b2<1.0$.

2. The conductive polymer composition according to claim 1, wherein the conductive polymer composition has a surface tension in a range of 20 to 50 mN/m.

3. The conductive polymer composition according to claim 1, wherein the components (C1) and (C2) are selected from alcohols, ethers, esters, ketones, and nitriles each of which has 1 to 7 carbon atoms.

4. The conductive polymer composition according to claim 2, wherein the components (C1) and (C2) are selected from alcohols, ethers, esters, ketones, and nitriles each of which has 1 to 7 carbon atoms.

5. The conductive polymer composition according to claim 1, wherein the repeating unit "a" in the component (B) comprises one or more selected from repeating units a1 to a4 shown by the following general formulae (2-1) to (2-4),

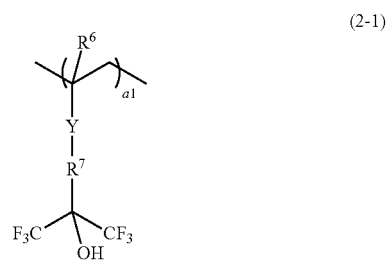

(2-1)

-continued

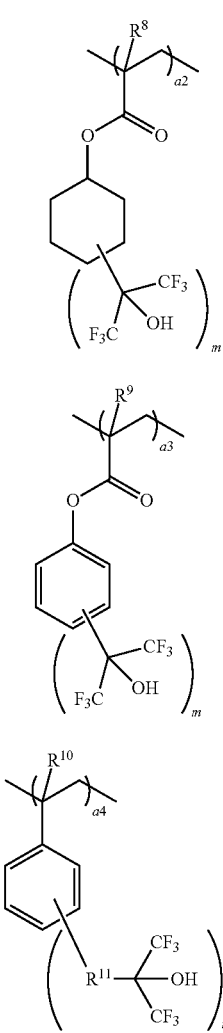

wherein $R^6$, $R^8$, $R^9$, and $R^{10}$ each independently represent a hydrogen atom or a methyl group; R' represents any of a single bond and a linear, branched, or cyclic hydrocarbon group having 1 to 14 carbon atoms optionally having an ether group; $R^{11}$ represents any of a single bond, a methylene group, an ethylidene group, an isopropylidene group, an ether group, an ester group, an amino group, an amide group, and a linear, branched, or cyclic hydrocarbon group having 1 to 12 carbon atoms optionally containing an ether group, an ester group, an amino group, an amide group, or a heteroatom, and the amino groups and the amide groups optionally contain any of a hydrogen atom and a linear, branched, or cyclic hydrocarbon group having 1 to 12 carbon atoms optionally containing a heteroatom; Y represents any of an ether group, an ester group, an amino group, and an amide group, and the amino group and the amide group optionally contain any of a hydrogen atom and a linear, branched, or cyclic hydrocarbon group having 1 to 12 carbon atoms optionally containing a heteroatom; "m" represents any one of 1 to 3; and a1, a2, a3, and a4 satisfy 0≤a1<1.0, 0≤a2<1.0, 0≤a3<1.0, 0≤a4<1.0, and 0<a1+a2+a3+a4<1.0.

6. The conductive polymer composition according to claim 2, wherein the repeating unit "a" in the component (B) comprises one or more selected from repeating units a1 to a4 shown by the following general formulae (2-1) to (2-4),

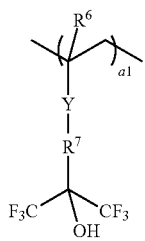
(2-1)

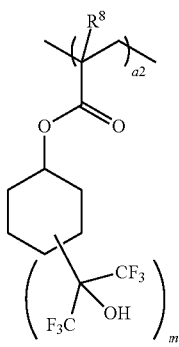
(2-2)

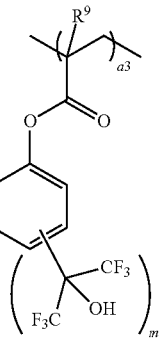
(2-3)

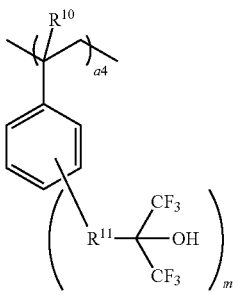
(2-4)

wherein $R^6$, $R^8$, $R^9$, and $R^{10}$ each independently represent a hydrogen atom or a methyl group; R' represents any of a single bond and a linear, branched, or cyclic hydrocarbon group having 1 to 14 carbon atoms optionally having an ether group; $R^{11}$ represents any of a single bond, a methylene group, an ethylidene group, an isopropylidene group, an ether group, an ester group, an amino group, an amide group, and a linear, branched, or cyclic hydrocarbon group having 1 to 12 carbon atoms optionally containing an ether group, an ester group, an amino group, an amide group, or a heteroatom, and the amino groups and the amide groups optionally contain any of a hydrogen atom and a linear, branched, or cyclic hydrocarbon group having 1 to 12 carbon atoms optionally containing a heteroatom; Y represents any of an ether group, an ester group, an amino group, and an amide group, and the amino group and the amide group optionally contain any of a hydrogen atom and a linear, branched, or cyclic hydrocarbon group having 1 to 12 carbon atoms optionally containing a heteroatom; "m" represents any one of 1 to 3; and a1, a2, a3, and a4 satisfy $0 \leq a1 < 1.0$, $0 \leq a2 < 1.0$, $0 \leq a3 < 1.0$, $0 \leq a4 < 1.0$, and $0 < a1+a2+a3+a4 < 1.0$.

7. The conductive polymer composition according to claim 1, wherein the component (B) comprises one or more selected from repeating units b'1 to b'4 shown by the following general formulae (3-1) to (3-4),

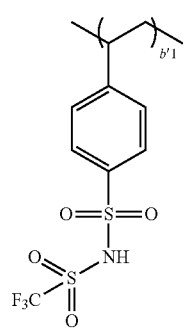
(3-1)

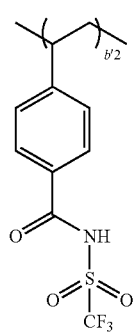
(3-2)

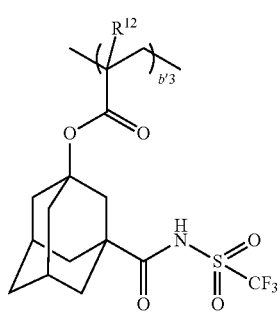
(3-3)

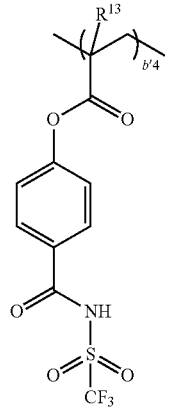
(3-4)

wherein $R^{12}$ and $R^{13}$ each independently represent a hydrogen atom or a methyl group; and b'1, b'2, b'3, and b'4 satisfy $0 \leq b'1 < 1.0$, $0 \leq b'2 < 1.0$, $0 \leq b'3 < 1.0$, $0 \leq b'4 < 1.0$, and $0 < b'1+b'2+b'3+b'4 < 1.0$.

8. The conductive polymer composition according to claim 2, wherein the component (B) comprises one or more selected from repeating units b'1 to b'4 shown by the following general formulae (3-1) to (3-4),

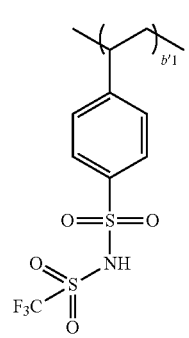
(3-1)

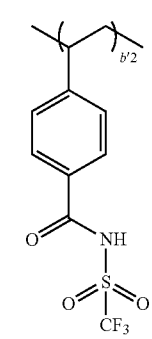
(3-2)

(3-3)

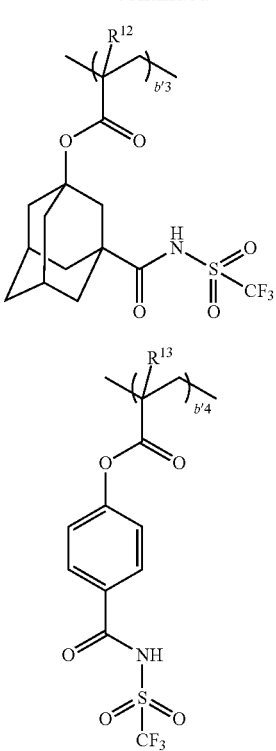

(3-4)

wherein $R^{12}$ and $R^{13}$ each independently represent a hydrogen atom or a methyl group; and b'1, b'2, b'3, and b'4 satisfy 0≦b'1<1.0, 0_b'2<1.0, 0<b'3<1.0, 0<b'4<1.0, and 0<b'1+b'2+b'3+b'4<1.0.

9. The conductive polymer composition according to claim 1, wherein the component (B) further comprises a repeating unit "c" shown by the following general formula (4),

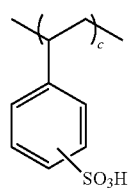

(4)

wherein "c" satisfies 0<c<1.0.

10. The conductive polymer composition according to claim 1, wherein the component (B) has a weight-average molecular weight in a range of 1,000 to 500,000.

11. The conductive polymer composition according to claim 1, wherein the component (A) is a material in which at least one precursor monomer selected from the group consisting of pyrrole, thiophene, selenophene, tellurophene, aniline, polycyclic aromatic compounds, and derivatives thereof is polymerized.

12. The conductive polymer composition according to claim 1, comprising a compound (E) shown by the following general formula (5),

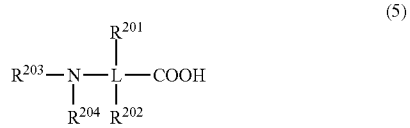

(5)

wherein $R^{201}$ and $R^{202}$ each independently represent any of a hydrogen atom, a heteroatom, and a linear, branched, or cyclic monovalent hydrocarbon group having 1 to 20 carbon atoms optionally having a heteroatom; $R^{203}$ and $R^{204}$ each independently represent any of a hydrogen atom and a linear, branched, or cyclic monovalent hydrocarbon group having 1 to 20 carbon atoms optionally having a heteroatom; $R^{201}$ and $R^{203}$, or $R^{201}$ and $R^{204}$, are optionally bonded to each other to form a ring; L represents a linear, branched, or cyclic tetravalent organic group having 1 to 20 carbon atoms optionally having a heteroatom; and when L has a heteroatom, the heteroatom is optionally an ion.

13. The conductive polymer composition according to claim 12, wherein the component (E) is contained in an amount of 1 part by mass to 50 parts by mass based on 100 parts by mass of the composite of the component (A) with the component (B).

14. The conductive polymer composition according to claim 1, further comprising a nonionic surfactant.

15. The conductive polymer composition according to claim 14, wherein the nonionic surfactant is contained in an amount of 1 part by mass to 15 parts by mass based on 100 parts by mass of the composite of the component (A) with the component (B).

16. The conductive polymer composition according to claim 1, wherein the conductive polymer composition is used to form a hole injection layer of an organic EL device.

17. A substrate comprising an organic EL device, wherein the organic EL device comprises a hole injection layer formed from the conductive polymer composition according to claim 1.

18. A method for producing the substrate according to claim 17, comprising applying the conductive polymer composition by using a spray coater or inkjet printing.

* * * * *